(12) United States Patent
Takahashi et al.

(10) Patent No.: US 11,903,167 B2
(45) Date of Patent: Feb. 13, 2024

(54) VAPOR CHAMBER WITH CONDENSATE FLOW PATHS DISPOSED ON WALL PARTS

(71) Applicant: DAI NIPPON PRINTING CO., LTD., Tokyo (JP)

(72) Inventors: Shinichiro Takahashi, Tokyo-to (JP); Takayuki Ota, Tokyo-to (JP); Kazunori Oda, Tokyo-to (JP); Toshihiko Takeda, Tokyo-to (JP); Kiyotaka Takematsu, Tokyo-to (JP); Terutoshi Momose, Tokyo-to (JP); Yoko Nakamura, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 24 days.

(21) Appl. No.: 17/059,301

(22) PCT Filed: May 30, 2019

(86) PCT No.: PCT/JP2019/021609
§ 371 (c)(1),
(2) Date: Nov. 27, 2020

(87) PCT Pub. No.: WO2019/230911
PCT Pub. Date: Dec. 5, 2019

(65) Prior Publication Data
US 2021/0168969 A1    Jun. 3, 2021

(30) Foreign Application Priority Data

May 30, 2018 (JP) .................................. 2018-103620
May 30, 2018 (JP) .................................. 2018-103633

(51) Int. Cl.
*F28D 15/00* (2006.01)
*H05K 7/20* (2006.01)
*F28D 15/02* (2006.01)

(52) U.S. Cl.
CPC ..... *H05K 7/20318* (2013.01); *F28D 15/0233* (2013.01); *F28D 15/0266* (2013.01)

(58) Field of Classification Search
CPC .... F28F 15/0233; F28F 15/0266; F28F 15/04; F28F 15/046; H05K 7/20318;
(Continued)

(56) References Cited

U.S. PATENT DOCUMENTS 5,259,448 A * 11/1993 Masukawa ............ F28F 13/187
165/184
5,427,174 A * 6/1995 Lomolino, Sr. ..... F28D 15/0233
165/104.33

(Continued)

FOREIGN PATENT DOCUMENTS

JP    S58-55687 A    4/1983
JP    2000-111281 A    4/2000
(Continued)

*Primary Examiner* — Travis Ruby
(74) *Attorney, Agent, or Firm* — Oliff PLC

(57) ABSTRACT

A vapor chamber in which an enclosed space is formed, and a working fluid is sealed in this space, the enclosed space including: a plurality of condensate flow paths through which a fluid that is the working fluid in a condensing state flows; and vapor flow paths through which a vapor that is the working fluid in a vaporizing state flows, wherein each of projecting parts with which each of the vapor flow paths is provided has a projecting amount varying in an extending direction of the vapor flow paths; a pitch for opening parts that allow the vapor flow paths and the condensate flow paths to communicate varies in the extending direction of the vapor flow paths; or wall parts that separate the flow paths each have a given relationship with a transverse cross section of a given flow path.

7 Claims, 67 Drawing Sheets

(58) Field of Classification Search
CPC ............ H05K 7/20336; F28D 15/0233; F28D 15/0266; F28D 15/04; F28D 15/046; F28D 15/025
See application file for complete search history.

(56) References Cited

U.S. PATENT DOCUMENTS

| | | | | |
|---|---|---|---|---|
| 6,148,906 | A * | 11/2000 | Li | F28D 15/046 361/679.52 |
| 6,508,302 | B2 * | 1/2003 | Ishida | F28D 15/0233 165/104.21 |
| 7,392,836 | B2 * | 7/2008 | Wong | F28D 15/046 165/104.33 |
| 8,243,449 | B2 * | 8/2012 | Oniki | F28D 15/046 174/15.2 |
| 9,664,458 | B2 * | 5/2017 | Lin | F28F 9/007 |
| 9,854,705 | B2 * | 12/2017 | Honmura | F28D 15/0233 |
| 2005/0022978 | A1 | 2/2005 | Duval | |
| 2010/0139894 | A1 * | 6/2010 | Zhou | F28D 15/046 165/104.26 |
| 2012/0018131 | A1 * | 1/2012 | Chang | F28F 13/08 165/104.21 |
| 2016/0131437 | A1 | 5/2016 | Wu | |
| 2017/0350657 | A1 * | 12/2017 | Yeh | F28D 15/046 |
| 2018/0156545 | A1 * | 6/2018 | Delano | F28D 15/043 |
| 2018/0164043 | A1 * | 6/2018 | Kurashima | F28D 15/02 |
| 2021/0392781 | A1 * | 12/2021 | Oda | H01L 23/427 |

FOREIGN PATENT DOCUMENTS

| | | |
|---|---|---|
| JP | 2015-219639 A | 12/2015 |
| JP | 2016-017702 A | 2/2016 |
| JP | 2017-223430 A | 12/2017 |
| WO | 01/63195 A1 | 8/2001 |

* cited by examiner

Fig. 54
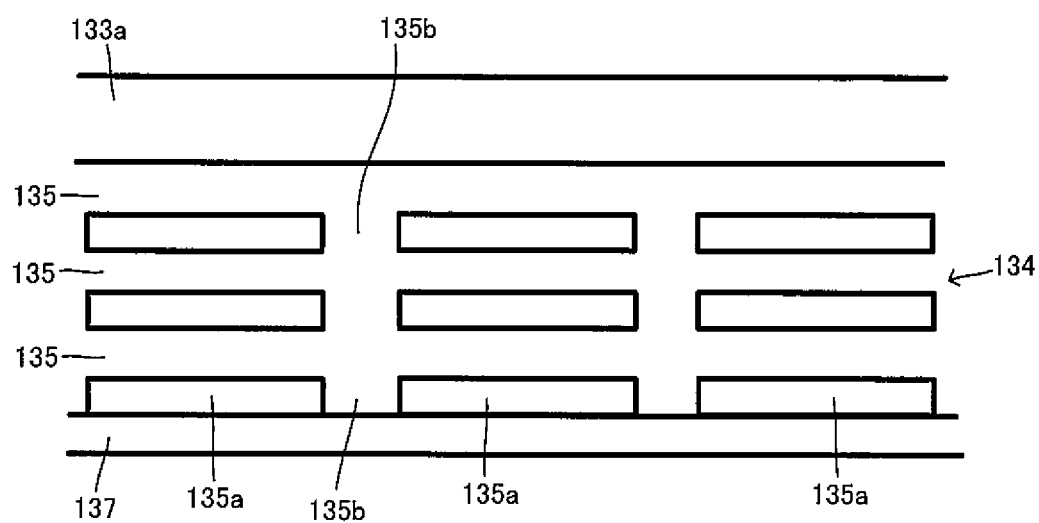
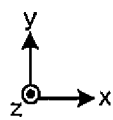

Fig. 56
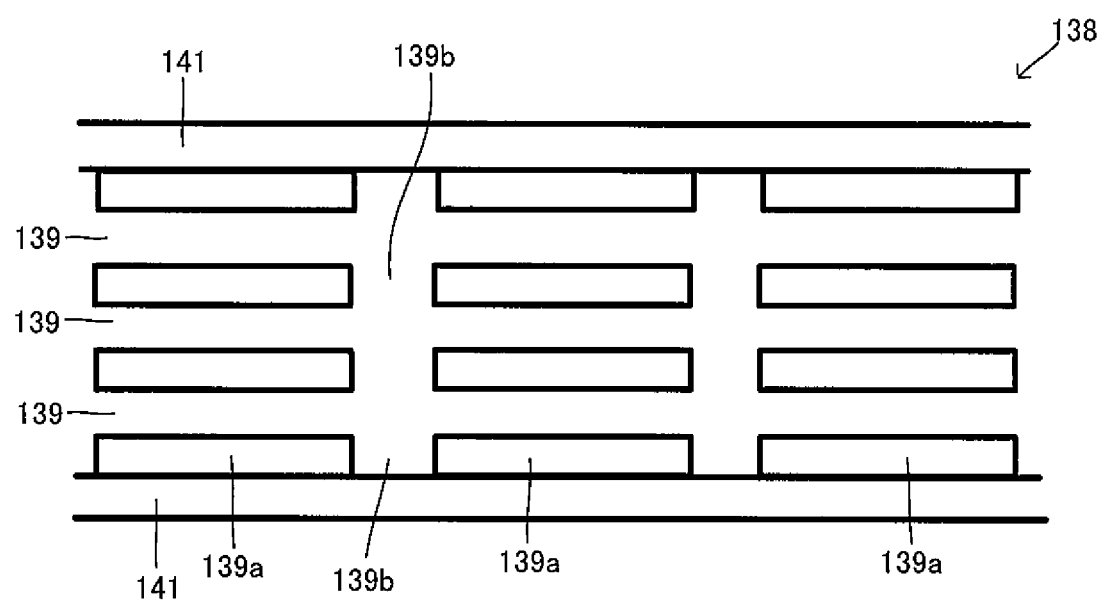
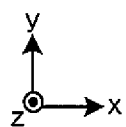

Fig. 58
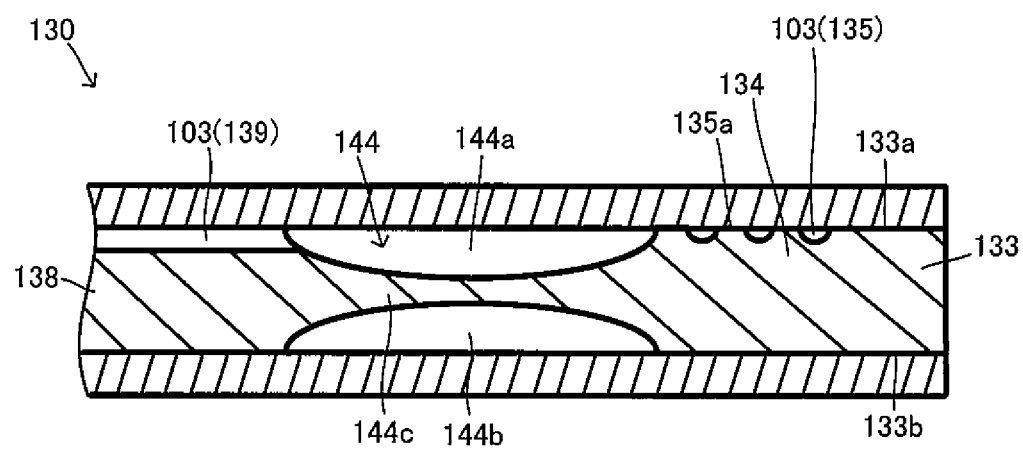
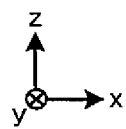

VAPOR CHAMBER WITH CONDENSATE FLOW PATHS DISPOSED ON WALL PARTS

TECHNICAL FIELD

The present disclosure relates to a vapor chamber in which a working fluid that is sealed in an enclosure refluxes as changing a phase thereof, to thereby transport heat.

BACKGROUND ART

Electronic devices, typically a personal computer, and a portable terminal such as a portable telephone and a tablet terminal, are provided with electronic components such as CPU (central processing unit). Such an electronic component tends to generate an increasing amount of heat because of an improving information processing capacity thereof, and thus a technique for cooling such an electronic component is important. A heat pipe is well known as a means for such cooling. A heat pipe is to transport heat of a heat source to another portion using a working fluid that is sealed in the pipe, and diffuse the heat, to cool the heat source.

In contrast, such an electronic device has been remarkably slimmed down in recent years, which has caused the demand for a thinner cooling means than conventional heat pipes. For this, for example, a vapor chamber (planar heat pipe) as described in PTL 1 is proposed.

A vapor chamber is a device of a planar member to which the concept of heat transport using a heat pipe is deployed. That is, in a vapor chamber, a working fluid is sealed between flat plates that face each other. This working fluid refluxes as changing a phase thereof, to transport heat, and then transports and diffuses heat of a heat source, to cool the heat source.

More specifically, a vapor flow path and a condensate flow path are disposed between the flat plates that face each other in the vapor chamber, and the working fluid is sealed there. When the vapor chamber is arranged around a heat source, a working fluid receives heat from the heat source to evaporate near the heat source. The working fluid then becomes a gas (vapor), and moves in the vapor flow path. This allows the heat of the heat source to be smoothly transported to a place apart from the heat source, and as a result, cools the heat source.

The working fluid in the gas state, which transports the heat of the heat source, moves to a place apart from the heat source, heat thereof is absorbed by surroundings, and then the working fluid is cooled to condense, and changes the phase thereof into the liquid state. The working fluid, which has changed the phase thereof into the liquid state, passes through the condensate flow path, returns to the position around the heat source, and receives heat of the heat source again to evaporate, and then changes into the gas state.

The foregoing circulation allows heat that is generated from the heat source to be transported to a place apart from the heat source, to cool the heat source.

PTL 1 discloses a device that includes such a vapor flow path (deep groove part) and a condensate flow path (shallow groove part) formed therein.

CITATION LIST

Patent Literature

PTL 1: JP 2000-111281 A

SUMMARY OF INVENTION

Technical Problem

An object of the present disclosure is to provide a vapor chamber that can offer a high heat transport capability. An electronic device that includes this vapor chamber is also provided.

Solution to Problem

One aspect of the present disclosure is a vapor chamber in which an enclosed space is formed, and a working fluid is sealed in this space, the enclosed space comprising: a plurality of condensate flow paths through which a fluid that is the working fluid in a condensing state flows; and vapor flow paths through which a vapor that is the working fluid in a vaporizing state flows, wherein each of the vapor flow paths is provided with projecting parts sticking out on a vapor flow path side in an aligning direction of the condensate flow paths and the vapor flow paths, each of the projecting parts having a projecting amount varying in an extending direction of the vapor flow paths.

When the vapor chamber is divided into a plurality of areas in the extending direction of the vapor flow paths, each projecting part in one of the areas may have a projecting amount smaller than each projecting part in both areas which are adjacent to the one area.

When one of the vapor flow paths is divided into three areas in the extending direction of the vapor flow paths, an average value of the projecting amounts in an area arranged at the center may be smaller than an average value of the projecting amounts in each area arranged on both sides of the area arranged at the center.

When one of the vapor flow paths is divided into five areas in the extending direction of the vapor flow paths, an average value of the projecting amounts of the projecting parts in an area arranged at the center, and an average value of the projecting amounts of the projecting parts in areas arranged on both ends may be each larger than an average value of the projecting amounts of the projecting parts in areas arranged between the area arranged at the center and the areas arranged on both ends.

Another aspect of the present disclosure is a vapor chamber in which an enclosed space is formed, and a working fluid is sealed in this space, the enclosed space comprising: a plurality of condensate flow paths through which a fluid that is the working fluid in a condensing state flows; and vapor flow paths through which a vapor that is the working fluid in a vaporizing state flows, wherein wall parts that separate the vapor flow paths and the condensate flow paths are each provided with a plurality of communicating opening parts that are openings via which the vapor flow paths and the condensate flow paths communicate, and pitches for a plurality of the communicating opening parts vary in an extending direction of the vapor flow paths.

When the vapor chamber is divided into a plurality of areas in the extending direction of the vapor flow paths so that one area includes some of the communicating opening parts aligning in a direction along the vapor flow paths, a pitch for the communicating opening parts in the one area may be larger than a pitch for the communicating opening parts in both areas adjacent to the one area.

When one of the vapor flow paths is divided into three areas in the extending direction of the vapor flow paths, an average value of pitches for the communicating opening parts included in areas arranged on both ends may be smaller than an average value of pitches for the communicating opening parts included in an area at the center, the area being arranged between the areas arranged on both ends.

When one of the vapor flow paths is divided into five areas in the extending direction of the vapor flow paths, an average value of pitches for the communicating opening parts included in an area arranged at the center, and an average value of pitches for the communicating opening parts included in areas arranged on both ends may be each smaller than an average value of pitches for the communicating opening parts included in an area arranged between the area arranged at the center and the areas arranged on both ends.

Another aspect of the present disclosure is a vapor chamber in which an enclosed space is formed, and a working fluid is sealed in this space, the enclosed space comprising: a plurality of flow paths through which the working fluid flows; and wall parts between adjacent flow paths, wherein each wall part has a width $S_A$ of 20 μm to 300 μm, and a value obtained by dividing $S_A$ by $S_B$ is 0.005 (μm$^{-1}$) to 0.04 (μm$^{-1}$), the value showing relationship with a transverse cross sectional area $S_B$ (μm$^{-2}$) of each of the flow paths.

The flow paths may include a plurality of condensate flow paths through which a fluid that is the working fluid in a condensing state flows, and vapor flow paths through which a vapor that is the working fluid in a vaporizing state flows, and the wall parts may be wall parts formed between adjacent condensate flow paths.

Each of the wall parts may have a width smaller than each of the condensate flow paths.

A groove may be formed on a surface of each of the condensate flow paths.

Each of the wall parts may have a plurality of openings via which adjacent flow paths communicate with each other.

The openings may be disposed so that positions thereof are different between adjacent wall parts in an extending direction of the flow paths.

Provided can be an electronic device comprising: a housing; an electronic component that is arranged inside the housing; and the foregoing vapor chamber, which is arranged in contact with the electronic component directly, or via another member.

Advantageous Effects of Invention

A vapor chamber according to the present disclosure can improve a heat transport capability.

BRIEF DESCRIPTION OF DRAWINGS

FIG. 54 shows a partially enlarged view of the peripheral fluid flow path part 134 in the direction z.

FIG. 56 shows a partially enlarged view of the inner side fluid flow path part 138 in the direction z.

FIG. 58 is another cross section of the vapor chamber 101.

Hereinafter each embodiment will be described based on the drawings. The present invention is not limited to these embodiments. The following drawings may show modified or exaggerated sizes and proportions of members for understandability, and may omit portions unnecessary for the description, and repeatedly appearing signs, for visibility.

Since moving in an enclosure in a vapor chamber as changing the phase thereof, a working fluid that has vaporized to be gas may be referred to as "vapor", and the working fluid that has liquified to be liquid may be referred to as "condensate".

Figure 1:
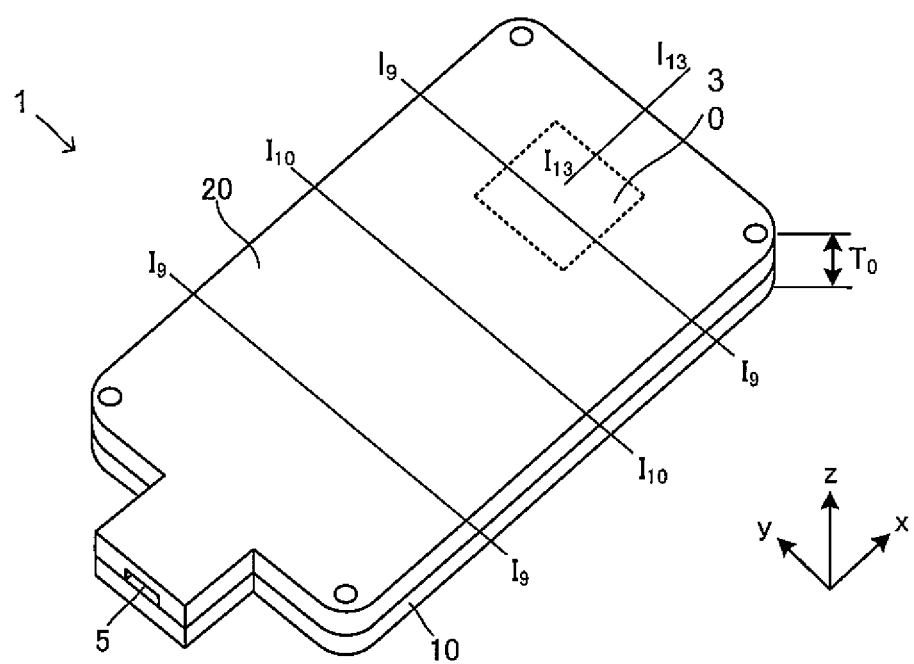
FIG. 1 is a perspective view of a vapor chamber 1.
Figure 2:
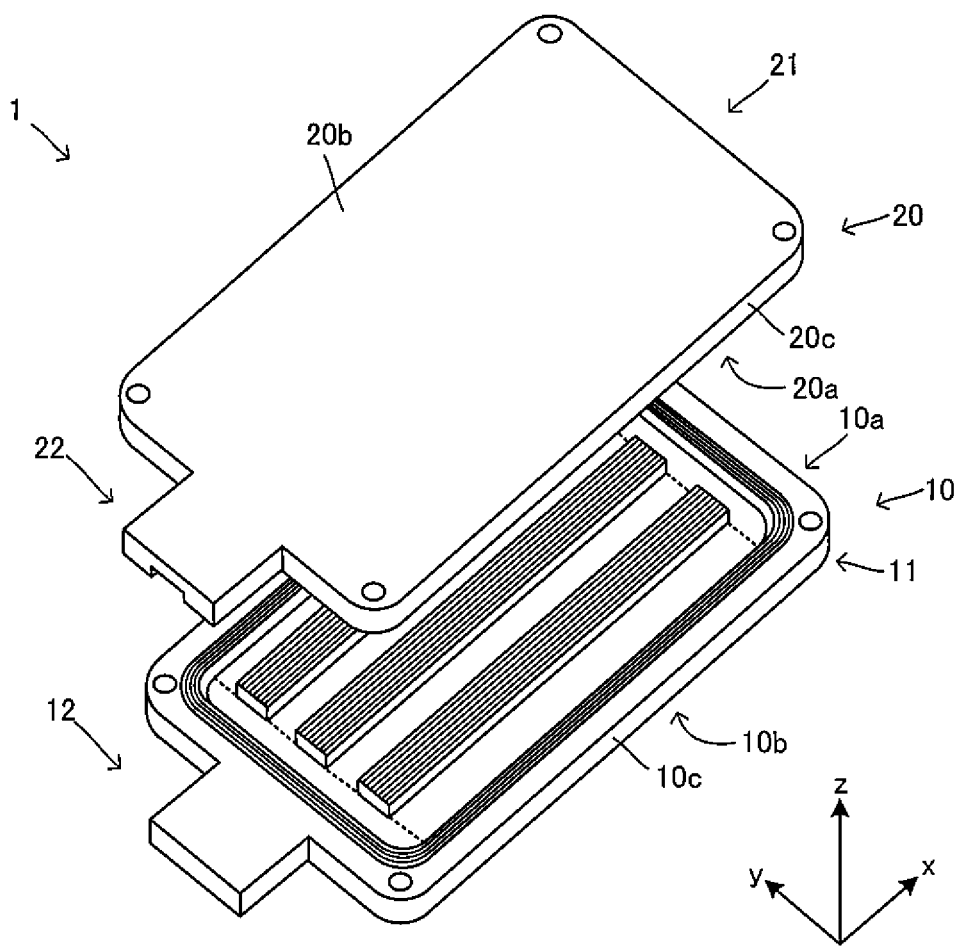
FIG. 2 is an exploded perspective view of the vapor chamber 1.

FIG. 1 is an external perspective view of a vapor chamber 1 according to the first embodiment, and FIG. 2 is an exploded perspective view of the vapor chamber 1. These and the following drawings may show the arrows (x, y, z) that indicate the directions orthogonal to each other, for convenience. Here, any direction in the plane xy is a direction along a tabular face of the vapor chamber 1 which is a flat table, and the direction z is the thickness direction of the vapor chamber 1.

The vapor chamber 1 has a first sheet 10 and a second sheet 20 as can be seen in FIGS. 1 and 2. As described later, these first sheet 10 and second sheet 20 are superposed and bonded to each other (diffusion bonding, brazing, etc.), to form an enclosure 2 between the first sheet 10 and the second sheet 20 (for example, see FIG. 25). A working fluid is sealed in this enclosure 2.

Figure 3:
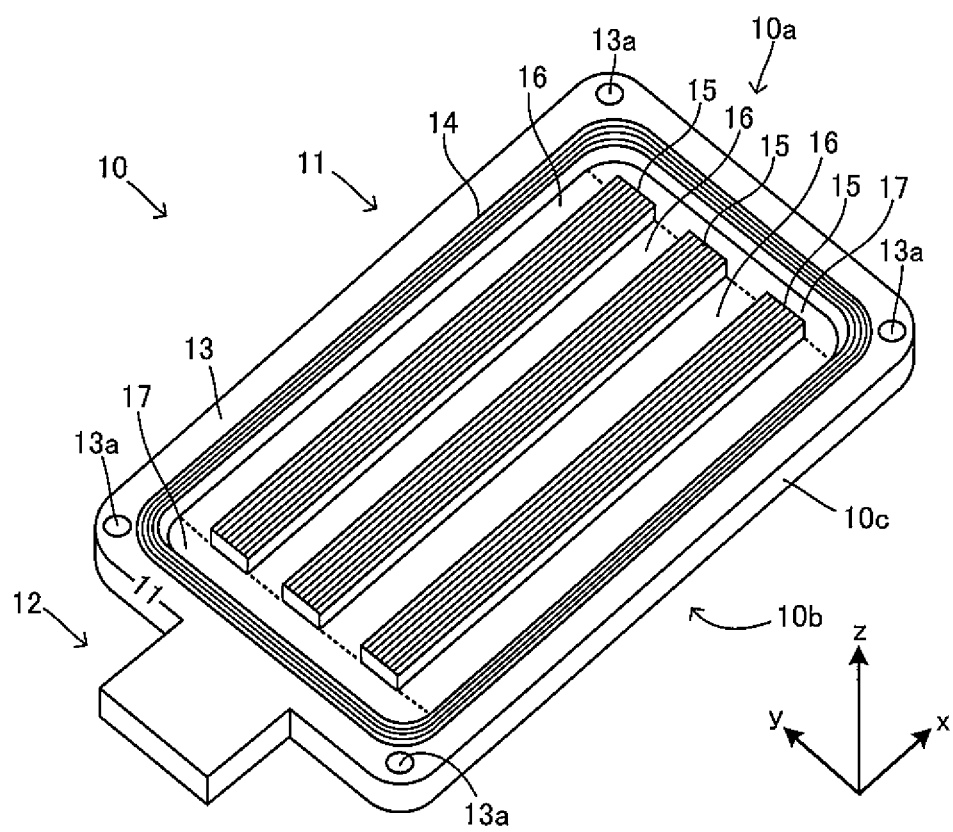
FIG. 3 is a perspective view of a first sheet 10.
Figure 4:
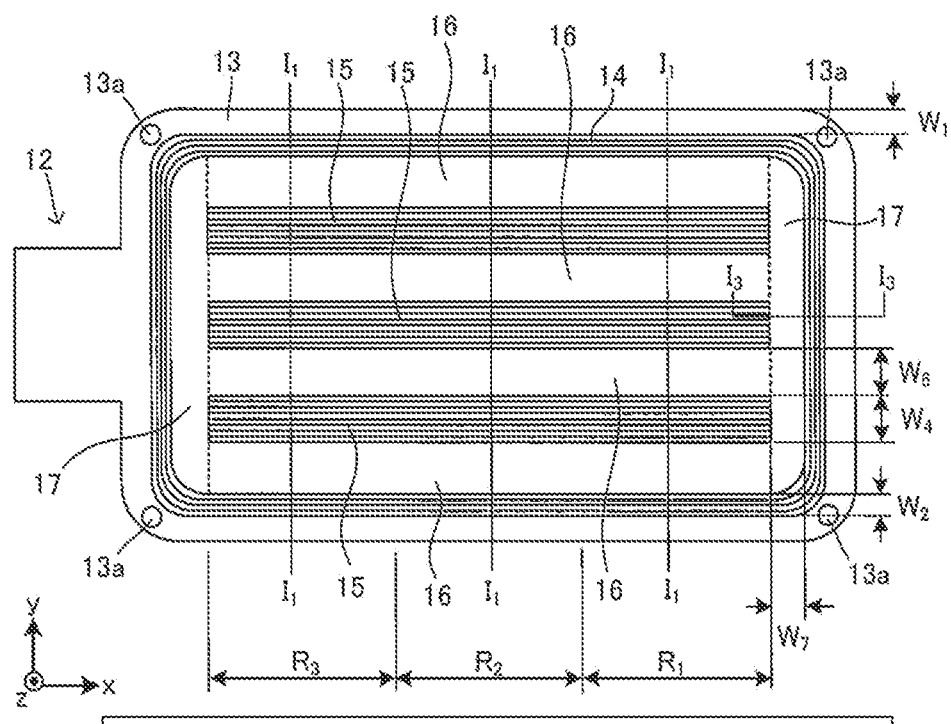
FIG. 4 is a plan view of the first sheet 10.
Figure 5:
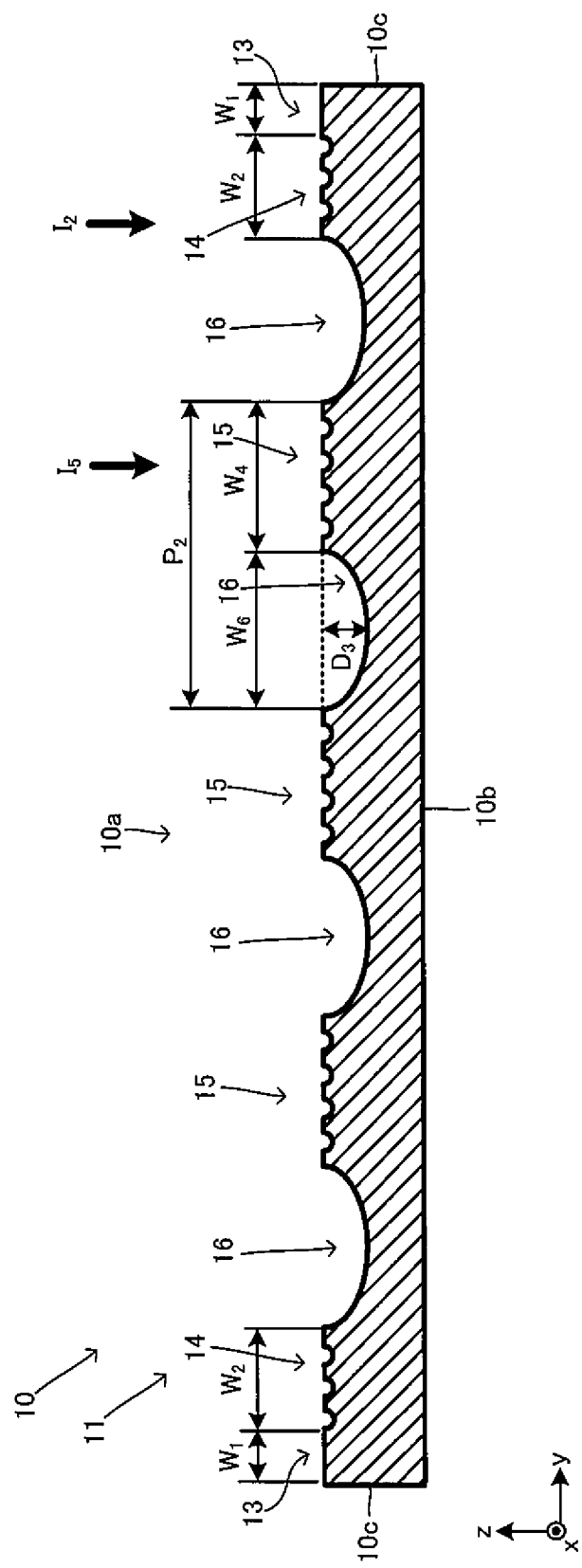
FIG. 5 shows a cross section of the first sheet 10.

In the present embodiment, the first sheet 10 is a sheet-like member as a whole. FIG. 3 is a perspective view of the first sheet 10 viewed on an inner face 10a side, and FIG. 4 is a plan view of the first sheet 10 viewed on the inner face 10a side. FIG. 5 shows a cross section of the first sheet 10 taken along the line $I_1$-$I_1$ of FIG. 4. Since the first sheet 10 can be considered to be divided into three areas $R_1$, $R_2$ and $R_3$ as described later, FIG. 4 shows the line for each area. In the present embodiment, the areas $R_1$, $R_2$ and $R_3$ each have the same cross section shown in FIG. 3, and thus only one drawing is shown here.

The first sheet 10 includes an inner face 10a, an outer face 10b on the opposite side of the inner face 10a, and a side face 10c that couples the inner face 10a and the outer face 10b to form thickness: on the inner face 10a side, a pattern for flow paths where a working fluid refluxes is formed. As described later, the inner face 10a of this first sheet 10 and an inner face 20a of the second sheet 20 are superposed so as to face each other, to form the enclosure 2.

Such a first sheet 10 includes a main body 11 and an inlet 12. The main body 11 is like a sheet and forms a portion where a working fluid refluxes, and in the present embodiment, is a rectangle having the corners of circular arcs (what is called R) in a plan view.

The inlet 12 is a portion via which a working fluid is poured into the enclosure 2, which is formed of the first sheet 10 and the second sheet 20 (for example, see FIG. 25), and in the present embodiment, is like a sheet of a quadrangle in a plan view which sticks out of one side of the main body 11, which is a rectangle in a plan view. In the present embodiment, the inlet 12 of the first sheet 10 is formed to have flat faces on both the inner face 10a and outer face 10b sides.

Such a first sheet 10 preferably has, but not particularly limited to, a thickness of at most 0.75 mm. The thickness may be at most 0.50 mm, and may be at most 0.2 mm. In contrast, this thickness is preferably at least 0.02 mm, and may be at least 0.05 mm, and may be at least 0.1 mm. The range of this thickness may be defined by the combination of any one of the foregoing plural candidate values for the upper limit, and any one of the foregoing plural candidate values for the lower limit. The range of the thickness may be also defined by the combination of any two of the plural candidate values for the upper limit, or the combination of any two of the plural candidate values for the lower limit.

This can make the case where the vapor chamber is applicable as a thin vapor chamber, often.

The first sheet 10 is preferably constituted of, but not particularly limited to, a metal of high thermal conductivity, examples of which include copper and copper alloys.

The first sheet 10 does not always have to be constituted of a metallic material, and can be constituted of, for example, a ceramic such as AlN, $Si_3N_4$, and $Al_2O_3$, and a resin such as polyimide and epoxy.

In addition, a laminate of two or more materials may be used in one sheet, or materials may be different according to portions.

A structure for refluxing a working fluid is formed in the main body 11 on the inner face 10a side. Specifically, the main body 11 is formed as including a peripheral bonding part 13, a peripheral fluid flow path part 14, inner side fluid flow path parts 15, vapor flow path grooves 16, and vapor flow path communicating grooves 17 on the inner face 10a side.

The peripheral bonding part 13 is a portion having a face formed along the periphery of the main body 11 on the inner face 10a side of the main body 11. This peripheral bonding part 13 is superposed on, and bonded (diffusion bonding, brazing, etc.) to a peripheral bonding part 23 of the second sheet 20, to form the enclosure 2 between the first sheet 10 and the second sheet 20. A working fluid is sealed here.

The peripheral bonding part 13 has a width shown by $W_1$ in FIGS. 4 to 7 (size in a direction orthogonal to the extending direction of the peripheral bonding part 13, width on the bonding face to the second sheet 20) which can be suitably set as necessary. This width $W_1$ is preferably at most 3 mm, and may be at most 2.5 mm, and may be at most 2.0 mm. The width $W_1$ more than 3 mm leads to a small internal volume of the enclosure, which may make it impossible to sufficiently secure vapor flow paths and condensate flow paths. In contrast, the width $W_1$ is preferably at least 0.2 mm, and may be at least 0.6 mm, and may be at least 0.8 mm. The width $W_1$ less than 0.2 mm may lead to lack of the bonding area in misalignment when the first sheet and the second sheet are bonded to each other. The range of the width $W_1$ may be defined by the combination of any one of the foregoing plural candidate values for the upper limit, and any one of the foregoing plural candidate values for the lower limit. The range of the width $W_1$ may be also defined by the combination of any two of the plural candidate values for the upper limit, or the combination of any two of the plural candidate values for the lower limit.

The four corners of the peripheral bonding part 13 of the main body 11 are provided with holes 13a penetrating in the thickness direction (direction z). These holes 13a function as positioning means when the first sheet 10 is superposed on the second sheet 20.

Figure 6:
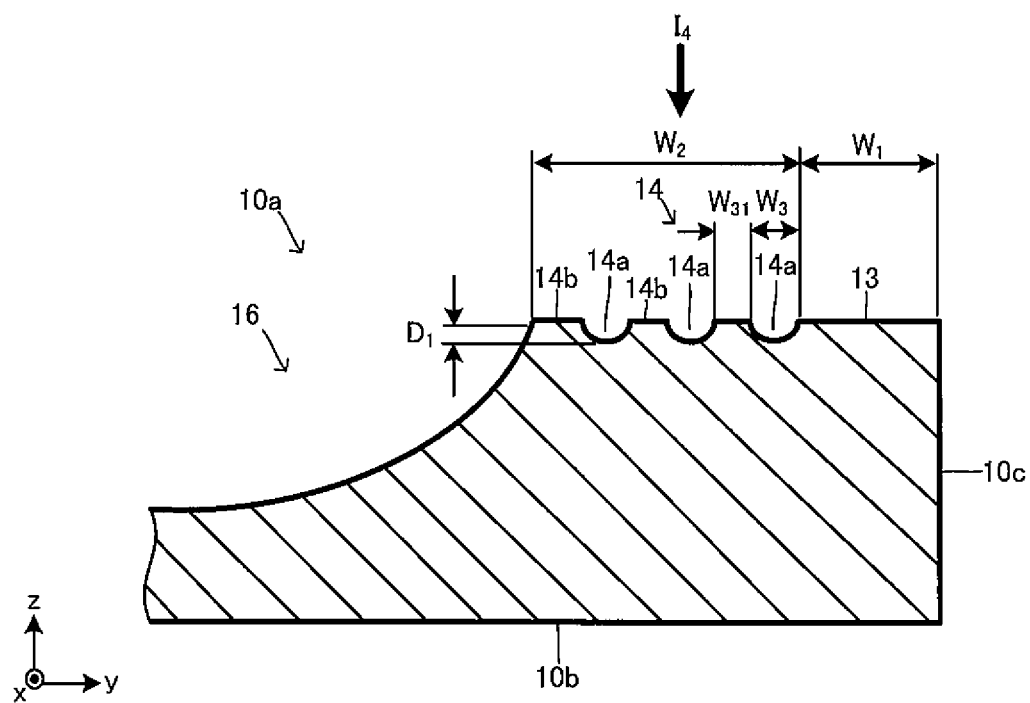
FIG. 6 shows another cross section of the first sheet 10.
Figure 7:
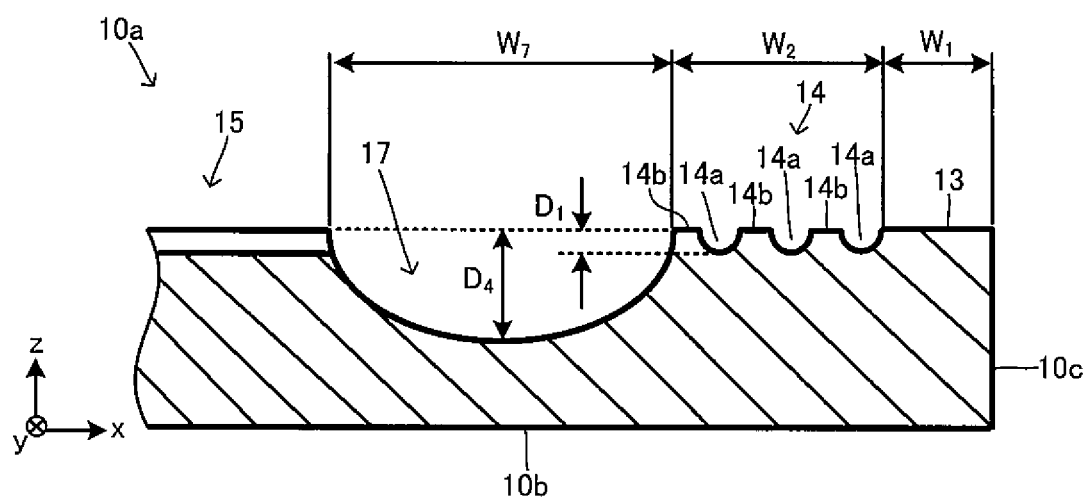
FIG. 7 shows another cross section of the first sheet 10.
Figure 8:
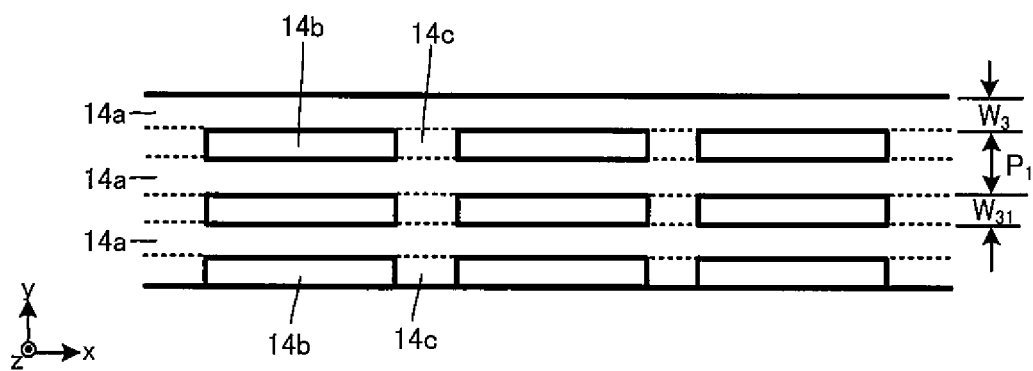
FIG. 8 is a partially enlarged plan view of a peripheral fluid flow path part 14.

The peripheral fluid flow path part 14 functions as a fluid flow path part, and is a portion that forms a part of condensate flow paths 3 (see FIG. 25) that are second flow paths where a working fluid passes when the working fluid condenses to liquefy. FIG. 6 shows a cross section of a portion indicated by the arrow $I_2$ in FIG. 5, and FIG. 7 shows a cross section of a portion taken along the line $I_3$-$I_3$ in FIG. 4. Both drawings show cross-sectional shapes of the peripheral fluid flow path part 14. FIG. 8 is an enlarged plan view of the peripheral fluid flow path part 14 viewed in the direction indicated by the arrow $I_4$ in FIG. 6.

As can be seen in these drawings, the inner face 10a of the main body 11 is provided with the peripheral fluid flow path part 14 so that the peripheral fluid flow path part 14 is formed along the inside of the peripheral bonding part 13 to have an annular shape along the periphery of the enclosure 2. Fluid flow path grooves 14a that are a plurality of grooves extending in parallel to the direction of the periphery of the main body 11 are formed on the peripheral fluid flow path part 14. A plurality of the fluid flow path grooves 14a are arranged at given intervals in a direction different from the extending direction thereof. Thus, as can be seen in FIGS. 6 and 7, on the peripheral fluid flow path part 14, the fluid flow path grooves 14a, which are recess portions on the cross section of the peripheral fluid flow path part 14, and wall parts 14b that are between the fluid flow path grooves 14a are formed as recesses and protrusions are repeated.

Here, since being a groove, each of the fluid flow path grooves 14a includes a bottom portion on the outer face 10b side, and an opening on the inner face 10a side, which is opposite to and faces the bottom portion, in the cross-sectional shape thereof.

Including such a plurality of the fluid flow path grooves 14a leads to each fluid flow path groove 14a having a shallow depth and a narrow width, which makes it possible for each condensate flow path 3, which is the second flow path (see FIG. 25), to have a small cross-sectional area, and makes it possible to use a great capillary force. In contrast, a plurality of the fluid flow path grooves 14a make it possible to secure a suitable magnitude of the cross-sectional area of the condensate flow paths 3 as a whole in total, to allow a condensate of a necessary flow rate to flow.

Further, in the peripheral fluid flow path part 14, as can be seen in FIG. 8, adjacent fluid flow path grooves 14a communicate with each other at given intervals via communicating opening parts 14c. This promotes equality of the amount of a condensate between a plurality of the fluid flow path grooves 14a, to allow a condensate to efficiently flow, which makes it possible to smoothly reflux a working fluid. The communicating opening parts 14c, which are disposed among the wall parts 14b adjacent to the vapor flow path grooves 16 forming the vapor flow paths 4 (see FIG. 25), allow the vapor flow paths 4 and the condensate flow path 3 to communicate with each other.

Figure 9:
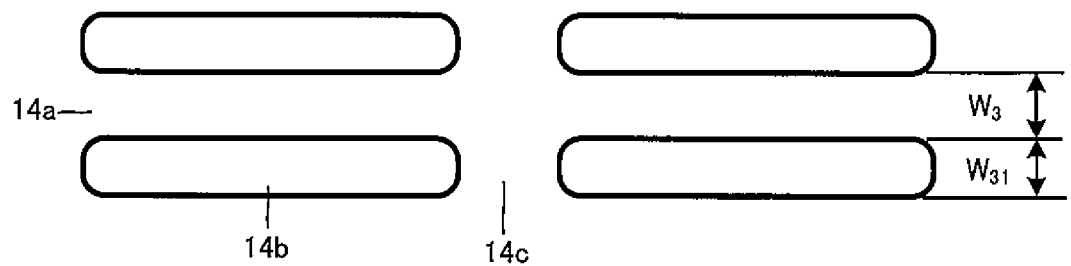
FIG. 9 shows wall parts and communicating opening parts according to another embodiment.
Figure 10:
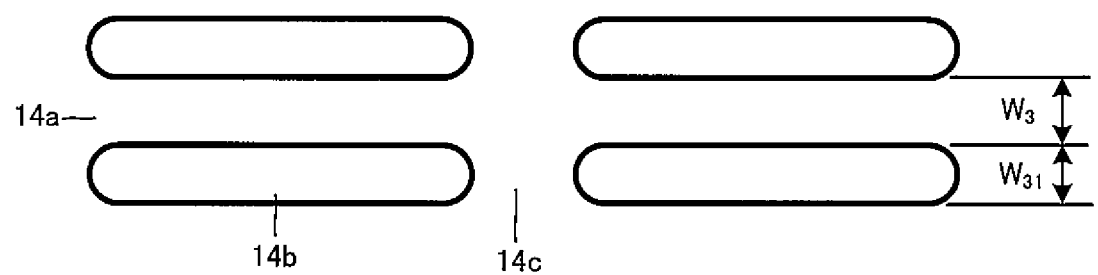
FIG. 10 shows the wall parts and the communicating opening parts according to another embodiment.
Figure 11:
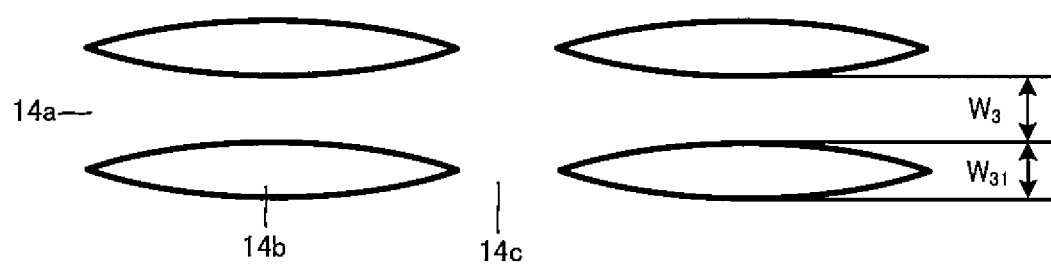
FIG. 11 shows the wall parts and the communicating opening parts according to another embodiment.

FIGS. 9 to 11 each show one condensate flow path 14a and two wall parts 14b that face each other across the one condensate flow path 14a, and one communicating opening part 14c that is disposed among each wall part 14b, viewed in the same way as FIG. 8. In all these drawings, the wall parts 14b have different shapes from the example in FIG. 8, viewed in this way (plan view).

That is, each wall part 14b shown in FIG. 8 has the same width ($W_{31}$) at an end portion thereof where the communicating opening part 14c is formed as that at any other portions thereof, and this width is fixed. In contrast, each wall part 14b having a shape shown in FIGS. 9 to 11 is formed so as to have a width at an end portion thereof where the communicating opening part 14c is formed narrower than the maximum width ($W_{31}$) thereof. More specifically, FIG. 9 shows an example such that the corners are like circular arcs to form R at the end portions, which makes the width at the end portions narrow, FIG. 10 shows an example such that the end portions are formed to be like semicircles, which makes the width at the end portions narrow, and FIG. 11 shows an example such that the end portions taper so as to be pointed.

As shown in FIGS. 9 to 11, each wall part 14b is formed so as to have a width at the end portions thereof, where the communicating opening parts 14c are formed, narrower than the maximum width ($W_{31}$) thereof, which makes it easy for a working fluid to move through the communicating opening parts 14c, to make it easy for the working fluid to move to the condensate flow paths 3 adjacent to the wall parts 14b, to further allow the working fluid to smoothly reflux.

In contrast, when the vapor chamber does not operate, as described later, a working fluid collecting in the vicinity of the communicating opening parts 14c freezes, and the volume thereof increases. The end portions of the wall parts 14b are thin as the foregoing, and thus, if force operating in such a direction as to make the first sheet and the second sheet apart is applied then, stress concentrates on the thin portions, which leads to a situation where the wall parts 14b are easily broken. In the present embodiment, the wall parts 14b have sufficient durability so as not to be broken even in such a case.

Figure 12:
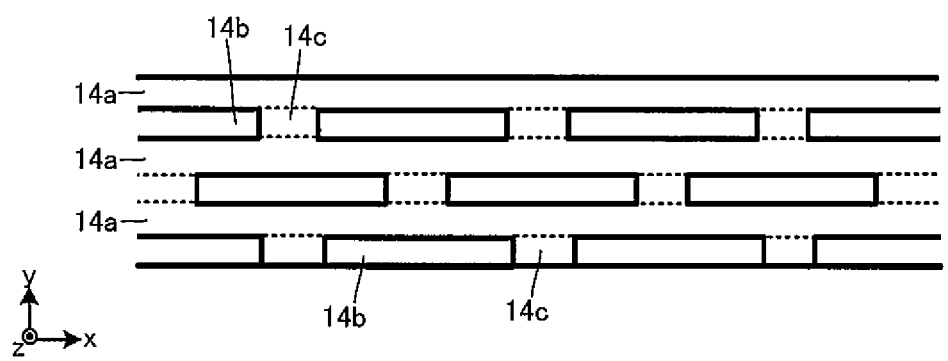
FIG. 12 is a partially enlarged plan view of another example of the peripheral fluid flow path part 14.

In the present embodiment, as shown in FIG. 8, the communicating opening parts 14c are arranged at the same positions in the extending direction of one fluid flow path groove 14a so as to face each other. The present invention is not limited to this. For example, as shown in FIG. 12, the communicating opening parts 14c may be arranged at positions different in the extending direction of one fluid flow path groove 14a. That is, in this case, the communicating opening parts 14c are arranged in what is called offset zigzag alignment.

Disposing the communicating opening parts 14c in such an offset manner results in absence thereof on both sides at the same time for a working fluid travelling in the condensate flow paths 3: the wall part 14b always exists at least on one side face even if the communicating opening part 14c is present. Therefore, a capillary force can be continuously obtained. From such a point of view, formation of the communicating opening parts 14c in an offset manner makes it possible to keep a great capillary force operating on a working fluid, which makes smoother reflux possible.

In contrast, when the vapor chamber does not operate, a condensate tends to collect more in the communicating opening parts 14c than the example in FIG. 8 due to such a great capillary force. Then, as described later, when a working fluid freezes and the volume thereof increases, a greater force is applied in such a direction as to make the first sheet and the second sheet apart, that is, such a direction as to break the wall parts 14b. In the present embodiment, the wall parts 14b have sufficient durability so as not to be broken even in such a case.

Each wall part 14b can be formed to have any shape at the end portions thereof according to the examples in FIGS. 9 to 11 even when the communicating opening parts 14c are offset and aligned as the foregoing.

Preferably, the peripheral fluid flow path part 14 having the foregoing structure further includes the following structure.

The peripheral fluid flow path part 14 has a width shown by $W_2$ in FIGS. 4 to 7 (size in the aligning direction of the fluid flow path parts 14a, width on the bonding face to the second sheet 20) which can be suitably set according to the size of the vapor chamber as a whole etc. This width $W_2$ is preferably at most 3.0 mm, and may be at most 1.5 mm, and may be at most 1.0 mm. The width $W_2$ more than 3.0 mm may make it impossible to sufficiently secure a space for the condensate flow paths and the vapor flow paths inside. In contrast, the width $W_2$ is preferably at least 0.1 mm, and may be at least 0.2 mm, and may be at least 0.4 mm. The width $W_2$ less than 0.1 mm may make it impossible to sufficiently obtain the amount of a condensate that refluxes on the periphery. The range of the width $W_2$ may be defined by the combination of any one of the foregoing plural candidate values for the upper limit, and any one of the foregoing plural candidate values for the lower limit. The range of the width $W_2$ may be also defined by the combination of any two of the plural candidate values for the upper limit, or the combination of any two of the plural candidate values for the lower limit.

Each fluid flow path groove 14a preferably has a width, shown by $W_3$ in FIGS. 6 and 8 (size in the aligning direction of the fluid flow path grooves 14a, width of an opening face of each groove), of at most 1000 μm, which may be at most 500 μm, and may be at most 300 μm. In contrast, the groove width $W_3$ is preferably at least 30 μm, and may be at least 40 μm, and may be at least 60 μm. The range of the groove width $W_3$ may be defined by the combination of any one of the foregoing plural candidate values for the upper limit, and any one of the foregoing plural candidate values for the lower limit. The range of the groove width $W_3$ may be also defined by the combination of any two of the plural candidate values for the upper limit, or the combination of any two of the plural candidate values for the lower limit.

Each groove preferably has a depth, shown by $D_1$ in FIGS. 6 and 7, of at most 200 μm, which may be at most 150 μm, and may be at most 100 μm. In contrast, the depth $D_1$ is preferably at least 5 μm, and may be at least 10 μm, and may be at least 20 μm. The range of the depth $D_1$ may be defined by the combination of any one of the foregoing plural candidate values for the upper limit, and any one of the foregoing plural candidate values for the lower limit. The range of the depth $D_1$ may be also defined by the combination of any two of the plural candidate values for the upper limit, or the combination of any two of the plural candidate values for the lower limit.

The structure as the foregoing can lead to a greater capillary force of the condensate flow paths which is necessary for reflux.

In view of bringing about a greater capillary force of the condensate flow paths, the cross section of each flow path preferably has an aspect ratio larger than 1.0. The aspect ratio is a value obtained by dividing the width $W_3$ by the depth $D_1$. This ratio may be at least 1.5, and may be at least 2.0. Or, the aspect ratio may be smaller than 1.0. This ratio may be at most 0.75, and may be at most 0.5.

Among them, in view of production, $W_3$ is preferably larger than $D_1$, and in such a view, the aspect ratio is preferably larger than 1.3.

Each wall part 14b preferably has a width, shown by $W_{31}$ in FIGS. 6, and 8 to 11 (size in the aligning direction of the wall parts 14b, width of each wall part 14b at a portion on the inner face 10a side), of at most 300 μm, which may be at most 200 μm, and may be at most 100 μm. In contrast, the width $W_{31}$ is preferably at least 20 μm, and may be at least 30 μm, and may be at least 50 μm. This width less than 20 μm leads to easy rupture due to repeated freezing and melting of a working fluid. This width more than 500 μm leads to too wide a width of each communicating opening part 14e, which may prevent a working fluid from smoothly communicating with the condensate flow paths 3 adjacent to the wall parts 14b.

The range of the width $W_{31}$ may be defined by the combination of any one of the foregoing plural candidate values for the upper limit, and any one of the foregoing plural candidate values for the lower limit. The range of the groove width $W_{31}$ may be also defined by the combination of any two of the plural candidate values for the upper limit, or the combination of any two of the plural candidate values for the lower limit.

In the present embodiment, each fluid flow path groove 14a has a semi-elliptical cross-sectional shape. The present invention is not limited to this. The cross-sectional shape may be a quadrangle such as a square, a rectangle, and a trapezoid, a triangle, a semicircle, a circle at the bottom portion, or any combination of some of them selected therefrom.

The pitch for adjacent fluid flow path grooves 14a in a plurality of the fluid flow path grooves 14a, which is shown by $P_1$ in FIG. 8, is preferably at most 1300 μm, and may be at most 700 μm, and may be at most 400 μm. In contrast, the pitch $P_1$ is preferably at least 50 μm, and may be at least 70 μm, and may be at least 110 μm. The range of this pitch $P_1$ may be defined by the combination of any one of the foregoing plural candidate values for the upper limit, and any one of the foregoing plural candidate values for the lower limit. The range of the pitch $P_1$ may be also defined by the combination of any two of the plural candidate values for the upper limit, or the combination of any two of the plural candidate values for the lower limit.

This makes it possible to increase the density of the condensate flow paths, and at the same time to suppress the flow paths deforming to crush in bonding or assembling.

Figure 13:
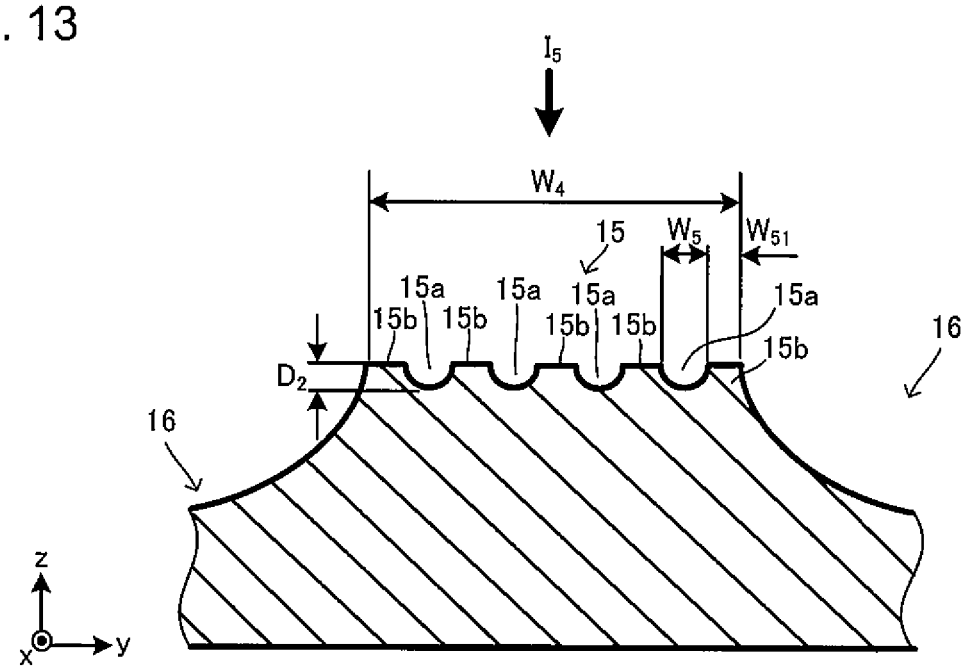
FIG. 13 shows a cross section focused on an inner side fluid flow path part 15.

Returning to FIGS. 3 to 5, the inner side fluid flow path parts 15 will be described. The inner side fluid flow path parts 15 also function as fluid flow path parts, and are portions that form a part of the condensate flow paths 3 as the second flow paths where a working fluid passes when the working fluid condenses to liquefy. FIG. 13 shows a portion shown by $I_5$ in FIG. 5. This drawing also shows a cross-sectional shape of the inner side fluid flow path part 15.

The inner side fluid flow path parts 15 are formed on the inner face 10a of the main body 11 inside the ring of the annular peripheral fluid flow path part 14. The inner side fluid flow path parts 15 in the present embodiment are, as can be seen in FIGS. 3 and 4, protrusions extending in a direction parallel to a long side of the rectangle of the main body 11 in a plan view (direction x). The plural (three in the present embodiment) inner side fluid flow path parts 15 are aligned at given intervals in a direction parallel to a short side of the rectangle of the main body 11 in a plan view (direction y).

Fluid flow path grooves 15a that are grooves parallel to the extending direction of the inner side fluid flow path parts 15 are formed on each inner side fluid flow path part 15. A plurality of the fluid flow path grooves 15a are arranged at given intervals in a direction different from the extending direction thereof. Thus, as can be seen in FIGS. 5 and 13, on each inner side fluid flow path part 15, the fluid flow path grooves 15a, which are recess portions on the cross section of the inner side fluid flow path parts 15, and wall parts 15b that are separating walls between the fluid flow path grooves 15a are formed as recesses and protrusions are repeated. Since being a groove, each of the fluid flow path grooves 15a includes a bottom portion on the outer face 10b side, and an opening on the inner face 10a side, which is opposite to and faces the bottom portion, in the cross-sectional shape thereof.

Including such a plurality of the fluid flow path grooves 15a leads to each fluid flow path groove 15a having a shallow depth and a narrow width, which makes it possible for each condensate flow path 3 as the second flow path (see FIG. 25) to have a small cross-sectional area, and makes it possible to use a great capillary force. In contrast, a plurality of the fluid flow path grooves 15a make it possible to secure a suitable magnitude of the cross-sectional area of the condensate flow paths 3 as a whole in total, to allow a condensate of a necessary flow rate to flow.

On the contrary, in the present embodiment, the inner side fluid flow path parts 15 each have the following structure in the longitudinal direction. The inner side fluid flow path parts 15 will be considered to be divided into three areas as shown by $R_1$, $R_2$ and $R_3$ in FIG. 4. In the present embodiment, the inner side fluid flow path parts 15 each have the same shape in the areas $R_1$ and $R_3$, and have shapes in the area $R_2$, which is held between the areas $R_1$ and $R_3$, different from the shape in the areas $R_1$ and $R_3$.

Figure 14:
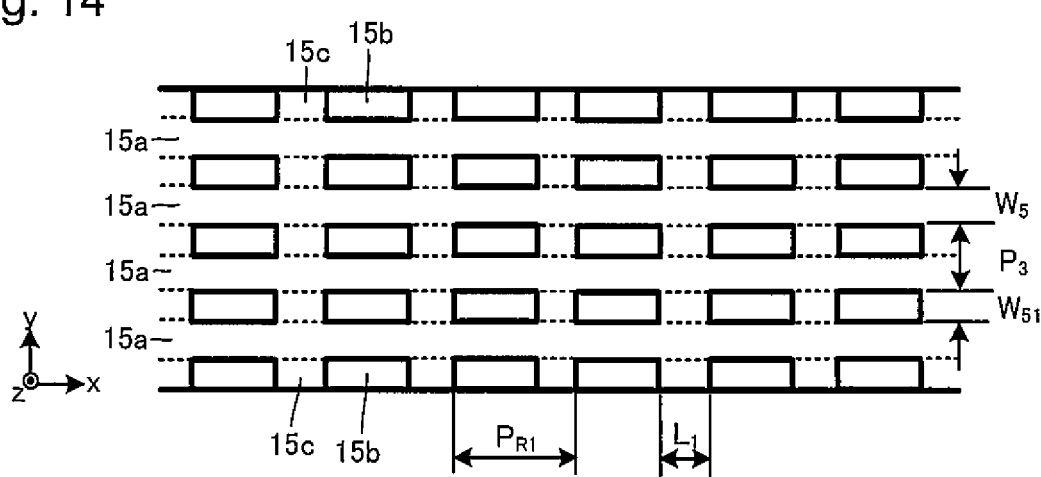
FIG. 14 is a partially enlarged plan view of the inner side fluid flow path part 15.
Figure 15:
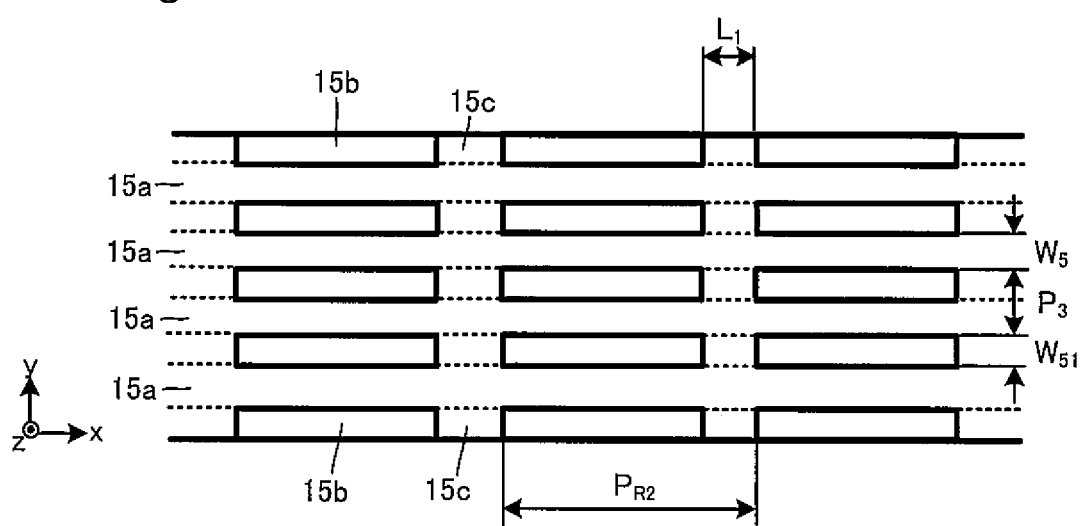
FIG. 15 is a partially enlarged plan view of the inner side fluid flow path part 15.

FIG. 14 is an enlarged plan view of the inner side fluid flow path part 15 in the area $R_1$ or $R_3$ viewed in the direction indicated by the arrow $I_5$ in FIG. 14. FIG. 15 is an enlarged plan view of the inner side fluid flow path part 15 in the area $R_2$ viewed in the direction indicated by the arrow $I_5$ in FIG. 14.

As can be seen in FIGS. 14 and 15, in each peripheral fluid flow path part 15, adjacent fluid flow path grooves 15a communicate with each other via communicating opening parts 15c that are disposed at given intervals. This promotes equality of the amount of a condensate between a plurality of the fluid flow path grooves 15a, to allow a condensate to efficiently flow, which makes it possible to smoothly reflux a working fluid. The communicating opening parts 15c, which are disposed among the wall parts 15b that are separating walls adjacent to the vapor flow path grooves 16 forming the vapor flow paths 4 (see FIG. 25), allow the vapor flow paths 4 and the condensate flow paths 3 to communicate with each other. Thus, formation of the communicating opening parts 15c makes it possible to smoothly move a condensate that is generated in the vapor flow paths 4 to the condensate flow paths 3.

Here, in the present embodiment, when the vapor flow paths 4 are divided into a plurality of the areas $R_1$, $R_2$ and $R_3$ in the extending direction thereof so that each area includes a plurality of the communicating opening parts 15c which align in the direction along the vapor flow paths 4, the pitch for the communicating opening parts 15c in the area $R_2$, which is one area, is formed larger than the pitch for the communicating opening parts 15c in the areas $R_1$ and $R_3$, which are areas both adjacent to the area $R_2$.

Thus, in the present embodiment, as can be also seen in the comparison of FIGS. 14 and 15, the pitch $P_{R2}$ for the communicating opening parts 15c in the area $R_2$, which is shown in FIG. 15, is formed so as to be larger than the pitch $P_{R1}$ for the communicating opening parts 15 in the areas $R_1$ and $R_3$, which is shown in FIG. 14, at least concerning the communicating opening parts 15c that are adjacent to the vapor flow path grooves 16. That is, the pitch for the communicating opening parts in areas (areas $R_1$ and $R_3$) both adjacent to an area (area $R_2$) where the pitch for the communicating opening parts is long, is formed so as to be shorter than the pitch for the communicating opening parts in the area $R_2$, which is between the areas $R_1$ and $R_3$.

This leads to a smaller contacting area of a working fluid and the first sheet, and a smaller contacting area of a vapor and a condensate in an area (area $R_2$) where the pitch for the communicating opening parts is longer than in areas (areas $R_1$ and $R_3$) adjacent to the area $R_2$, as described later, which makes it difficult for a working fluid to condense and evaporate. Therefore, for example, when the area $R_1$ is set as an evaporating part where a heat source is arranged, it is prevented that a vapor condenses in the area $R_2$ to block the vapor flow paths, which makes it possible to move the vapor from the heat source to the separated area $R_3$. For example, when the area $R_1$ is set as an evaporating part (heat receiving part, portion where a heat source is arranged), it can be prevented that a working fluid evaporates in the area $R_2$ and a condensate runs short in the area $R_1$, which is the evaporating part.

At the same time, in the area $R_2$, the distance where a capillary force operates in the condensate flow paths is longer than in areas (areas $R_1$ and $R_3$) adjacent to the area $R_2$, which can promote transport of a condensate.

This makes it possible to smoothly reflux a working fluid, to improve a heat transport capability.

In the present embodiment, the pitch ($P_{R1}$) for the communicating opening parts in the areas $R_1$ and $R_3$ are the same. The present invention is not limited to this. The pitches for the communicating opening parts in the areas $R_1$ and $R_3$ may be different. In the present embodiment, the pitches for the communicating opening parts in the areas $R_1$ and $R_3$ have only to be smaller than the pitch for the communicating opening parts in the area $R_2$, at least concerning the communicating opening parts 15c adjacent to the vapor flow path grooves 16.

Here, the areas $R_1$, $R_2$ and $R_3$ each have a size and a proportion that can be suitably set but not particularly limited. Each area is preferably formed to have a size suitable for the following: one of the areas $R_1$ and $R_3$ is set as an evaporating part (heat receiving part, portion where a heat source to be cooled is arranged), the other thereof is set as a cooling part, and the area $R_2$ therebetween is regarded as a transport part.

Thus, an area (one of the areas $R_1$ and $R_3$) set as an evaporating part is formed to have a size equal to or larger than a heat source to be cooled, and the area (the other of the areas $R_1$ and $R_3$) set as a cooling part can be formed to have the same size as the area set as the evaporating part.

The present embodiment shows an example such that the pitch for the communicating opening parts is fixed in one area. The present invention is not limited to this, and may encompass such an embodiment that the pitches for the communicating opening parts may be different even in the one same area. In this case, one inner side fluid flow path part 15 is considered to be divided into three areas over the total length, and for each area, the average value of the pitches for the communicating opening parts adjacent to the vapor flow path grooves is calculated: the inner side fluid flow path part 15 has only to be formed so that the average value of the pitches for the communicating opening parts in the central area is larger than that in each area on both sides (so that the average value of the pitches for the communicating opening parts in each area on both sides is smaller than that in the central area). Here, one may consider the division into three areas as three-equal division.

Figure 16:
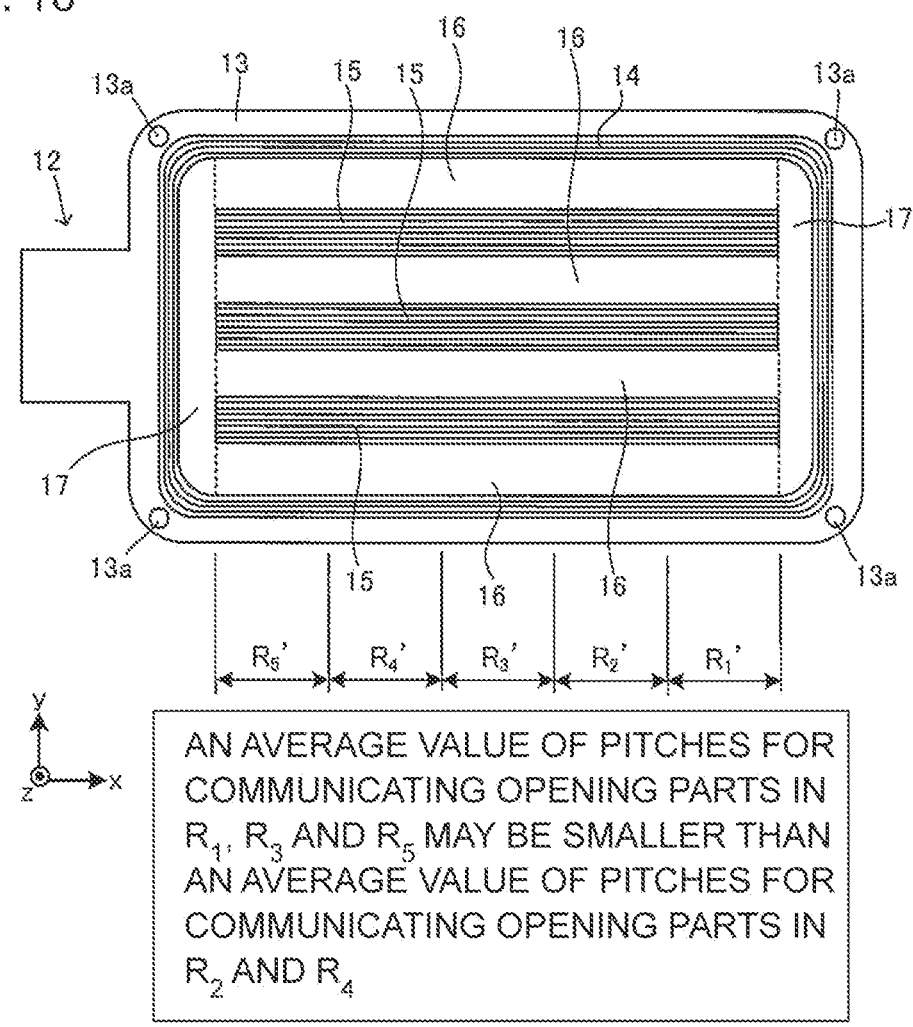
FIG. 16 explanatorily shows an example of division into areas in another way.

In the present embodiment, the example such that division into three areas is considered is shown. For this, such a case can be assumed that one of the areas arranged on both sides is set as an evaporating part (heat receiving part), and the other is set as a cooling part as described above. In contrast, as shown in FIG. 16, one may also consider division into five areas. According to this, the communicating opening parts are divided into areas $R_1'$ to $R_5'$, and are formed so that: the average value of the pitches for the communicating opening parts included in each of the central area $R_3'$, and the areas $R_1'$ and $R_5'$, which are on both sides, is smaller than that included in each of the area $R_2'$, which is between the areas $R_1'$ and $R_3'$, and the area $R_4'$, which is between the areas $R_3'$ and $R_5'$. Here, one may consider the division into five areas as five-equal division.

In this case, it is assumed that the central area $R_3'$ is set as an evaporating part (heat receiving part) and a heat source to be cooled is arranged therein, and the areas $R_1'$ and $R_5'$ on both sides are set as cooling parts.

That is, in the first sheet 10, the pitches for a plurality of the communicating opening parts are different in the extending direction of the inner side fluid flow path parts. In addition, the first sheet 10 includes a portion where the pitch for the communicating opening parts 15 in one area is formed to be larger than that in areas both adjacent to the one area.

In the inner side fluid flow path parts 15, according to the example in FIGS. 9 to 11, each wall part 15b may be also formed so as to have a narrower width at the end portions thereof, where the communicating opening parts 15c are formed, than the maximum width of the wall part 15b.

This makes it easy for a working fluid to move in the communicating opening parts 15c, and further allows the working fluid to smoothly reflux.

In contrast, when the vapor chamber does not operate, as described later, a working fluid collecting in the vicinity of the communicating opening parts 15c freezes, and the volume thereof increases. The end portions of the wall parts 15b are thin as the foregoing, and thus, if force operating in such a direction as to make the first sheet and the second sheet apart is applied then, stress concentrates on the thin portions, which leads to a situation where the wall parts 15b are easily broken. In the present embodiment, the wall parts 15b have sufficient durability so as not to be broken even in such a case.

Like the communicating opening parts 14c, according to the examples shown in FIG. 12, the communicating opening parts 15c may be arranged in offset, what is called zigzag alignment. The communicating opening parts 15c offset to be aligned as described above also allows the end portions of the wall parts 15b to be each formed to have a shape according to the examples in FIGS. 9 to 11.

Preferably, the inner side fluid flow path parts 15 having the foregoing structure further includes the following structure.

Each inner side fluid flow path part 15 preferably has a width, shown by $W_4$ in FIGS. 4, 5 and 13 (size in the aligning direction of the inner side fluid flow path parts 15 and the vapor flow path grooves 16, width on the bonding face to the second sheet 20), of at most 300 μm, which may be at most 1500 μm, and may be at most 1000 μm. In contrast, this width $W_4$ is preferably at least 100 μm, and may be at least 200 μm, and may be at least 400 μm. The range of this width $W_4$ may be defined by the combination of any one of the foregoing plural candidate values for the upper limit, and any one of the foregoing plural candidate values for the lower limit. The range of the width $W_4$ may be also defined by the combination of any two of the plural candidate values for the upper limit, or the combination of any two of the plural candidate values for the lower limit.

This sufficiently lowers the resistance in the vapor flow paths, which makes it possible to move a vapor and to reflux a condensate in a well-balanced manner.

The alignment pitch for the inner side fluid flow path parts 15, which is shown by $P_2$ in FIG. 5, is preferably at most 4000 μm, and may be at most 3000 μm, and may be at most 2000 μm. In contrast, this pitch $P_2$ is preferably at least 200 μm, and may be at least 400 μm, and may be at least 800 μm. The range of this pitch $P_2$ may be defined by the combination of any one of the foregoing plural candidate values for the upper limit, and any one of the foregoing plural candidate values for the lower limit. The range of the pitch $P_2$ may be also defined by the combination of any two of the plural candidate values for the upper limit, or the combination of any two of the plural candidate values for the lower limit.

This lowers the resistance in the vapor flow paths, which makes it possible to move a vapor and to reflux a condensate in a well-balanced manner.

Each fluid flow path groove 15a preferably has a width, shown by $W_5$ in FIGS. 13 to 15 (size in the aligning direction of the fluid flow path grooves 15a, width on an opening face of each groove), of at most 1000 μm, which may be at most 500 μm, and may be at most 300 μm. In contrast, this groove width $W_5$ is preferably at least 30 μm, and may be at least 40 μm, and may be at least 60 μm. The range of this width $W_5$ may be defined by the combination of any one of the foregoing plural candidate values for the upper limit, and any one of the foregoing plural candidate values for the lower limit. The range of the width $W_5$ may be also defined by the combination of any two of the plural candidate values for the upper limit, or the combination of any two of the plural candidate values for the lower limit.

Each groove preferably has a depth, shown by $D_2$ in FIG. 13, of at most 200 m, which may be at most 150 μm, and may be at most 100 μm. In contrast, this depth $D_2$ is preferably at least 5 μm, and may be at least 10 μm, and may be at least 20 μm. The range of this depth $D_2$ may be defined by the combination of any one of the foregoing plural candidate values for the upper limit, and any one of the foregoing plural candidate values for the lower limit. The range of the depth $D_2$ may be also defined by the combination of any two of the plural candidate values for the upper limit, or the combination of any two of the plural candidate values for the lower limit.

This can bring about a greater capillary force of the condensate flow paths which is necessary for reflux.

In view of bringing about a greater capillary force of the flow paths, the cross section of each flow path preferably has an aspect ratio larger than 1.0. The aspect ratio is represented by a value obtained by dividing the width $W_5$ by the depth $D_2$. This ratio may be at least 1.5, and may be at least 2.0. Or, the aspect ratio may be smaller than 1.0, may be at most 0.75, and may be at most 0.5.

Among them, in view of production, the width $W_5$ is preferably larger than the depth $D_2$, and in such a view, the aspect ratio is preferably larger than 1.3.

Each wall part 15b preferably has a width, shown by $W_{51}$ in FIGS. 13 to 15 (size in the aligning direction of the wall parts 15b, width of each wall part 15b at a portion on the inner face 10a side), of at most 300 μm, which may be at most 200 μm, and may be at most 100 μm. In contrast, the width $W_{51}$ is preferably at least 20 µm, and may be at least 30 µm, and may be at least 50 µm. This width less than 20 µm leads to easy rupture due to repeated freezing and melting of a working fluid. This width more than 500 µm leads to too wide a width of each communicating opening part 15c, which may prevent a working fluid from smoothly communicating with the condensate flow paths 3 adjacent to the wall parts 15b.

The range of the width $W_{51}$ may be defined by the combination of any one of the foregoing plural candidate values for the upper limit, and any one of the foregoing plural candidate values for the lower limit. The range of the groove width $W_{51}$ may be also defined by the combination of any two of the plural candidate values for the upper limit, or the combination of any two of the plural candidate values for the lower limit.

In the present embodiment, each fluid flow path groove 15a has a semi-elliptical cross-sectional shape. The present invention is not limited to this. The cross-sectional shape may be a quadrangle such as a square, a rectangle, and a trapezoid, a triangle, a semicircle, a circle at the bottom portion, a semi-ellipse at the bottom portion, or the like, or any combination thereof.

The pitch for adjacent fluid flow path grooves 15a, which is shown by $P_3$ in FIGS. 14 and 15, is preferably at most 1300 µm, and may be at most 700 µm, and may be at most 400 µm. In contrast, this pitch $P_3$ is preferably at least 50 µm, and may be at least 70 µm, and may be at least 110 µM. The range of this pitch $P_3$ may be defined by the combination of any one of the foregoing plural candidate values for the upper limit, and any one of the foregoing plural candidate values for the lower limit. The range of the pitch $P_3$ may be also defined by the combination of any two of the plural candidate values for the upper limit, or the combination of any two of the plural candidate values for the lower limit.

This makes it possible to increase the density of the condensate flow paths, and at the same time to suppress the flow paths deforming to crush in bonding or assembling.

Each communicating opening part 15c preferably has a size along the extending direction of the fluid flow path grooves 15a, which is shown by $L_1$ in FIGS. 14 and 15, of at most 1100 µm, which may be at most 550 µm, and may be at most 220 µm. In contrast, this size $L_1$ is preferably at least 30 µm, and may be at least 55 µm, and may be at least 70 µm. The range of this size $L_1$ may be defined by the combination of any one of the foregoing plural candidate values for the upper limit, and any one of the foregoing plural candidate values for the lower limit. The range of the size $L_1$ may be also defined by the combination of any two of the plural candidate values for the upper limit, or the combination of any two of the plural candidate values for the lower limit.

The pitches for adjacent communicating opening parts 15c in the extending direction of the fluid flow path grooves 15a, which are shown by $P_{R1}$ and $P_{R2}$ in FIGS. 14 and 15, have the relationship as described above. These pitches can be further formed as follows. Each of these pitches $P_{R1}$ and $P_{R2}$ is preferably at most 2700 µm, and may be at most 1800 µm, and may be at most 900 µm. In contrast, each of these pitches $P_{R1}$ and $P_{R2}$ is preferably at least 60 µm, and may be at least 110 µm, and may be at least 140 µm. The ranges of these pitches $P_{R1}$ and $P_{R2}$ may be defined by the combination of any one of the foregoing plural candidate values for the upper limit, and any one of the foregoing plural candidate values for the lower limit. The ranges of these pitches $P_{R1}$ and $P_{R2}$ may be also defined by the combination of any two of the plural candidate values for the upper limit, or the combination of any two of the plural candidate values for the lower limit.

The aspect of the communicating opening parts 15c, the foregoing size $L_1$, and the pitches $P_{R1}$ and $P_{R2}$ for the communicating opening parts 15c are also applicable to the communicating opening parts 14c of the peripheral fluid flow path part 14.

The foregoing fluid flow path grooves 14a and fluid flow path grooves 15a in the present embodiment are separated from each other at regular intervals, and are arranged in parallel to each other, respectively. The present invention is not limited to this. The pitches for the grooves may be irregular as long as the capillary action can be brought about, and the grooves do not have to be in parallel to each other.

Next, the vapor flow path grooves 16 will be described. The vapor flow path grooves 16 are portions where a vapor that is a working fluid evaporating to vaporize passes, and form a part of the vapor flow paths 4, which are the first flow paths. FIG. 4 shows a shape of the vapor flow path grooves 16 in a plan view, and FIG. 5 shows a cross-sectional shape of the vapor flow path grooves 16.

As can be seen in these drawings, the vapor flow path grooves 16 are formed of grooves that are formed on the inner face 10a of the main body 11 inside the ring of the annular peripheral fluid flow path part 14. Specifically, the vapor flow path grooves 16 in the present embodiment are formed between adjacent inner side fluid flow path parts 15, and between the peripheral fluid flow path part 14 and the inner side fluid flow path parts 15, and are grooves extending in a direction parallel to a long side of the rectangle of the main body 11 in a plan view (direction x). The plural (four in the present embodiment) vapor flow path grooves 16 are aligned in a direction parallel to a short side of the rectangle of the main body 11 in a plan view (direction y). Thus, as can be seen in FIG. 5, the first sheet 10 has a shape such that recesses and protrusions are repeated in the direction y: the protrusions are the peripheral fluid flow path part 14 and the inner side fluid flow path parts 15; and the recesses are the vapor flow path grooves 16.

Here, since being a groove, each of the vapor flow path grooves 16 includes a bottom portion that is on the outer face 10b side, and an opening on the inner face 10a side, which is opposite to, and faces the bottom portion, in the cross-sectional shape thereof.

Each vapor flow path grooves 16 having such a structure can further includes the following structure.

Each vapor flow path groove 16 is preferably formed to have a width, shown by $W_6$ in FIGS. 4 and 5 (size in the aligning direction of the inner side fluid flow path parts 15 and the vapor flow path grooves 16, width on an opening face of each groove), at least larger than each of the foregoing width $W_3$ of each fluid flow path groove 14a and width $W_5$ of each fluid flow path groove 15a, which is preferably at most 2000 µm, and may be at most 1500 µm, and may be at most 1000 In contrast, this width $W_6$ is preferably at least 100 µm, and may be at least 200 µm, and may be at least 400 µm. The range of this width $W_6$ may be defined by the combination of any one of the foregoing plural candidate values for the upper limit, and any one of the foregoing plural candidate values for the lower limit. The range of the width $W_6$ may be also defined by the combination of any two of the plural candidate values for the upper limit, or the combination of any two of the plural candidate values for the lower limit.

The pitch for the vapor flow path grooves 16 is usually fixed according to the pitch for the inner side fluid flow path parts 15.

On the contrary, each vapor flow path groove 16 is formed to have a depth, shown by $D_3$ in FIG. 5, at least larger than each of the foregoing depth $D_1$ of each fluid flow path groove 14a and depth $D_2$ of each fluid flow path groove 15a, which is preferably at most 300 μm, and may be at most 200 μm, and may be at most 100 μm. In contrast, this depth $D_3$ is preferably at least 10 pill, and may be at least 25 μm, and may be at least 50 μm. The range of this depth $D_3$ may be defined by the combination of any one of the foregoing plural candidate values for the upper limit, and any one of the foregoing plural candidate values for the lower limit. The range of the depth $D_3$ may be also defined by the combination of any two of the plural candidate values for the upper limit, or the combination of any two of the plural candidate values for the lower limit.

A larger cross-sectional area of each vapor flow path groove than that of each fluid flow path groove as described above makes it possible to smoothly reflux a vapor having a larger volume than a condensate due to the properties of a working fluid.

Here, each vapor flow path groove 16 can be formed so that each vapor flow path 4 has a flat shape such that the width thereof is larger than the height (size in the thickness direction) thereof when combined with the second sheet 20 to form the vapor flow paths 4 as described later. Therefore, the aspect ratio that is a value obtained by dividing $W_6$ by $D_6$ can be at least 4.0, and further may be at least 8.0.

In the present embodiment, each vapor flow path groove 16 has a semi-elliptical cross-sectional shape. The present invention is not limited to this. The cross-sectional shape may be a quadrangle such as a square, a rectangle, and a trapezoid, a triangle, a semicircle, a circle at the bottom portion, a semi-ellipse at the bottom portion, or any combination of some of them.

Since the vapor flow paths lower the flow resistance of a vapor, to allow a working fluid to smoothly reflux, the cross-sectional shape of each flow path can be also determined in such a view.

The vapor flow path communicating grooves 17 are grooves that allow a plurality of the vapor flow path grooves 16 to communicate with each other at end portions of the vapor flow path grooves 16. This leads to achievement of equality of a vapor in a plurality of the vapor flow path grooves 16, and makes it possible to transport a vapor into a wider area, to efficiently use the condensate flow paths 3 formed of more fluid flow path grooves 14a and fluid flow path grooves 15a. This makes it possible to smoothly reflux a working fluid.

As can be seen in FIGS. 3 and 4, the vapor flow path communicating grooves 17 in the present embodiment are formed between the peripheral fluid flow path part 14, and both end portions of the inner side fluid flow path parts 15 in the extending direction and both end portions of the vapor flow path grooves 16 in the extending direction. FIG. 7 shows a cross section of the vapor flow path communicating groove 17 which is orthogonal to the communicating direction thereof. Since the boundaries between the vapor flow path communicating grooves 17 and the vapor flow paths 16 are not always formed as shapes, FIGS. 3 and 4 show these boundaries by the dotted lines, for understandability.

The vapor flow path communicating grooves 17 have only to be formed so that adjacent vapor flow path grooves 16 communicate with each other, and each thereof has a shape not particularly limited. For example, each vapor flow path communicating groove 17 can have the following structure.

Each vapor flow path communicating groove 17 preferably has a width, shown by $W_7$ in FIGS. 4 and 7 (size in a direction orthogonal to the communicating direction thereof, width on an opening face of each groove), of at most 1000 μm, which may be at most 750 μm, and may be at most 500 μm. In contrast, this width $W_7$ is preferably at least 100 μm, and may be at least 150 μm, and may be at least 200 μm. The range of this width $W_7$ may be defined by the combination of any one of the foregoing plural candidate values for the upper limit, and any one of the foregoing plural candidate values for the lower limit. The range of the width $W_7$ may be also defined by the combination of any two of the plural candidate values for the upper limit, or the combination of any two of the plural candidate values for the lower limit.

Each vapor flow path communicating groove 17 preferably has a depth, shown by $D_4$ in FIG. 7, of at most 300 μm, which may be at most 200 μm, and may be at most 100 μm. In contrast, this depth $D_4$ is preferably at least 10 μm, and may be at least 25 μm, and may be at least 50 μm. The range of this depth $D_4$ may be defined by the combination of any one of the foregoing plural candidate values for the upper limit, and any one of the foregoing plural candidate values for the lower limit. The range of the depth $D_4$ may be also defined by the combination of any two of the plural candidate values for the upper limit, or the combination of any two of the plural candidate values for the lower limit. Among them, the depth $D_4$ may be the same as the depth $D_3$ of each of the vapor flow path groove 16. This makes production easy.

In the present embodiment, each vapor flow path communicating groove 17 has a semi-elliptical cross-sectional shape. The present invention is not limited to this. The cross-sectional shape may be a quadrangle such as a square, a rectangle, and a trapezoid, a triangle, a semicircle, a circle at the bottom portion, a semi-ellipse at the bottom portion, or any combination of some of them.

Since the vapor flow path communicating grooves lower the flow resistance of a vapor, to allow a working fluid to smoothly reflux, the cross-sectional shape of each flow path can be also determined in such a view.

Figure 17:
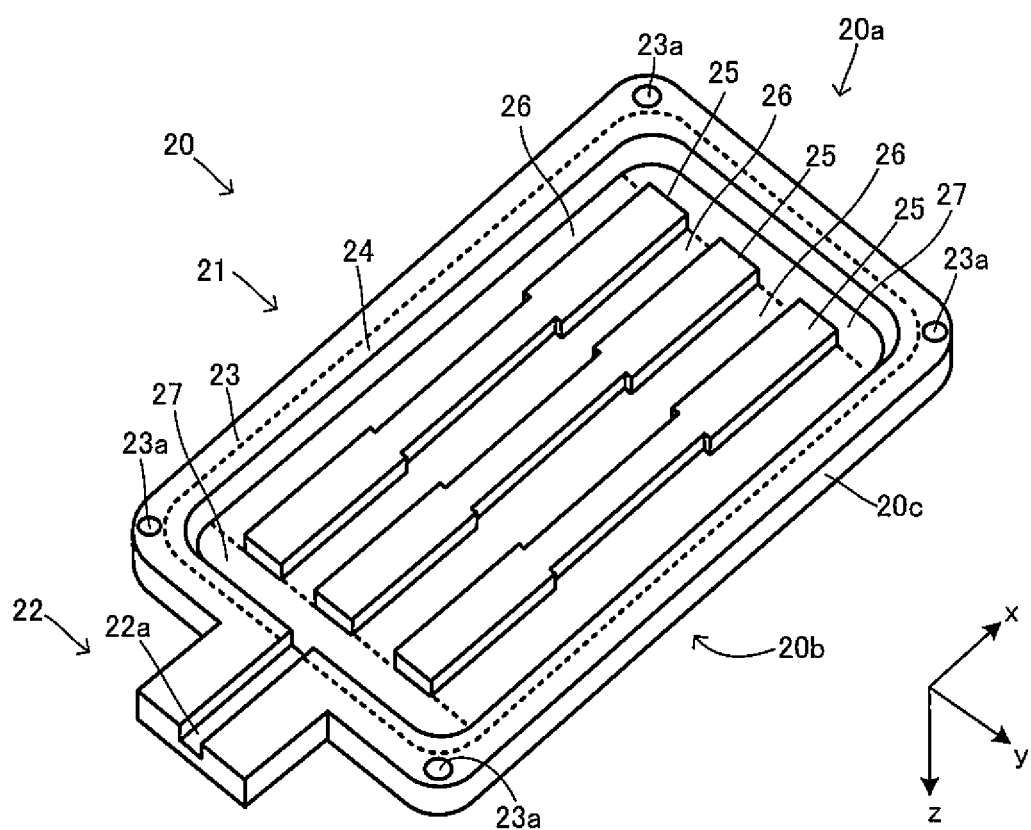
FIG. 17 is a perspective view of a second sheet 20.

Next, the second sheet 20 will be described. In the present embodiment, the second sheet 20 is also a sheet-like member as a whole. FIG. 17 is a perspective view of the second sheet 20 viewed on an inner face 20a side, and FIG. 18 is a plan view of the second sheet 20 viewed on the inner face 20a side.

Figure 18:
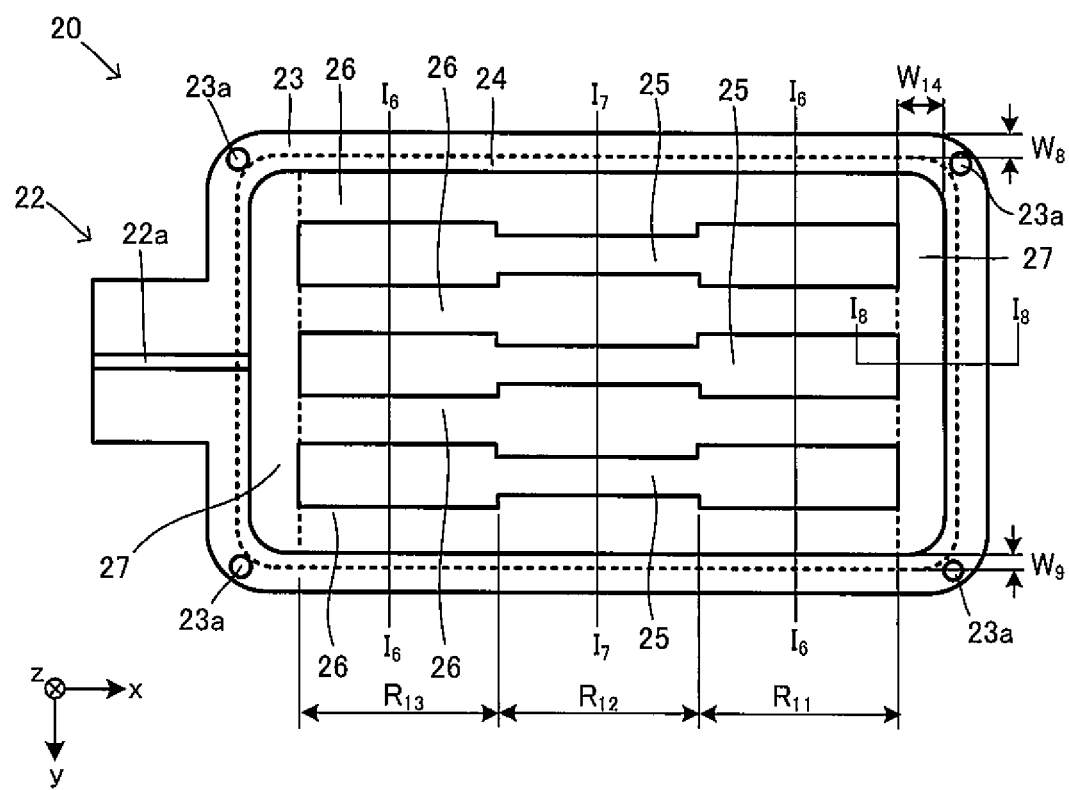
FIG. 18 is a plan view of the second sheet 20.
Figure 19:
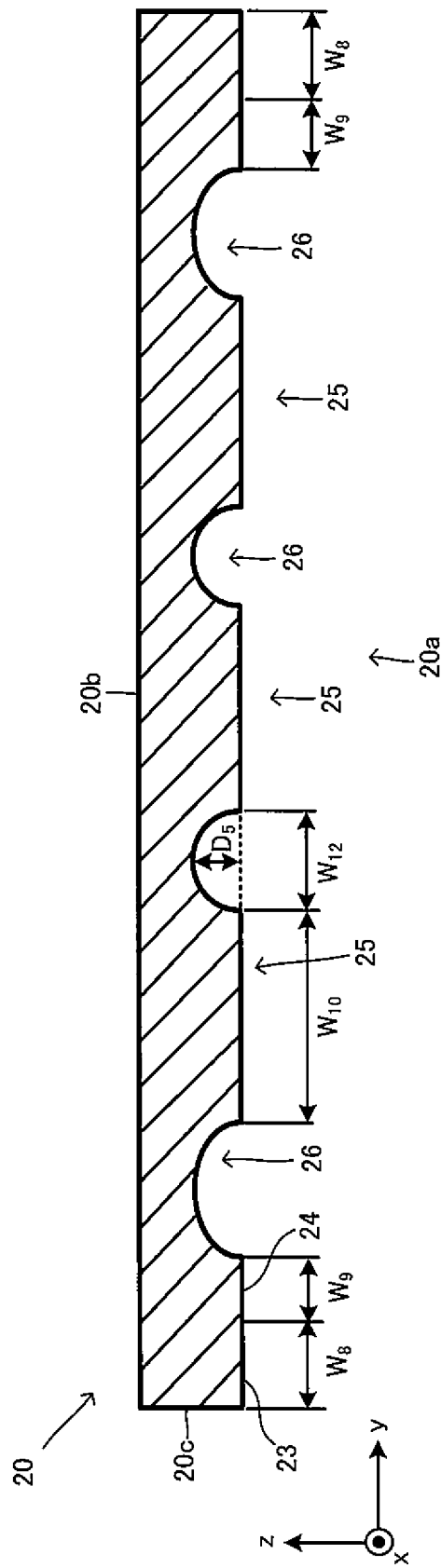
FIG. 19 shows a cross section of the second sheet 20.
Figure 20:
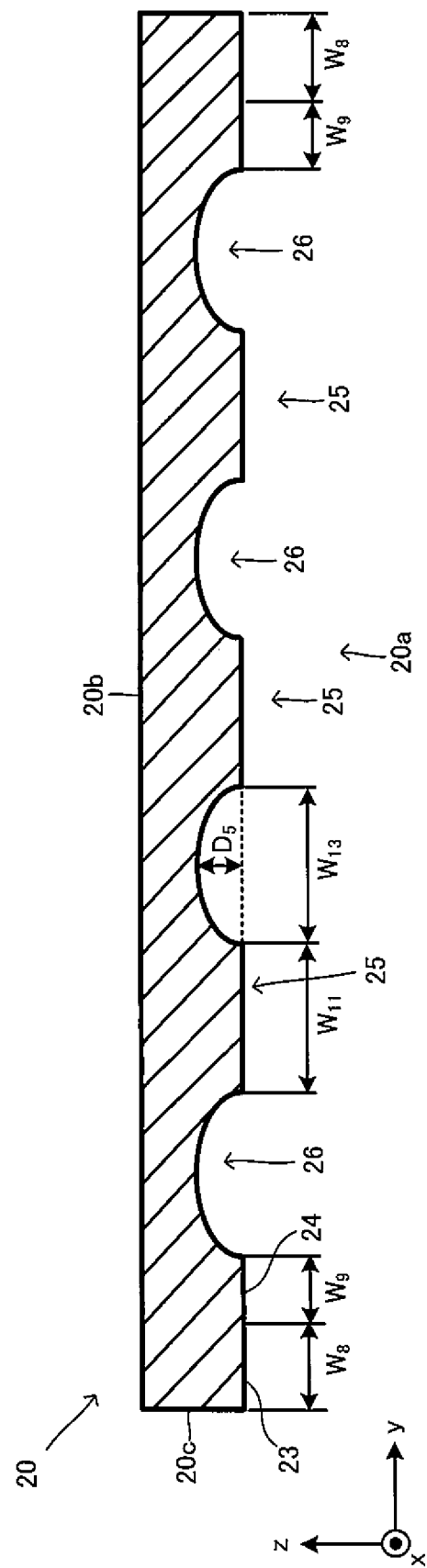
FIG. 20 shows a cross section of the second sheet 20.

FIG. 19 shows a cross section taken along the line $I_6$-$I_6$ in FIG. 18, and FIG. 20 shows a cross section taken along the line $I_7$-$I_7$ in FIG. 18.

Since the second sheet 20 can be also considered to be divided into three areas $R_{11}$, $R_{12}$ and $R_{13}$, FIG. 19 shows a cross section in the area $R_{11}$ or $R_{13}$, which is shown by $I_6$-$I_6$ in FIG. 18, and FIG. 20 shows a cross section in the area $R_{12}$, which is shown by $I_7$-$I_7$ in FIG. 18.

Figure 21:
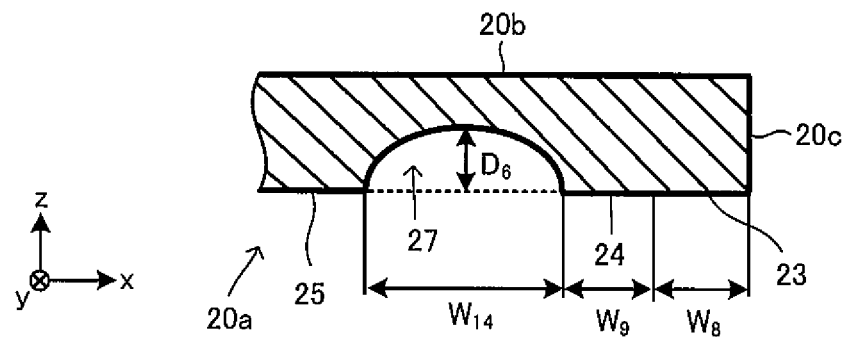
FIG. 21 shows another cross section of the second sheet 20.

FIG. 21 shows a cross section of the second sheet 20 taken along the line $I_8$-$I_8$ in FIG. 18.

The second sheet 20 includes the inner face 20a, an outer face 20b on the opposite side of the inner face 20a, and a side face 20c that couples the inner face 20a to the outer face 20b to form thickness: on the inner face 20a side, a pattern for refluxing a working fluid is formed. As described later, the inner face 20a of the second sheet 20 and the foregoing inner face 10a of the first sheet 10 are superposed so as to face each other, to form the enclosure.

Such a second sheet 20 includes a main body 21 and an inlet 22. The main body 21 is a sheet-like portion and forms a portion where a working fluid refluxes, and in the present embodiment, is a rectangle having the corners of circular arcs (what is called R) in a plan view.

The inlet 22 is a portion via which a working fluid is poured into the enclosure 2, which is formed of the first sheet 10 and the second sheet 20 (see FIG. 25), and in the present embodiment, is like a sheet of a quadrangle in a plan view which sticks out of one side of the main body 21, which is a rectangle in a plan view. In the present embodiment, an inlet groove 22a is formed on the inlet 22 of the second sheet 20 on the inner face 20a side, and communicates from the side face 20c of the second sheet 20 to the inside of the main body 21 (portion to be the enclosure 2).

The thickness of such a second sheet 20, and the material such a second sheet 20 is constituted of can be considered the same as the first sheet 10. The first sheet 10 and the second sheet 20 do not have to have the same thickness, or be constituted of the same material.

A structure for refluxing a working fluid is formed in the main body 21 on the inner face 20a side. Specifically, the main body 21 includes a peripheral bonding part 23, a peripheral fluid flow path part 24, inner side fluid flow path parts 25, vapor flow path grooves 26, and vapor flow path communicating grooves 27, on the inner face 20a side.

The peripheral bonding part 23 is a face that is disposed along the periphery of the main body 21 on the inner face 20a side of the main body 21. This peripheral bonding part 23 is superposed on, and bonded (diffusion bonding, brazing, etc.) to the peripheral bonding part 13 of the first sheet 10, to form the enclosure 2 between the first sheet 10 and the second sheet 20. A working fluid is sealed here.

The width of the peripheral bonding part 23, which is shown by $W_8$ in FIGS. 18 to 21, may be the same as, or different from the foregoing width $W_1$ of the peripheral bonding part 13 of the main body 11 of the first sheet 10.

The four corners of the peripheral bonding part 23 of the main body 21 are provided with holes 23a penetrating in the thickness direction (direction z). These holes 23a function as positioning means when the second sheet 20 is superposed on the first sheet 10.

The peripheral fluid flow path part 24 is a fluid flow path part, and forms a part of the condensate flow paths 3, which are the second flow paths where a working fluid passes when the working fluid condenses to liquefy.

The inner face 20a of the main body 21 is provided with the peripheral fluid flow path part 24 along the inside of the peripheral bonding part 23 so that the peripheral fluid flow path part 24 forms an annular shape along the periphery of the enclosure 2. In the present embodiment, the peripheral fluid flow path part 24 of the second sheet 20 is on the same face as the peripheral bonding part 23 as can be seen in FIGS. 19 to 21. According to this, the openings of at least a part of the fluid flow path grooves 14a among a plurality of the foregoing fluid flow path grooves 14a of the first sheet 10 are closed, to form the condensate flow paths 3. A specific aspect on the combination of the first sheet 10 and the second sheet 20 will be described later.

Since the peripheral bonding part 23 and the peripheral fluid flow path part 24 are on the one face in the second sheet 20 as described above, there is no boundary to structurally distinguish them. FIGS. 17 and 18 show the boundary between them by the dotted lines for understandability.

The peripheral fluid flow path part 24 preferably has the following structure.

In the present embodiment, the width $W_9$ of the peripheral fluid flow path part 24, which is shown in FIGS. 18 to 21, is formed to have the same magnitude as the width $W_2$ of the peripheral fluid flow path part 14 of the first sheet 10.

Next, the inner side fluid flow path parts 25 will be described. The inner side fluid flow path parts 25 are also fluid flow path parts, and are one of portions forming the condensate flow paths 3, which are the second flow paths.

As can be seen in FIGS. 17 to 20, the inner face 20a of the main body 21 is provided with the inner side fluid flow path parts 25 inside the ring of the annular peripheral fluid flow path part 24. The inner side fluid flow path parts 25 in the present embodiment are protrusions extending in a direction parallel to a long side of the rectangle of the main body 21 in a plan view (direction x). The plural (three in the present embodiment) inner side fluid flow path parts 25 are aligned at given intervals in a direction parallel to a short side of the rectangle of the main body 21 in a plan view (direction y).

In the present embodiment, each inner side fluid flow path part 25 is formed so that a surface thereof on the inner face 20a side is a flat face before bonding to the first sheet 10. According to this, the openings of at least a part of the fluid flow path grooves 15a among a plurality of the foregoing fluid flow path groove 15a of the first sheet 10 are closed, to form the condensate flow paths 3, which are the second flow paths.

On the contrary, the inner side fluid flow path parts 25 each have the following structure in the longitudinal direction. The inner side fluid flow path parts 25 will be considered to be divided into three areas in the present embodiment as shown by $R_{11}$, $R_{12}$ and $R_{13}$ in FIG. 18. In the present embodiment, the inner side fluid flow path parts 25 each have the same shape in the areas $R_{11}$ and $R_{13}$, and have shapes in the area $R_{12}$, which is held between the areas $R_{11}$ and $R_{13}$, different from the shape in the areas $R_{13}$ and $R_{13}$.

Here, in the present embodiment, the inner side fluid flow path parts 25 are each formed so as to have widths $W_{10}$ and $W_u$ shown in FIGS. 19 and 20, each larger than the width $W_4$ of each inner side fluid flow path part 15 of the first sheet 10. This makes it possible to form projecting parts 6 on the vapor flow paths 4 as described later, which makes it possible to smoothly move a condensate.

Here, as can be seen in FIGS. 17 to 20, the inner side fluid flow path parts 25 are formed so as to each have the width $W_{11}$ in the area $R_{12}$ smaller than the width $W_{10}$ in the areas $R_{11}$ and $R_{13}$. That is, each inner side fluid flow path part is formed so as to have a width smaller in one area than that in each of both areas adjacent to the one area when inner side fluid flow path parts are divided into a plurality of areas in the extending direction thereof.

This leads to a smaller projecting amount of each projecting part 6 in an area where each inner side fluid flow path part 25 has a narrow width (area $R_{12}$) than that in each area both adjacent to the foregoing area, where each inner side fluid flow path part 25 has a wide width (areas $R_{11}$ and $R_{13}$), as described later, which leads to a small contacting area of a working fluid and the second sheet, and a small contacting area of a vapor and a condensate, which makes it difficult for the working fluid to condense and evaporate. Thus, for example, when the area $R_{11}$ is set as an evaporating part where a heat source is arranged, it is prevented that a vapor in the area $R_{12}$ blocks the vapor flow paths as a condensate, which makes it possible to move the vapor from the heat source to the separated area $R_{13}$. For example, when the area $R_{11}$ is set as an evaporating part (heat receiving part, portion where a heat source is arranged), it can be prevented that a working fluid evaporates in the area $R_{12}$ and a condensate runs short in the area $R_{11}$, which is the evaporating part.

This makes it possible to smoothly reflux a working fluid, to improve a heat transport capability.

In the present embodiment, each inner side fluid flow path part 25 has the same width ($W_{10}$) in the areas $R_{11}$ and $R_{13}$. The present invention is not limited to this. Each inner side fluid flow path part may have different widths between the areas $R_{11}$ and $R_{13}$. In the present embodiment, each inner side fluid flow path part in the areas $R_{11}$ and $R_{13}$ has only to have a width larger than each inner side fluid flow path part in the area $R_{12}$.

Here, each of the areas $R_{11}$, $R_{12}$ and $R_{13}$ has a size and a proportion that can be suitably set but not particularly limited. Each area can be formed to have a size suitable for the following: one of the areas $R_{11}$ and $R_{13}$ is set as an evaporating part (heat receiving part, portion where a heat source to be cooled is arranged), the other thereof is set as a cooling part, and the area $R_{12}$ therebetween is regarded as a transport part.

Thus, an area (one of the areas $R_{11}$ and $R_{13}$) set as an evaporating part is formed to have a size equal to or larger than a heat source to be cooled, and the area (the other of the areas $R_{11}$ and $R_{13}$) set as a cooling part can be formed to have the same size as the area set as the evaporating part.

Figure 22:
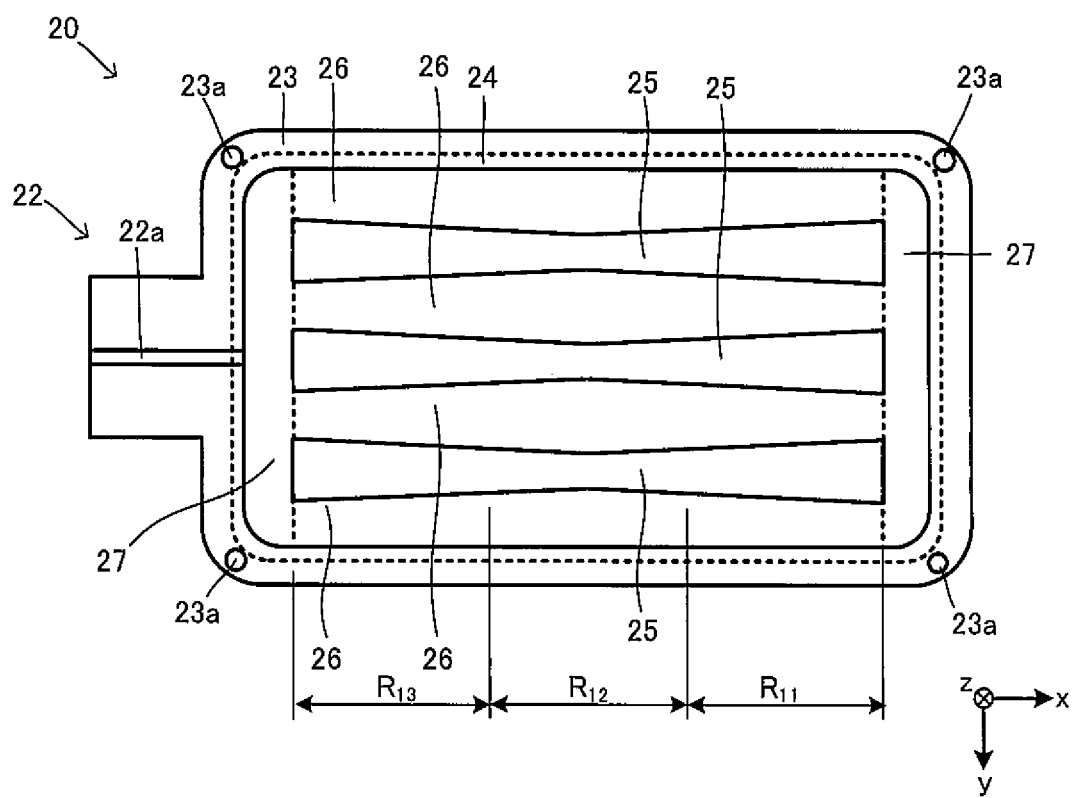
FIG. 22 is a plan view of the second sheet 20 according to a modification.

In the present embodiment, the example such that each inner side fluid flow path part has a fixed width in one area is shown. The present invention is not limited to this, and may encompass such an embodiment that, as shown in FIG. 22, each inner side fluid flow path part may have a varying width which is not fixed. In this case, one inner side fluid flow path part 25 is considered to be divided into three areas (areas $R_{11}$, $R_{11}$ and $R_{13}$) over the total length, and for each area, the average value of the widths of the inner side fluid flow path part is calculated: the inner side fluid flow path part 25 has only to be formed so that the average value of the widths of the inner side fluid flow path part in the central area (area $R_{12}$) is smaller than that in each area on both sides (areas $R_{11}$ and $R_{13}$). Here, one may consider the division into three areas as three-equal division.

In the present embodiment, the area $R_1$, which is described in relation to the first sheet 10, is formed to have the same length as the area $R_{11}$, which is described in relation to the second sheet 20. Likewise, the area $R_2$ is formed to have the same length as the area $R_{11}$, and the area $R_3$ is formed to have the same length as the area $R_{13}$. This can synergistically bring about the effect due to the difference in pitch for the communicating opening part 15c as described above, and the effect due to the difference in width of each inner side fluid flow path part 25 (projecting amount), which makes it possible to obtain higher effect.

The present invention is not limited to this. The areas $R_1$ and $R_{11}$, the areas $R_2$ and $R_{12}$, and the areas $R_3$ and $R_{13}$ may be individually set respectively without any correlation.

Since only one of the structure of the difference in pitch for the communicating opening part 15c, and the structure of the difference in width of each inner side fluid flow path part 25 (projecting amount) can independently bring about effect, the vapor chamber may have only one of the structures.

That is, for example, the present invention may encompass a vapor chamber of such an embodiment that while the pitch for the communicating opening parts 15c is the same in all the areas, each inner side fluid flow path part has different widths (projecting amounts) between the areas, or may encompass a vapor chamber of such an embodiment that while the pitches for the communicating opening parts 15c are different between the areas, each inner side fluid flow path part has the same width (projecting amount) in all the areas.

Figure 23:
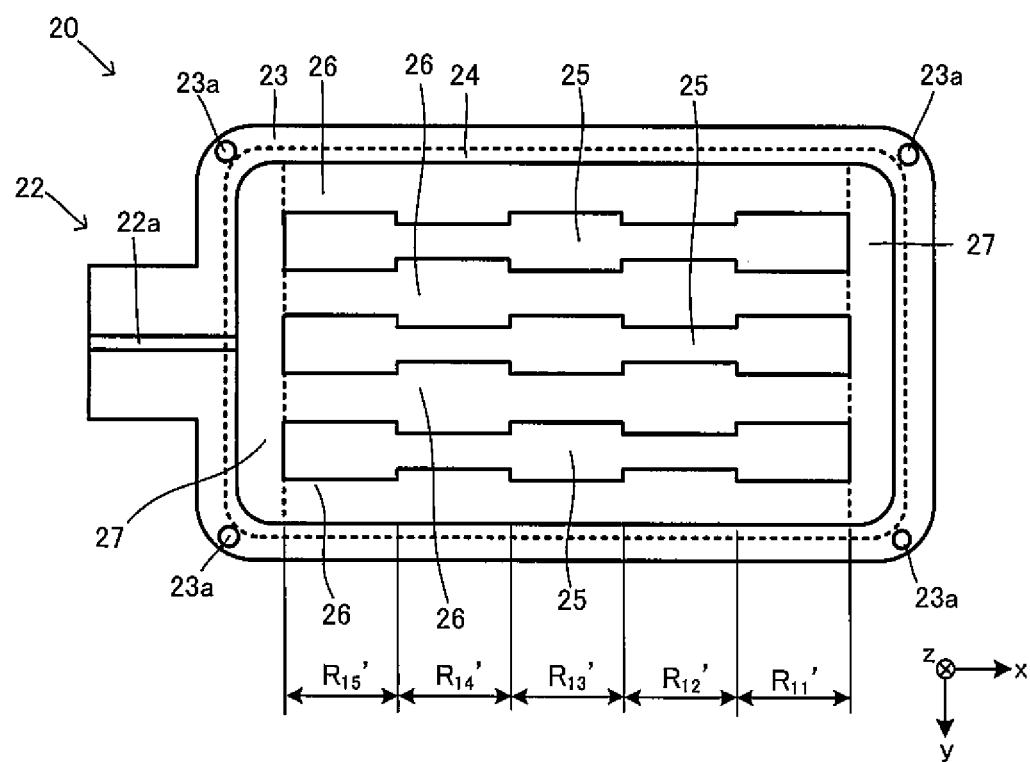
FIG. 23 explanatorily shows an example of division into areas in another way.
Figure 24:
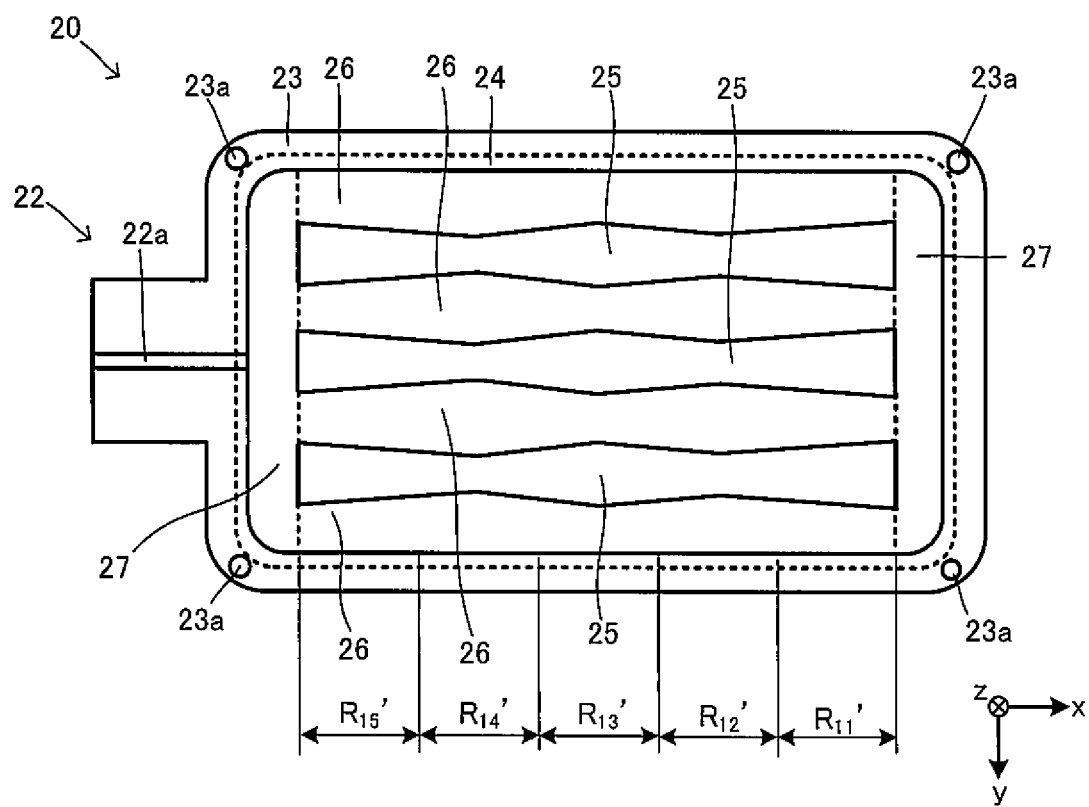
FIG. 24 explanatorily shows an example of division into areas in another way.

In the present embodiment, the example such that division into three areas is considered is shown. For this, such a case can be assumed that one of the areas arranged on both sides is set as an evaporating part (heat receiving part), and the other is set as a cooling part as described above. In contrast, as shown in FIGS. 23 and 24, one may also consider division into five areas. According to this, the inner side fluid flow path parts are divided into areas $R_{11}'$ to $R_{15}'$, and are formed so that: the average value of the widths of the inner side fluid flow path parts included in each of the central area $R_{13}'$, and the areas $R_{11}'$ and $R_{15}'$ on both sides is larger than that of the inner side fluid flow path parts included in each of the area $R_{12}'$ between the areas $R_{11}'$ and $R_{13}'$, and the area $R_{14}'$ between the areas $R_{13}'$ and $R_{15}'$. This makes it possible to vary the projecting amounts according to each area as described later. Here, one may consider the division into five areas as five-equal division.

In this case, it is assumed that the central area $R_{13}'$ is set as an evaporating part (heat receiving part) and a heat source to be cooled is arranged therein, and the areas $R_{11}'$ and $R_{15}'$ on both sides are set as cooling parts.

That is, in the second sheet 20, each inner side fluid flow path part has a width which varies in the extending direction thereof. In addition, each inner side fluid flow path part includes a portion that is formed so as to have a width in one area smaller than areas both adjacent to the one area.

Next, the vapor flow path grooves 26 will be described. The vapor flow path grooves 26 are portions where a vapor that is a working fluid evaporating to vaporize passes, and form a part of the vapor flow paths 4, which are the first flow paths. FIG. 18 shows a shape of the vapor flow path grooves 26 in a plan view, and FIGS. 19 and 20 each show cross-section shapes of the vapor flow path grooves 26.

As can be seen in these drawings, the vapor flow path grooves 26 are formed of grooves that are formed on the inner face 20a of the main body 21 inside the ring of the annular peripheral fluid flow path part 24. Specifically, the vapor flow path grooves 26 in the present embodiment are formed between adjacent inner side fluid flow path parts 25, and between the peripheral fluid flow path part 24 and the inner side fluid flow path parts 25, and are grooves extending in a direction parallel to a long side of the rectangle of the main body 21 in a plan view (direction x). The plural (four in the present embodiment) vapor flow path grooves 26 are aligned in a direction parallel to a short side of the rectangle of the main body 21 in a plan view (direction y). Thus, the second sheet 20 has a shape such that recesses and protrusions are repeated: the protrusions are formed of the peripheral fluid flow path part 24 and the inner side fluid flow path parts 25; and the recesses are formed of the vapor flow path grooves 26, in the direction y.

Here, since being a groove, each of the vapor flow path grooves 26 includes a bottom portion on the outer face 20b side, and an opening on the inner face 20a side, which is opposite to and faces the bottom portion, in the cross-sectional shape thereof.

The vapor flow path grooves 26 are preferably arranged at a place where the vapor flow path grooves 26 are superposed on the vapor flow path grooves 16 of the first sheet 10 in the thickness direction when combined with the first sheet 10. This makes it possible for the vapor flow path grooves 16 and the vapor flow path grooves 26 to form the vapor flow paths 4.

Since the vapor flow path grooves 26 are grooves formed adjacently to the inner side fluid flow path parts 25, the shape thereof is influenced by the shape of the inner side fluid flow path parts 25. Therefore, in the present embodiment, each vapor flow path groove 26 is formed to have the widths $W_{12}$ and $W_{13}$, shown in FIGS. 19 and 20, each smaller than the width $W_6$ of each vapor flow path groove 16 of the first sheet 10. The widths are also different according to the areas $R_{11}$, $R_{12}$ and $R_{13}$, which are described in relation to the inner side fluid flow path parts 25. Specifically, each vapor flow path groove 26 is formed to have the wide width $W_{13}$ in the area $R_{12}$, where each inner side fluid flow path part 25 has a narrow width, and has the width Wiz narrower than the width $W_{13}$ in the areas $R_{11}$ and $R_{13}$ adjacent to the area $R_{12}$. This makes it possible to form the difference in the projecting amounts of the projecting parts 6 according to areas, which will be described later.

On the contrary, each vapor flow path groove 26 preferably has a depth, shown by $D_5$ in FIGS. 19 and 20, of at most 300 μm, which may be at most 200 μm, and may be at most 100 μm. In contrast, this depth $D_5$ is preferably at least 10 μm, and may be at least 25 μm, and may be at least 50 μm. The range of this depth $D_5$ may be defined by the combination of any one of the foregoing plural candidate values for the upper limit, and any one of the foregoing plural candidate values for the lower limit. The range of the depth $D_5$ may be also defined by the combination of any two of the plural candidate values for the upper limit, or the combination of any two of the plural candidate values for the lower limit.

Each vapor flow path groove 16 of the first sheet 10 may have the same width as, or a larger or smaller width than each vapor flow path groove 26 of the second sheet 20.

Here, the vapor flow path grooves 26 are preferably formed so that each vapor flow path 4 has a flat shape such that the width thereof is larger than the height (size in the thickness direction) thereof when combined with the first sheet 10 to form the vapor flow paths 4 as described later. Therefore, the aspect ratio that is represented by a value obtained by dividing $W_{13}$ by $D_5$ can be at least 4.0, and further may be at least 8.0.

In the present embodiment, each vapor flow path groove 26 has a semi-elliptical cross-sectional shape. The cross-sectional shape may be a quadrangle such as a square, a rectangle, and a trapezoid, a triangle, a semicircle, a circle at the bottom portion, a semi-ellipse at the bottom portion, or any combination of some of them.

The vapor flow path communicating grooves 27 are grooves that allow a plurality of the vapor flow path grooves 26 to communicate with each other. This leads to achievement of equality of a vapor in a plurality of the vapor flow paths 4, and makes it possible to transport a vapor into a wider area, to efficiently use a lot of the condensate flow paths 3, which make it possible to smoothly reflux a working fluid.

As can be seen in FIGS. 18 and 21, the vapor flow path communicating grooves 27 in the present embodiment are formed between the peripheral fluid flow path part 24, and both end portions of the inner side fluid flow path parts 25 in the extending direction thereof and both end portions of the vapor flow path grooves 26 in the extending direction thereof. FIG. 21 shows a cross section of the vapor flow path communicating groove 27 which is orthogonal to the communicating direction thereof.

Each vapor flow path communicating groove 27 has a width, shown by $W_{14}$ in FIGS. 18 and 21, not particularly limited. The width may be the same as or different from the width $W_7$ of each vapor flow path communicating groove 17 of the first sheet 10.

When the widths $W_{14}$ and $W_7$ are formed to have different magnitudes, steps are formed in the flow paths formed of the vapor flow path communicating grooves 17 and the vapor flow path communicating grooves 27. A capillary force derived from this promotes movement of a condensate, which makes it possible to more smoothly reflux a working fluid.

The range of the magnitude of the width $W_{14}$ can be considered the same as the width $W_7$. The range of the depth of each vapor flow path communicating groove 27, which is shown by $D_6$ in FIG. 21, can be considered the same as the depth $D_4$ of each vapor flow path communicating groove 17 of the first sheet 10 as well.

In the present embodiment, each vapor flow path communicating groove 27 has a semi-elliptical cross-sectional shape. The present invention is not limited to this. The cross-sectional shape may be a quadrangle such as a square, a rectangle, and a trapezoid, a triangle, a semicircle, a circle at the bottom portion, a semi-ellipse at the bottom portion, or any combination of some of them.

Next, the structure when the first sheet 10 and the second sheet 20 are combined to form the vapor chamber 1 will be described. This description will make the arrangement, size, shape, etc. of each component that the first sheet 10 and the second sheet 20 have further understood.

Figure 25:
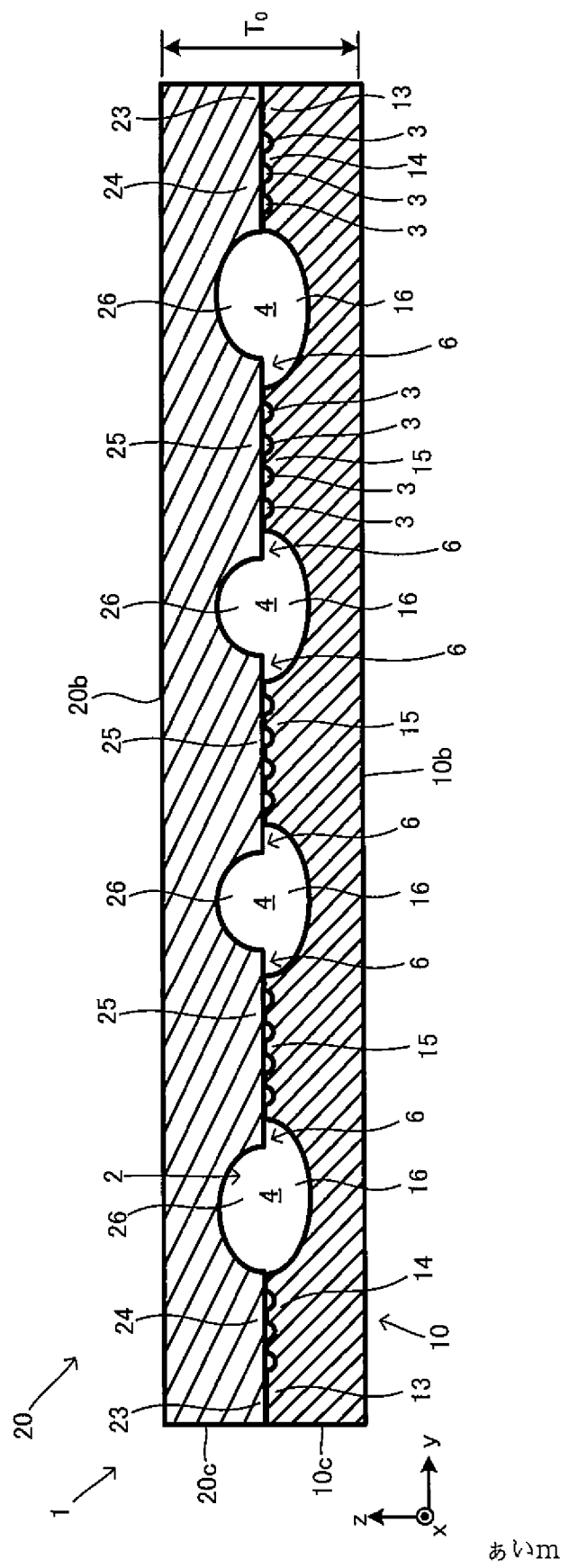
FIG. 25 shows a cross section of the vapor chamber 1.
Figure 26:
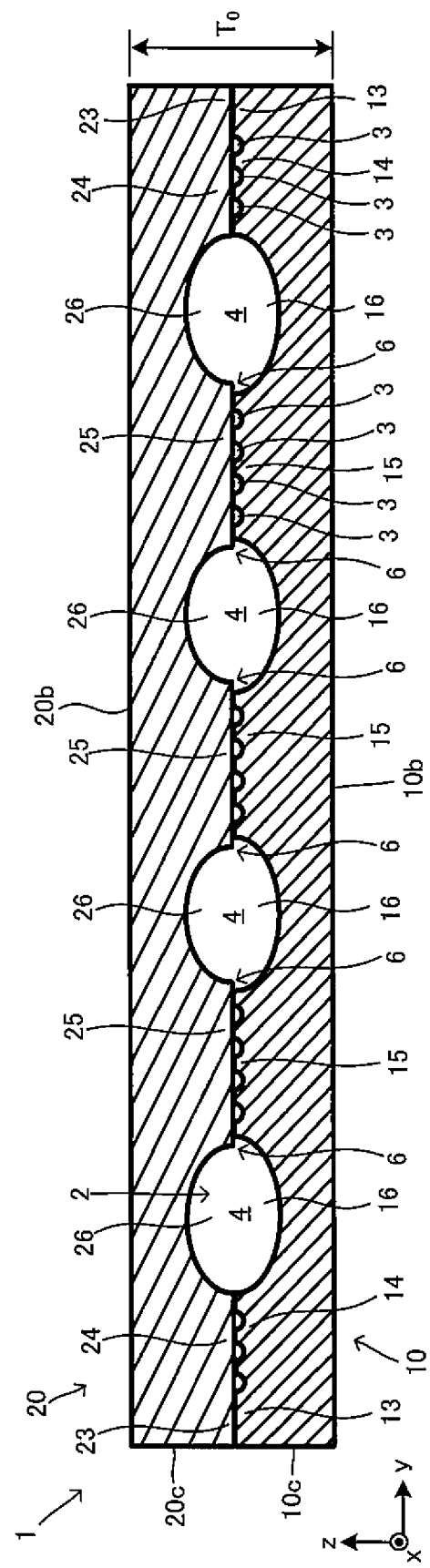
FIG. 26 shows a cross section of the vapor chamber 1.

FIG. 25 shows a cross section of the vapor chamber 1 taken along the direction y indicated by $I_9$-$I_9$ in FIG. 1 in the thickness direction, and FIG. 26 shows a cross section of the vapor chamber 1 taken along the direction y indicated by $I_{10}$-$I_{10}$ in FIG. 1 in the thickness direction. FIG. 25 shows a cross section in the area $R_1$ or $R_{11}$, or the area $R_3$ or $R_{13}$, and FIG. 26 shows a cross section in the area $R_2$ or $R_{12}$.

These drawings show cross sections of the vapor chamber 1 at portions in combination with the drawing of the portion in the first sheet 10 shown in FIG. 5, and the drawings of the portions in the second sheet 20 shown in FIGS. 19 and 20.

Figure 27:
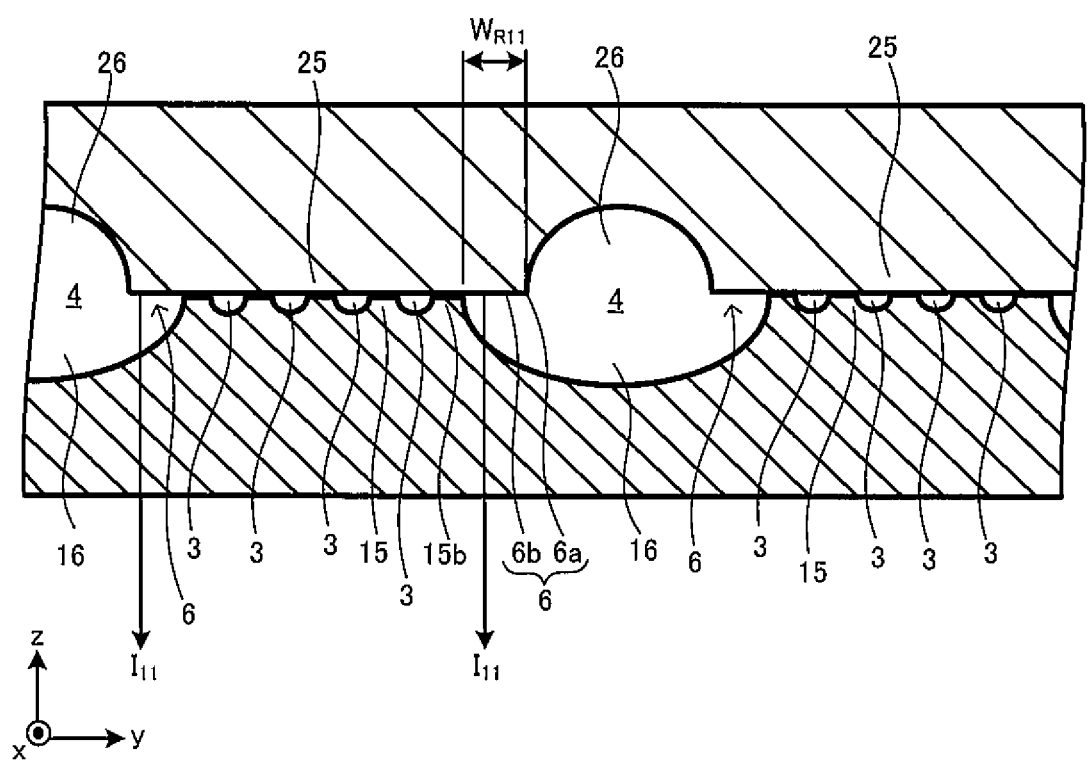
FIG. 27 is a partially enlarged view of FIG. 25.
Figure 28:
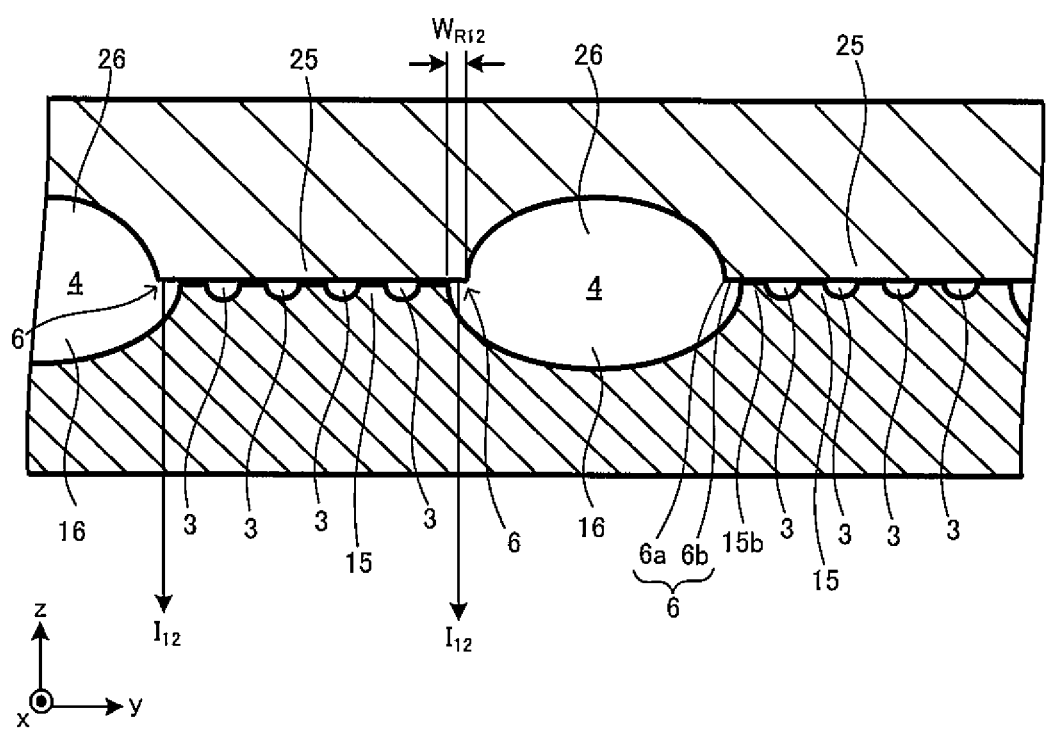
FIG. 28 is a partially enlarged view of FIG. 26.

FIG. 27 shows a partially enlarged view of FIG. 25, and FIG. 28 shows a partially enlarged view of FIG. 26.

Figure 29:
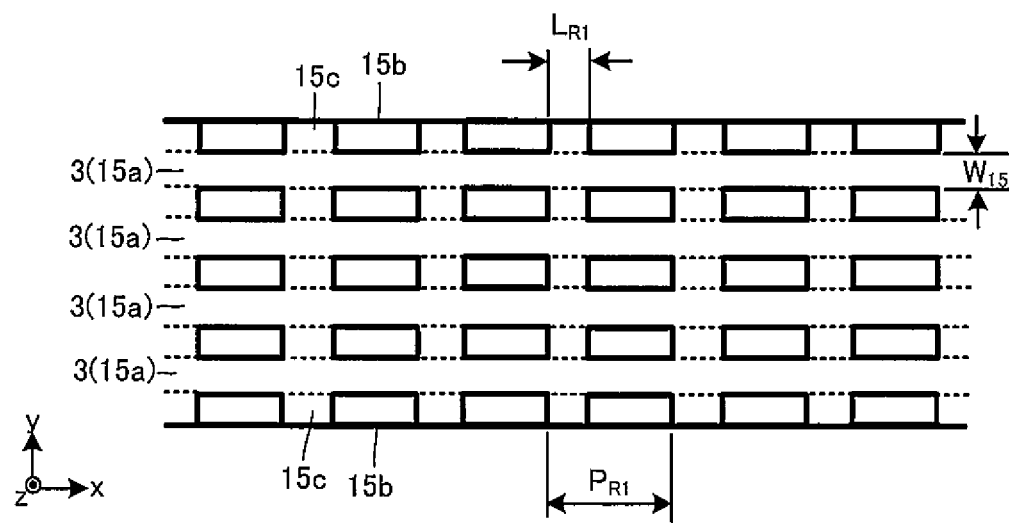
FIG. 29 is a partially enlarged plan view of condensate flow paths 3.
Figure 30:
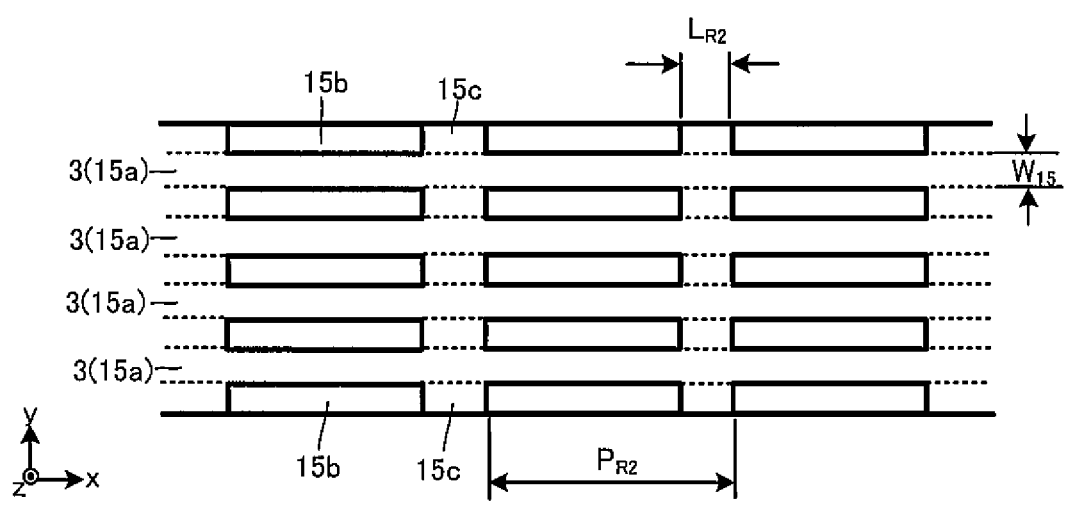
FIG. 30 is a partially enlarged plan view of the condensate flow paths 3.

FIG. 29 is a cross-sectional view taken along the arrows $I_{11}$-$I_{11}$ shown in FIG. 27, and FIG. 30 is a cross-sectional view taken along the arrows $I_{12}$-$I_{12}$ shown in FIG. 28.

Figure 31:
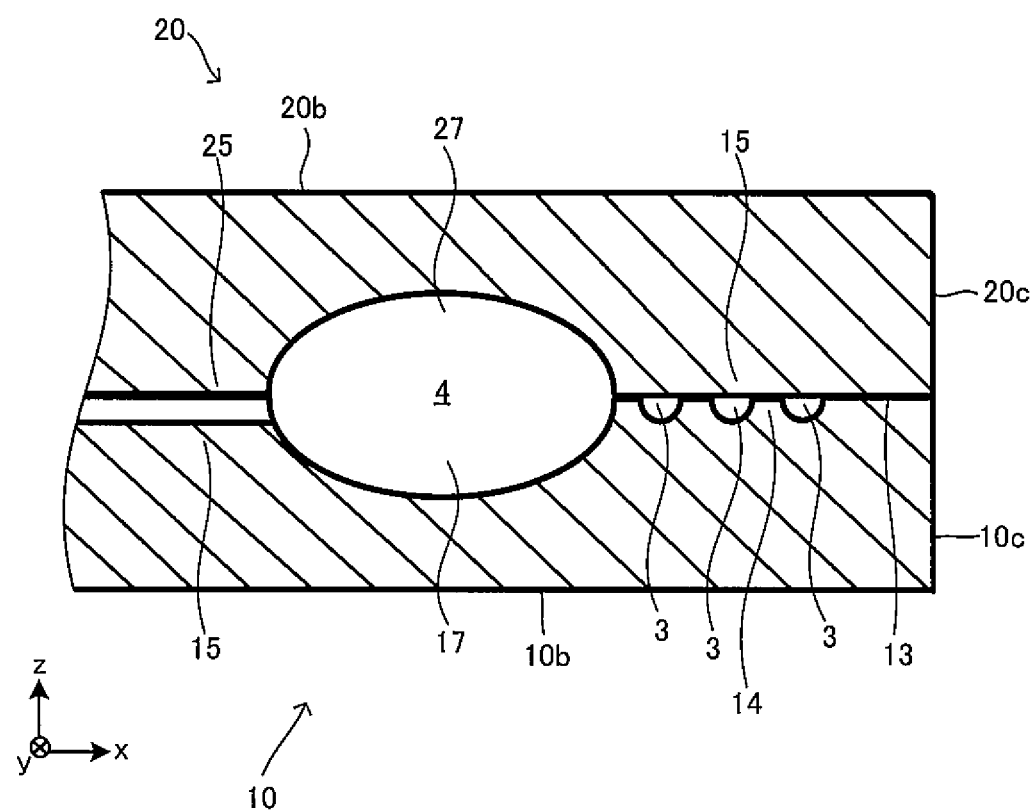
FIG. 31 shows a cross section taken along the line $I_{13}$-$I_{13}$ in FIG. 1.

FIG. 31 shows a cross section of the vapor chamber 1 taken along the direction x indicated by $I_{13}$-$I_{13}$ in FIG. 1 in the thickness direction. This drawing shows a cross section of the vapor chamber 1 at a portion in combination with the drawing of this portion in the first sheet 10 shown in FIG. 7, and the drawing of this portion in the second sheet 20 shown in FIG. 21.

As can be seen in FIGS. 1, 2, and 25 to 31, the first sheet 10 and the second sheet 20 are arranged so as to be superposed, and bonded to each other, to be the vapor chamber 1. At this time, the inner face 10a of the first sheet 10 and the inner face 20a of the second sheet 20 are arranged so as to face each other, the main body 11 of the first sheet 10 and the main body 21 of the second sheet are superposed, and the inlet 12 of the first sheet 10 and the inlet 22 of the second sheet 20 are superposed. In the present embodiment, the first sheet 10 and the second sheet 20 are formed so that the relative positional relationship thereof is suitably established by positioning the holes 13a of the first sheet 10 and the holes 23a of the second sheet 20.

In the present embodiment, a laminate of the first sheet 10 and the second sheet 20 is accompanied with arrangement of each component included in the main body 11 and the main body 21 as shown in FIGS. 25 to 31. This is specifically as follows.

The peripheral bonding part 13 of the first sheet 10 and the peripheral bonding part 23 of the second sheet 20 are arranged so as to be superposed, and are bonded to each other by a bonding means such as diffusion bonding and brazing. This leads to formation of the enclosure 2 between the first sheet 10 and the second sheet 20.

The effect of the vapor chamber 1 in the present embodiment is large especially when the vapor chamber 1 is thin. In such a view, the vapor chamber 1 can have a thickness, shown by $T_0$ in FIGS. 1, 25 and 26 of at most 1 mm, which may be at most 0.3 mm, and further may be at most 0.2 mm. The thickness equal to or less than 0.3 mm can make the case where the vapor chamber 1 can be installed in an electronic device without any processing for forming a space where the vapor chamber is arranged in the electronic device, often. The present embodiment makes it possible for such a thin vapor chamber to smoothly reflux a working fluid.

The peripheral fluid flow path part 14 of the first sheet 10 and the peripheral fluid flow path part 24 of the second sheet 20 are arranged so as to be superposed. This leads to formation of the condensate flow paths 3, which are the second flow paths where a condensate that is a working fluid in a condensing and liquifying state flows, by the fluid flow path grooves 14a of the peripheral fluid flow path part 14, and the peripheral fluid flow path part 24.

Likewise, the inner side fluid flow path parts 15 of the first sheet 10, which are protrusions, and the inner side fluid flow path parts 25 of the second sheet 20, which are protrusions, are arranged so as to be superposed. This leads to formation of the condensate flow paths 3, which are the second flow paths where a condensate flows, by the fluid flow path grooves 15a of the inner side fluid flow path parts 15, and the inner side fluid flow path parts 25.

Figure 39:
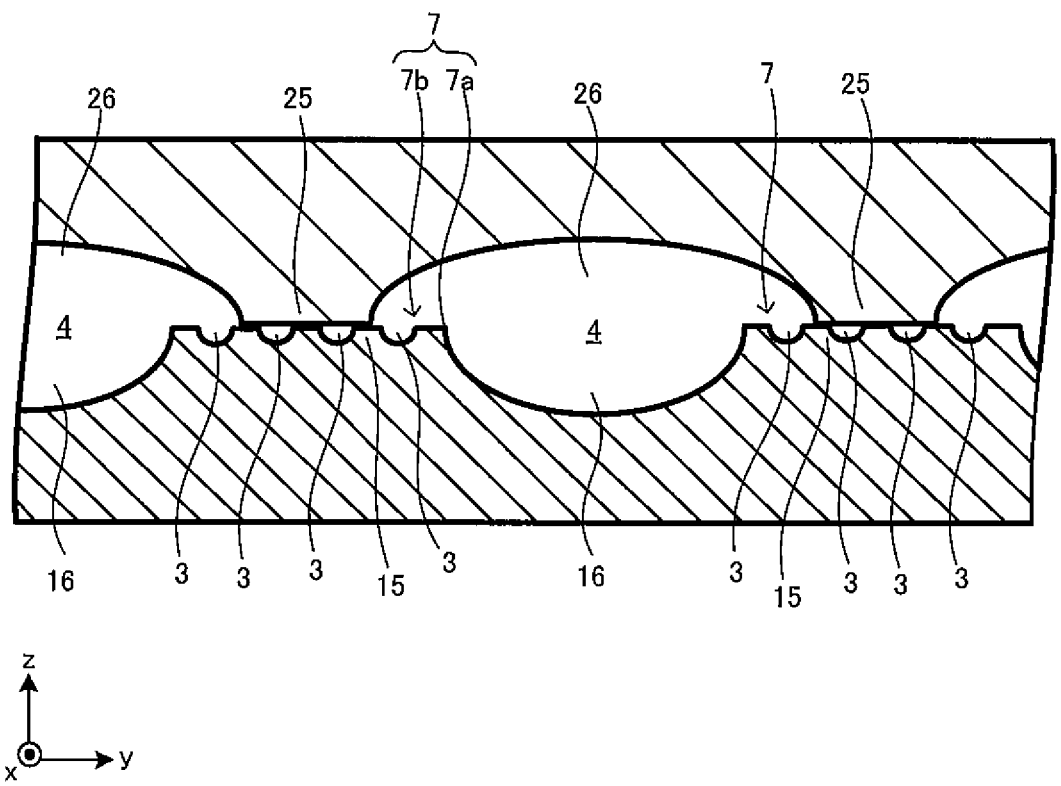
FIG. 39 shows a partially enlarged cross section of a vapor chamber according to a modification.

The communicating opening parts 14c and the communicating opening parts 15c are formed in the condensate flow paths 3 (see FIGS. 29 and 39). This allows a plurality of the condensate flow paths 3 communicate with each other, to achieve equality of a condensate, to efficiently move the condensate. The communicating opening parts 14c and the communicating opening parts 15c which are adjacent to the vapor flow paths 4, and allow the vapor flow paths 4 and the condensate flow paths 3 to communicate with each other allow a condensate generated in the vapor flow paths 4 to smoothly move to the condensate flow paths 3.

The communicating opening parts 15c have the following structure. In the present embodiment, the structure of the condensate flow paths 3, which are the second flow paths by the inner side fluid flow path parts 15 and the inner side fluid flow path parts 25 will be described. The same structure may be applied to the condensate flow paths 3 by the peripheral fluid flow path part 14 and the peripheral fluid flow path part 24.

Here, in the present embodiment, when the communicating opening parts 15c are divided into a plurality of the areas $R_1$, $R_2$ and $R_3$ in the extending direction of the vapor flow paths so that each area includes a plurality of the communicating opening parts 15c aligning in the direction along the vapor flow paths, the pitch for the communicating opening parts 15c in the area $R_2$, which is one area, is formed larger than the pitch for the communicating opening parts 15c in the areas $R_1$ and $R_3$, which are areas both adjacent to the area $R_2$.

In the present embodiment, as can be also seen in the comparison of FIGS. 29 and 30, the pitch $P_{R2}$ for the communicating opening parts 15c in the area $R_2$, which is shown in FIG. 30, is formed so as to be larger than the pitch $P_{R1}$ for the communicating opening parts 15c in the areas $R_1$ and $R_3$, which is shown in FIG. 19.

That is, the pitch for the communicating opening parts in an area (area $R_2$) where the pitch for the communicating opening parts is long is formed so as to be larger than that in areas (areas $R_1$ and $R_3$) both adjacent to the foregoing area.

This leads to a smaller contacting area of a working fluid and the first sheet, and a smaller contacting area of a vapor and a condensate in an area (area $R_2$) where the pitch for the communicating opening parts is long than in areas (areas $R_1$ and $R_3$) adjacent to the area $R_2$, which makes it difficult for a working fluid to condense and evaporate. Therefore, for example, when the area $R_1$ is set as an evaporating part (heat receiving part) where a heat source is arranged, a vapor is difficult to condense in the area $R_2$, which makes it possible to move the vapor from the heat source to the separated area $R_3$ without any block on the vapor flow paths such as clogging. For example, when the area $R_1$ is set as an evaporating part (heat receiving part, portion where a heat source is arranged), it can be prevented that a working fluid evaporates in the area $R_2$ and a condensate runs short in the area $R_1$, which is the evaporating part.

At the same time, each condensate flow path has a longer distance where a capillary force operates in the area $R_2$ than in areas (areas $R_1$ and $R_3$) adjacent to the area $R_2$, which can promote transport of a condensate.

This makes it possible for a working fluid to smoothly reflux, to improve a heat transport capability.

In the present embodiment, the pitch ($P_{R1}$) for the communicating opening parts in the areas $R_1$ and $R_3$ are the same. The present invention is not limited to this. The pitches for the communicating opening parts in the areas $R_1$ and $R_3$ may be different. In the present embodiment, the pitches for the communicating opening parts in the areas $R_1$ and $R_3$ have only to be smaller than the pitch for the communicating opening parts in the area $R_2$.

Here, each of the areas $R_1$, $R_2$ and $R_3$ has a size and a proportion that can be suitably set but not particularly limited. Each area is preferably formed to have a size suitable for the following: one of the areas $R_1$ and $R_3$ is set as an evaporating part (heat receiving part, portion where a heat source to be cooled is arranged), the other thereof is set as a cooling part, and the area $R_2$ therebetween is regarded as a transport part.

Thus, an area (one of the areas $R_1$ and $R_3$) set as an evaporating part is formed to have a size equal to or larger than a heat source to be cooled, and the area (the other of the areas $R_1$ and $R_3$) set as a cooling part can be formed to have the same size as the area set as the evaporating part.

In the present embodiment, the example such that the pitch for the communicating opening parts is the same in one area is shown. The present invention is not limited to this, and may encompass such an embodiment that the pitches for the communicating opening parts may be different in one area. In this case, one inner side fluid flow path part 15 is considered to be divided into three areas over the total length, and for each area, the average value of the pitches for the communicating opening parts adjacent to the vapor flow path grooves is calculated: the inner side fluid flow path part 15 has only to be formed so that the average value of the pitches for the communicating opening parts in the central area is larger than that in each area on both sides. Here, one may consider the division into three areas as three-equal division.

Each communicating opening part 15c has lengths, shown by $L_{R1}$ and $L_{R2}$ in FIGS. 29 and 30, not particularly limited in the condensate flow paths 3, and the range of this length can be considered the same as the foregoing $L_1$ (also see FIGS. 14 and 15). This can offer the magnitude of a capillary force of the condensate flow paths 3, and a communicating function of the communicating opening parts 15c in a well-balanced manner.

From the same point of view, the ratio of the opening length which is obtained by dividing $L_{R1}$ by $P_{R1}$, and the ratio of the opening length which is obtained by dividing $L_{R2}$ by $P_{R2}$ can be 0.2 to 1.0.

The proportion of the pitches between the areas which is obtained by dividing $P_{R2}$ by $P_{R1}$ can be 1.3 to 2.5.

In the present embodiment, the example such that division into three areas is considered is shown. For this, such a case can be assumed that one of the areas arranged on both sides is set as an evaporating part (heat receiving part), and the other is set as a cooling part as described above. In contrast, as explanatorily shown in FIG. 16, one may also consider division into five areas. According to this, the communicating opening parts are divided into the areas $R_1'$ to $R_5'$, and are formed so that: the average value of the pitches for the communicating opening parts included in the central area $R_3'$, and the areas $R_1'$ and $R_5'$, which are on both sides, is smaller than that included in the area $R_2'$, which is between the areas $R_1'$ and $R_3'$, and the area $R_4'$, which is between the areas $R_3'$ and $R_5'$. Here, one may consider the division into five areas as five-equal division.

In this case, it is assumed that the central area $R_3'$ is set as an evaporating part (heat receiving part) and a heat source to be cooled is arranged therein, and the areas $R_1'$ and $R_5'$ on both sides are set as cooling parts.

That is, in the vapor chamber 1, the pitches for a plurality of the communicating opening parts are different in the extending direction of the vapor flow paths. In addition, the pitch for the communicating opening parts in one area is formed larger than that in areas both adjacent to the one area.

Each condensate flow path 3 can be considered to have a width, shown by $W_{15}$ in FIGS. 29 and 30, within the same range based on the groove width shown by $W_5$ in FIGS. 14 and 15. Each condensate flow path 3 can be also considered to have a height within the same similarly based on the depth of each groove shown by $D_2$ in FIG. 13 in the present embodiment. This makes it possible to sufficiently bring about a capillary force of the condensate flow paths necessary for reflux.

In the present embodiment, the fluid flow path grooves 15a are disposed only on the inner side fluid flow path part 15 side. The present invention is not limited to this. The fluid flow path grooves may be also disposed on the inner side fluid flow path parts of the second sheet, and may be superposed on the fluid flow path grooves 15a to form the condensate flow paths. In this case, the depth of the fluid flow path grooves of the first sheet, and the depth of the fluid flow path grooves of the second sheet in total are the height of the condensate flow paths.

In view of bringing about a greater capillary force of the flow paths, the cross section of each condensate flow path preferably has an aspect ratio larger than 1.0, or smaller than 1.0. The aspect ratio is represented by a value obtained by dividing the flow path width by the flow path height. Among them, in view of production, the flow path width is preferably larger than the flow path height. The value obtained by dividing the flow path width by the flow path height can be more than 1.0 and at most 4.0, and can be more than 1.3.

The range of the pitch for adjacent condensate flow paths 3 among a plurality of the condensate flow paths 3 can be considered the same based on $P_3$ shown in FIGS. 14 and 15. This makes it possible to increase the density of the condensate flow paths, and at the same time to suppress the flow paths deforming to crush in bonding or assembling.

Each of the thickness of a material portion of the first sheet and the thickness of a material portion of the second sheet in a portion where the condensate flow paths are formed (that is, each thickness of the first sheet and the second sheet which is left by subtraction of the height $D_2$ from the thickness of the vapor chamber in the portion of the condensate flow paths 3) is preferably at least the height $D_2$ of the condensate flow paths. This makes it possible to sufficiently secure the thickness of the material of the first sheet and that of the second sheet, for the height $D_2$ of the condensate flow paths, which makes it possible to further prevent the vapor chamber from rupturing (breaking) due to the condensate flow paths 3.

Figure 32:
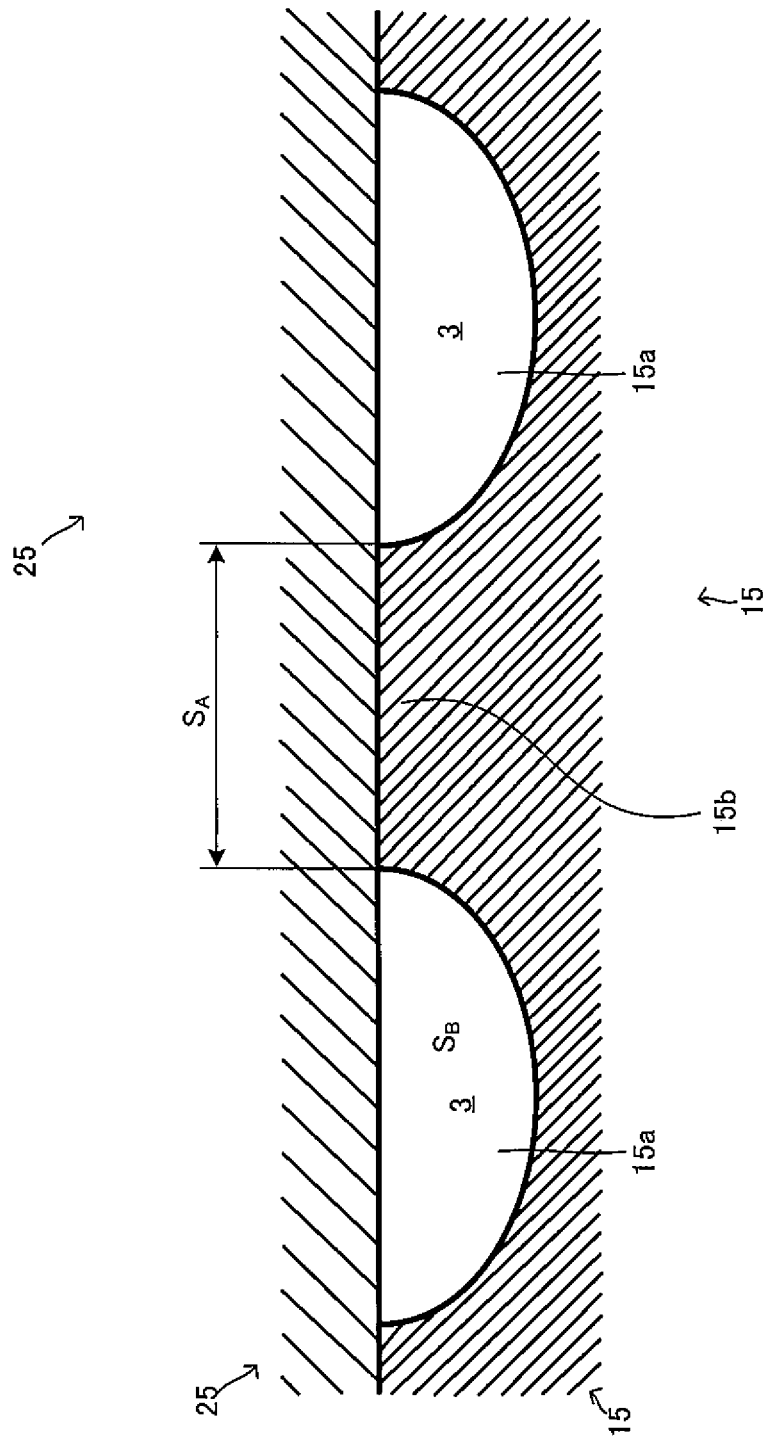
FIG. 32 shows a cross section of a wall part 15b and two condensate flow paths 3.

As shown by an enlarged portion of the condensate flow paths 3 in FIG. 32, each wall part 15b preferably has a width $S_A$ (μm) smaller than the width of each condensate flow path 3. This is because a larger wall part 15b leads to a wider width of each communicating opening part 15c, and a longer distance between adjacent condensate flow paths 3, which may prevent a working fluid from smoothly communicating.

Each wall part 15b preferably has the width $S_A$ of at least 20 μm, which may be at least 30 μm, and may be at least 50 μm. Each wall part preferably has the width $S_A$ (μm) of at most 300 μm, which can be at most 200 μM, and may be at most 100 μm. This makes it possible to effectively use a limited internal space, to increase the numbers of the vapor flow paths and the condensate flow paths. The range of this width $S_A$ may be defined by the combination of any one of the foregoing plural candidate values for the upper limit, and any one of the foregoing plural candidate values for the lower limit. The range of the width $S_A$ may be also defined by the combination of any two of the plural candidate values for the upper limit, or the combination of any two of the plural candidate values for the lower limit.

In the relationship between the width $S_A$ (μm) of each wall part 15b, and a transverse cross sectional area $S_B$ (μm²) of each condensate flow path 3 adjacent to the wall part 15b (cross section in a direction orthogonal to the flowing direction (longitudinal direction of each flow path)), the value ($S_A/S_B$) obtained by dividing $S_A$ by $S_B$ may be within the range of 0.005 (μm$^{-1}$) and 0.04 (μm$^{-1}$).

Here, the width ($S_A$) of each wall part 15b is obtained as follows.

The vapor chamber is cut and polished, etc., so that a transverse cross section of two adjacent condensate flow paths and a wall therebetween are exposed. Then, this cross section is displayed using a high-powered microscope or SEM as magnified within the range of 50 to 200 times. The outline of each inner circumferential face of the two condensate flow paths is extracted from this magnified cross-section. The distance of a narrowest portion between the two extracted outlines is defined as the width of the wall.

On the contrary, the shape of the cross section of each flow path is recognized by the outlines obtained in the foregoing course. In the obtained outlines, the longest distance in the width direction (direction y) is defined as the flow path width $S_C$, and the longest distance in the thickness direction (direction z) is defined as the height $S_D$. The cross-sectional area of the flow path $S_B$ in each case is obtained as follows by the shape of the cross section of each condensate flow path based on the recognized outlines.

cross-sectional area of the flow path $S_B$ when the cross section of the flow path is a rectangle=$S_C \cdot S_D$ cross-sectional area of the flow path $S_B$ when the cross section of the flow path is a triangle=$S_C \cdot S_D/2$ cross-sectional area of the flow path $S_B$ when the cross section of the flow path is a semi-circle=$\pi \cdot S_C^2/8$ cross-sectional area of the flow path $S_B$ when the cross section of the flow path is a semi-ellipse=$\pi \cdot S_C \cdot S_D/4$ When the cross section of the flow path has a complex shape, the cross-sectional area of the flow path $S_B$ may be obtained by fractionalizing the cross section of the flow path into any of the foregoing basic shapes, and adding them.

This makes it possible to secure necessary condensate flow paths even if the vapor chamber is thinned, to obtain heat transport performance, and also allows the wall parts 15b to have sufficient strength against repeated freezing and melting of a working fluid, which leads to excellent durability.

Figure 33:
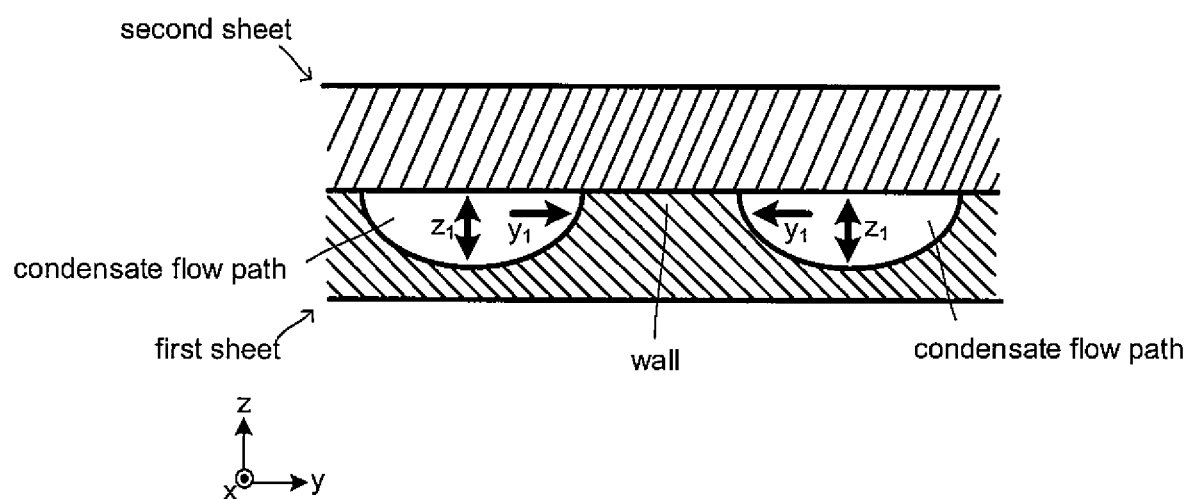
FIG. 33 explanatorily shows a concept of durability of the wall part.
Figure 34:
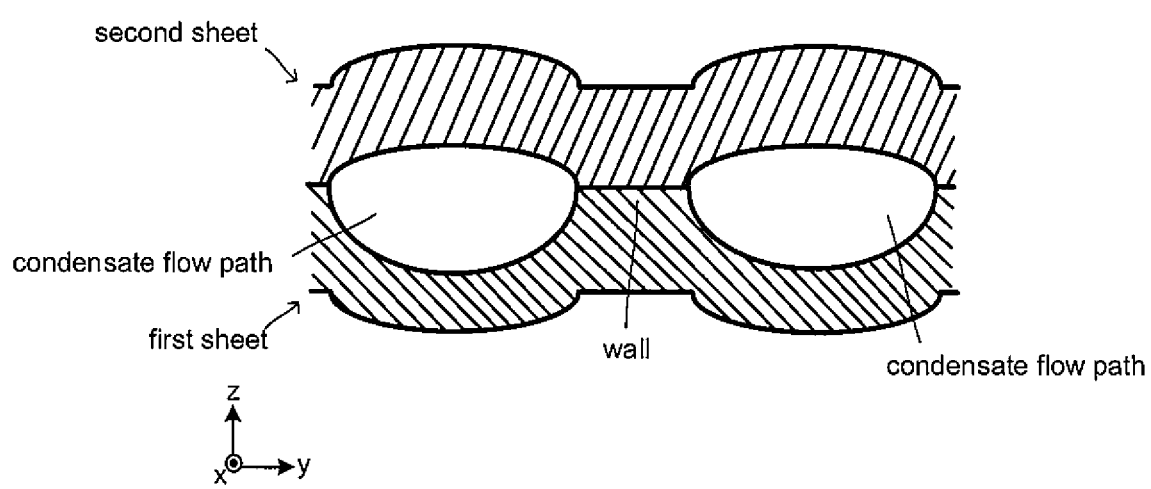
FIG. 34 explanatorily shows a concept of durability of the wall part.
Figure 35:
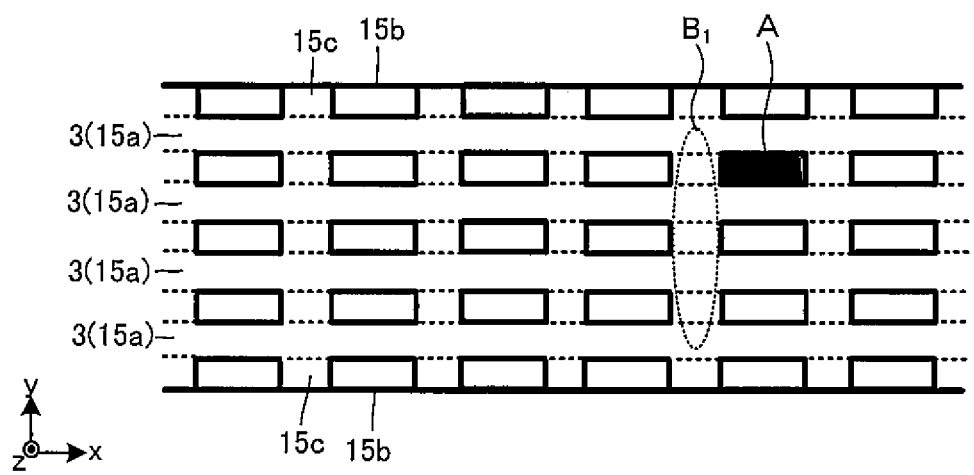
FIG. 35 explanatorily shows another example.

Here, the reason why the width of each wall for the cross-sectional area of the flow path is specified as described above when durability of the wall part is considered will be described. FIGS. 33 to 35 show explanatory views.

Attention is focused on the direction z (thickness direction) of the vapor chamber. When each material in the thickness direction of the condensate flow paths on both sides is enough thick with respect to the height of the condensate flow paths, the wall is damaged when the product of "tensile strength of the material (material properties)" and "cross-sectional area of the wall" is smaller than the product of "pressure generated in the direction z caused by the volume expansion in freezing" and "area of one wall part in all directions along the plane (area of the gray portion A shown in FIG. 35)". In this case, force in the direction z as indicated by the arrows $Z_1$ in FIG. 33 has only to be considered.

Actually however, pressure to be generated is not fixed because there is the process of repeated freezing and melting of a working fluid, and freezing and melting does not occur isotropically since the shape is not simple. A relatively soft material is applied to the material constituting the vapor chamber since high thermal conduction is required of the material, and plastic deformation gradually occurs thereto in repeated freezing and melting.

As a result of various combined reasons as described above, the wall part extends in the thickness direction, and receives force so as to be compressed in a tapering direction as indicated by the arrows $y_1$ in FIG. 33, to change its shape as shown in, exaggerated though, FIG. 34.

From the foregoing, when durability of the wall is considered, the cross section of the flow path as a whole has to be considered in view of not only the height of the condensate flow paths but also both the height, and the width direction thereof. Thus, the width of the wall is specified as described above.

Particularly, a portion shown by $B_1$ in FIG. 35 where the communicating opening parts 15c communicate with each other, and the communicating opening parts 15c and the condensate flow paths 3 communicate with each other has an advantage in view of heat transport due to distribution of a condensate etc. as described above. In contrast, when the vapor chamber does not operate, a condensate is easy to collect there, which makes there a portion where force such that the first sheet and the second sheet are apart from each other is applied when a working fluid expands due to freezing.

Satisfying the foregoing conditions leads to the wall parts 15b having a structure difficult to be broken even if force as described above is repeatedly applied thereto.

Figure 36:
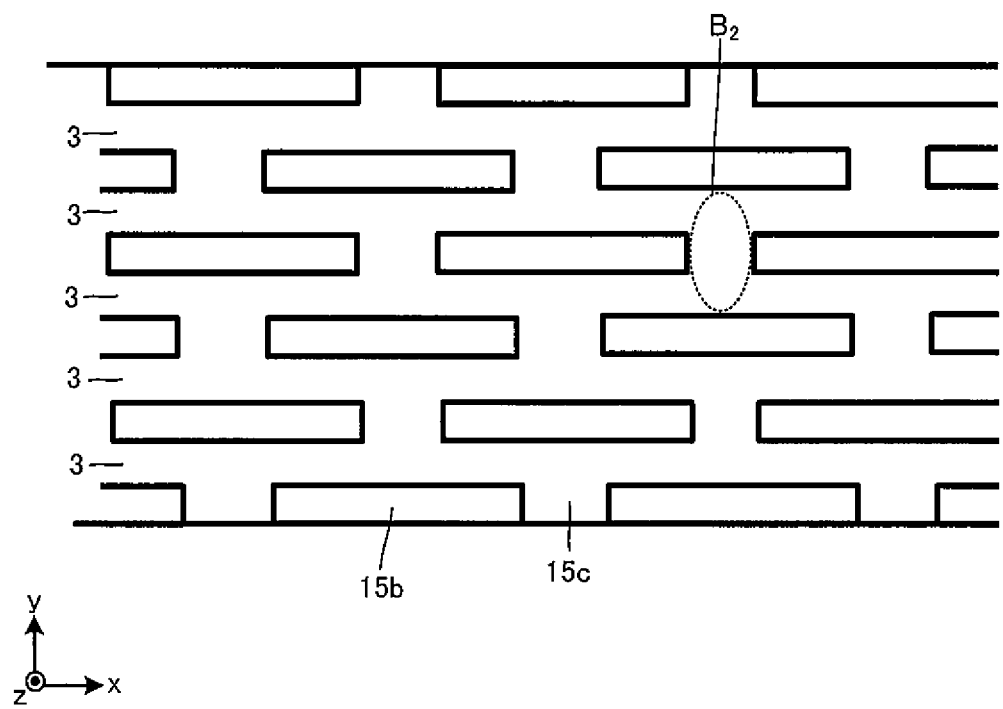
FIG. 36 explanatorily shows another example.
Figure 37:
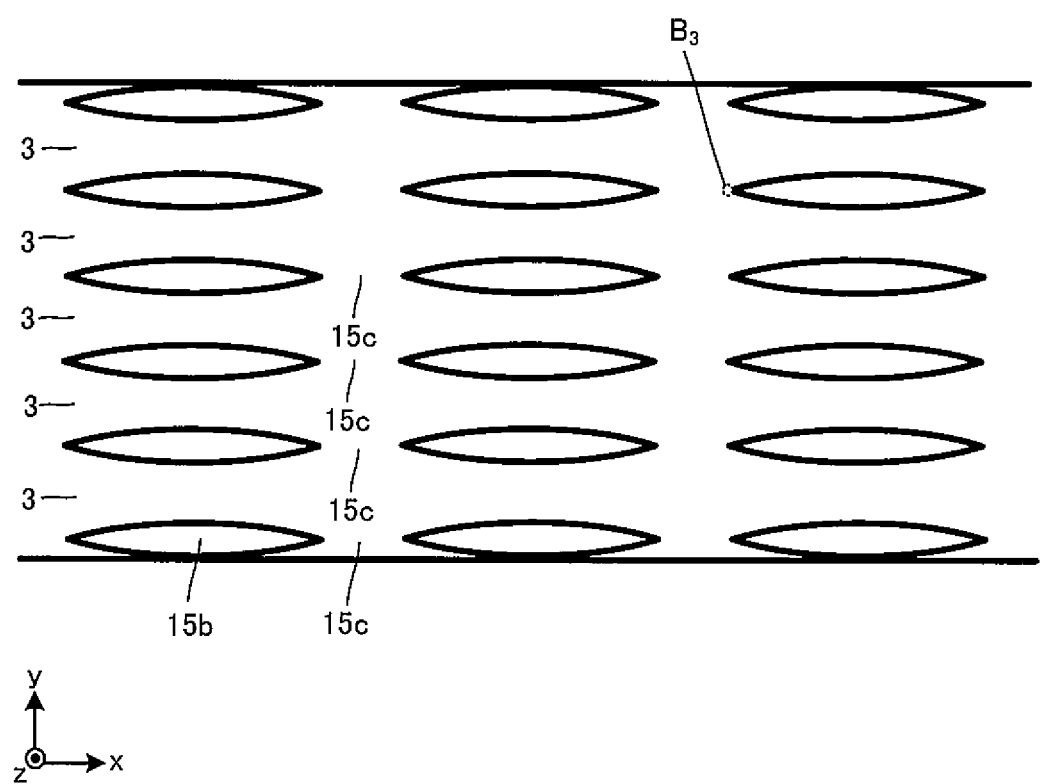
FIG. 37 explanatorily shows another example.
Figure 38:
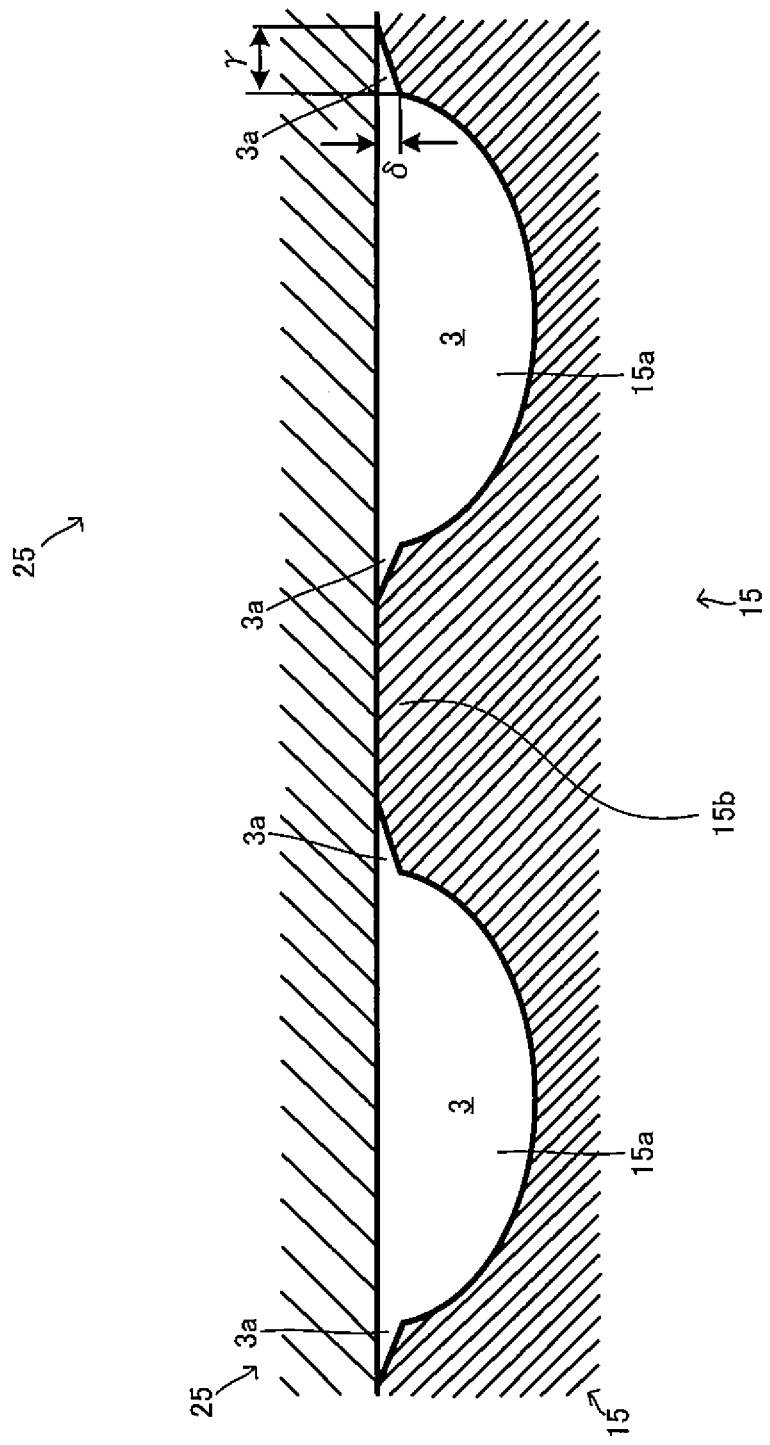
FIG. 38 explanatorily shows another example.

FIGS. 36 to 38 explanatorily show modifications.

FIG. 36 shows an example such that the communicating opening parts 15c disposed between adjacent wall parts 15b are arranged so that the positions thereof are different from each other in a longitudinal direction of the wall parts 15b (longitudinal direction of the condensate flow paths 3).

Such communicating opening parts 15c result in absence thereof on both sides at the same time for a working fluid flowing in the condensate flow paths 3 due to the walls: the wall part 15b exists at least on one side even if the communicating opening part 15 is present. Therefore, a capillary force can be continuously obtained in the longitudinal direction of the condensate flow paths 3 as well. This promotes movement of a condensate, which makes it possible to more smoothly reflux a working fluid.

In contrast, in this embodiment, a capillary force is greater around the communicating opening parts 15c as shown by $B_2$ in FIG. 36 than the example in FIG. 35. Thus, the amount of a collecting condensate increases when the vapor chamber does not operate. Then when the condensate freezes in this state and the volume thereof increases, a greater force operates in a direction so as to make the first sheet and the second sheet apart, to act in such a direction as to break the wall parts 15b. Having the foregoing structure leads to the wall parts 15b that are not broken even if freezing and melting of a condensate is repeated to repeatedly apply the foregoing force.

That is, even a thin vapor chamber to which the structure such that a heat transport capability is further improved is applied has excellent durability.

FIG. 37 shows an example such that each wall part 15b has the narrowest width at the end portions where the communicating opening parts 15c are formed in the longitudinal direction of the wall parts 15b (longitudinal direction of the condensate flow paths 3) like the example explained in FIGS. 9 to 11.

Since such communicating opening parts 15c make it easy for a working fluid to move between adjacent condensate flow paths 3 since the flow resistance against passage through the communicating opening parts 15c is suppressed, which promotes movement of a condensate, to more smoothly reflux the working fluid.

In contrast, in this embodiment, if a condensate collecting around the communicating opening parts 15c freezes and the volume thereof increases, and then force operates in such a direction as to make the first sheet and the second sheet apart, stress concentrates on thin end portions of the wall parts 15b as shown by $B_3$ in FIG. 37, which leads to a state where the wall parts 15b are easily broken.

Having the foregoing structure leads to the wall parts 15b that are not broken even if freezing and melting of a condensate is repeated to repeatedly apply the foregoing force.

That is, even a thin vapor chamber to which the structure such that a heat transport capability is further improved is applied has excellent durability.

Specific tests were done concerning rupturing of the vapor chamber due to repeated freezing and melting of a condensate. More detail thereof was as follows.

A vapor chamber of the following specification was prepared for Test Example 1. The basic structure thereof was according to the vapor chamber 1 shown in FIG. 1. More detail thereof was as follows.

material of the first sheet and the second sheet: oxygen free copper vapor flow path groove: 1 mm in width (direction y), 100 μm in height (direction z), 65 mm in length (direction x), the number was 6 inner side fluid flow path part: arranged alternately with vapor flow paths condensate flow path: 100 μm in width (direction y), 50 μm in height (direction z), 65 mm in length (direction x), the number was 8 wall part: 10 μm in width (direction y), the shape is the same as in FIG. 10 communicating opening part: 500 μm in pitch, 100 μm in length $S_A/S_B$: 0.0025 working fluid: water, the fill rate was 30% of the volume inside

A vapor chamber having the specification of the vapor chamber according to Test Example 1 except that each wall part has a width of 20 μm, and $S_A/S_B$ is 0.0051 was made for Test Example 2.

The vapor chambers according to Test Examples 1 and 2 were produced as follows.

The fluid flow path grooves, the vapor flow path grooves, and the vapor flow path communicating grooves were formed on each metal sheet having a thickness of 150 μm, and having outer circumferential shapes of the first sheet 10 and the second sheet 20 respectively, by half etching. Half etching is to remove a material by etching in the middle in the thickness direction as not penetrating in the thickness direction, to form grooves and/or recesses.

Next, the inner faces of the first sheet and the second sheet were superposed so as to face each other, and tentatively fixed by resistance welding. After the tentative fixation, the first sheet and the second sheet were permanently bonded to each other by diffusion bonding. Diffusion bonding was such that the first sheet and the second sheet were heated to 810° C., and a pressure of 2 MPa was loaded thereto.

After the bonding, the enclosure was evacuated via a formed inlet flow path, the pressure thereinside was reduced, and a working fluid was poured via the inlet flow path, to be put inside the enclosure. After the inlet was caulked, the inlet flow path was closed by TEG welding.

The heat cycle test was done as follows for the vapor chambers obtained as described above. The test conformed to the HS Standard C 60068-2-14: 2011 (IEC 60068-2-14: 2009), and was done for the case where the vapor chambers are horizontally disposed, and the case where the vapor chambers were vertically disposed: the conditions were −40° C. in low temperature, 85° C. in high temperature, 30 minutes in exposure time, and 100 times in the number of cycles.

As a result, while no rupturing occurred to the vapor chamber according to Test Example 2, rupturing occurred to the vapor chamber according to Test Example 1.

The foregoing width $S_A$, cross-sectional area $S_B$, and relationship therebetween independently bring about effect irrelevantly to the structure such that the pitches for the communicating opening parts are different according to areas, and the structure such that the projecting amounts are different according to areas, which are the other aspects the vapor chamber in the present embodiment encompasses.

Therefore, for example, the foregoing width $S_A$, cross-sectional area $S_B$, and relationship therebetween bring about effect to all the vapor chambers having an aspect such that the pitch for the communicating opening parts is the same in all the areas but the projecting amounts are different according to the areas, an aspect such that the pitches for the communicating opening parts are different according to areas but the projecting amount is the same in all the areas, and an aspect such that the pitch for the communicating opening parts and the projecting amount are the same respectively in all the areas. This is also applied to the following other embodiments.

FIG. 38 shows an example such that micro inner face grooves 3a are formed on flow path faces (surfaces of the wall parts 15b) of the condensate flow paths 3.

Such condensate flow paths 3 lead to entry of a condensate into the micro inner face grooves 3a, and reception of a great capillary force, which makes it easy to move the condensate, to promote movement of the condensate, which makes it possible for a working fluid to more smoothly reflux.

In contrast, when the vapor chamber does not operate, a condensate is easy to collect in the micro inner face grooves 3a due to a great capillary force. If this condensate freezes and the volume thereof increases, the capillary force acts as force to widen and break the inner face grooves 3a.

Having the foregoing structure leads to the wall parts 15b that are not broken even if freezing and melting of a condensate is repeated to repeatedly apply force.

That is, even a thin vapor chamber to which the structure such that a heat transport capability is further improved is applied has excellent durability.

Each of these inner face grooves 3a has a cross-sectional shape and a cross-sectional area not particularly limited, and has only to be a groove disposed on the inner faces of the condensate flow paths 3. Preferably, the longitudinal direction of the inner face grooves encompasses a component of a direction parallel to the extending direction of the condensate flow paths 3, and the inner face grooves extend in the longitudinal direction at least twice as long as the opening width δ thereof. This brings about more significant effect as grooves to improve a capillary force.

Each inner face groove 3a can have the opening width δ less than 10 μm. This makes it possible to secure a great capillary force. The inner face grooves can have a depth γ less than 10 μm.

The openings of the vapor flow path grooves 16 of the first sheet 10, and the openings of the vapor flow path grooves 26 of the second sheet 20 are superposed so as to face each other, to form the flow paths, which become the vapor flow paths 4, which are the first flow paths where a vapor flows.

Here, the vapor flow paths, which are the first flow paths, and the condensate flow paths, which are the second flow paths, have the following relationship. That is, when the average cross-sectional area of adjacent two first flow paths is $A_g$, and the average cross-sectional area of a plurality of the second flow paths arranged between the adjacent two first flow paths is $A_l$, the second flow paths and the first flow paths have the relationship such that $A_l$ is at most 0.5 times, preferably at most 0.25 times, as much as $A_g$. This relationship may be satisfied by at least part of the entire vapor chamber. Satisfying the relationship by the entire vapor chamber is further preferable.

As can be seen in FIGS. 25 to 28, the projecting parts 6, which are the steps, are formed on a transverse cross section of the vapor flow paths 4 (cross sections of the flow paths in a direction orthogonal to the extending direction of the flow paths) in relation to the width of each inner side fluid flow path part 15 and the width of each vapor flow path groove 16 of the first sheet 10, and the width of each inner side fluid flow path part 25 and the width of each vapor flow path groove 26 of the second sheet 20. This makes it possible to improve a capillary force to smoothly move a condensate to the condensate flow paths 3.

The projecting parts 6 are portions formed on the boundary surfaces with the vapor flow paths 4, and form portions projecting on the vapor flow paths 4 side. That is, the projecting parts are portions that stick out on the vapor flow paths side in the aligning direction of the condensate flow paths 3 and the vapor flow paths 4 (direction y, width direction), and include projecting faces that are faces extending from the apexes, which are the points of portions of the narrowest width of the vapor flow paths, to portions of the widest width thereof. The projecting faces are formed so as to extend in the direction of the condensate flow paths, and connected to or include the wall parts. Specifically, in the present embodiment, each projecting part 6 has an apex 6a that is the point of a portion of the narrowest width of the vapor flow path, and the projecting face 6b extending in the direction y, and is connected to the wall part 15b at an end portion of the projecting face 6b, where the vapor flow path has the widest width.

The size of each projecting part is, for example, as shown by $W_{R12}$ in FIG. 27, the size of each projecting face 6b in the width direction.

Here, as can be seen in the comparison between FIGS. 25 and 26, and the comparison between FIGS. 27 and 28, each projecting part 6 of the vapor flow paths 4 in the area $R_{12}$ shown by $W_{R12}$ in FIG. 28 is formed so as to have a size (projecting amount) smaller than that in each of the areas $R_{11}$ and $R_{13}$ shown by $W_{R11}$ in FIG. 27. That is, in plural divided areas in the extending direction of the vapor flow paths 4, each projecting part in one area is formed so as to have a projecting amount smaller than that in areas both adjacent to this one area.

This leads to a smaller projecting amount of each projecting part 6 in an area where the projecting amount of each projecting part 6 is small than that in areas adjacent to the foregoing area where the projecting amount is large (areas $R_{11}$ and $R_{13}$), which leads to a small contacting area of a working fluid and the second sheet, and a small contacting area of a vapor and a condensate, which makes it difficult for the working fluid to condense and evaporate. Thus, for example, when the area $R_{11}$ is set as an evaporating part (heat receiving part) where a heat source is arranged, it is prevented that a vapor condenses in the area $R_{12}$, which is adjacent to the area $R_{11}$, to block the flow paths, which makes it possible to move the vapor from the heat source to the separated area $R_{13}$. For example, when the area $R_{11}$ is set as an evaporating part (heat receiving part, portion where a heat source is arranged), it can be prevented that a working fluid evaporates in the area $R_{12}$ and a condensate runs short in the area $R_{11}$, which is the evaporating part.

The foregoing makes it possible to smoothly reflux a working fluid, to improve a heat transport capability.

In the present embodiment, each projecting part 6 has the same projecting amount in the areas $R_{11}$ and $R_{13}$. The present invention is not limited to this. The projecting parts 6 may have different projecting amounts between the areas $R_{11}$ and $R_{13}$. In the present embodiment, each projecting part 6 has only to have the projecting amount larger in the areas $R_{11}$ and $R_{13}$ than that in the area $R_{12}$.

Here, each of the areas $R_{11}$, $R_{12}$ and $R_{13}$ has a size and a proportion not particularly limited, but can be suitably set. Each area can be formed to have a size suitable for the following: one of the areas $R_{11}$ and $R_{13}$ is set as an evaporating part (heat receiving part, portion where a heat source is to be cooled is arranged), the other thereof is set as a cooling part, and the area $R_{12}$ therebetween is regarded as a transport part.

Thus, an area (one of the areas $R_{11}$ and $R_{13}$) set as an evaporating part is formed to have a size equal to or larger than a heat source to be cooled, and the area (the other of the areas $R_{11}$ and $R_{13}$) set as a cooling part can be formed to have the same size as the area set as the evaporating part.

In the present embodiment, the example such that each projecting part has a fixed projecting amount in one area is shown. The present invention is not limited to this, and may encompass such an embodiment that the projecting parts may have different projecting amounts but not fixed. In this case, one vapor flow path is considered to be divided into three areas over the total length, and for each area, the average value of the projecting amounts is calculated: the vapor flow path has only to be formed so that the average value of the projecting amounts in the central area is smaller than that in each area on both sides. Here, one may consider the division into three areas as three-equal division.

In the present embodiment, the example such that division into three areas is considered is shown. For this, such a case can be assumed that one of the areas arranged on both sides is set as an evaporating part (heat receiving part), and the other is set as a cooling part as described above. In contrast, as shown in FIGS. 23 and 24, one may also consider division into five areas. According to this, the vapor flow paths are divided into the areas $R_{11}'$ to $R_{15}'$, and are formed so that: the average value of the projecting amounts included in the central area $R_{13}'$, and the areas $R_{11}'$ and $R_{15}'$, which are on both sides, is larger than that of the projecting amounts included in the area $R_{12}'$, which is between the areas $R_{11}'$ and $R_{13}'$, and the area $R_{14}'$, which is between the areas $R_{13}'$ and $R_{15}'$. Here, one may consider the division into five areas as five-equal division.

In this case, it is assumed that the central area $R_{13}'$ is set as an evaporating part (heat receiving part) and a heat source to be cooled is arranged therein, and the areas $R_{11}'$ and $R_{15}'$ on both sides are set as a cooling part.

That is, in the vapor chamber 1, the projecting amounts are different in the extending direction of the vapor flow paths. In addition, the average value of the projecting amounts in one area is formed larger than that in areas both adjacent to the one area.

In the present embodiment, the area $R_1$, which is described in relation to the condensate flow paths 3, is formed to have the same length as the area $R_{11}$, which is described in relation to the vapor flow paths 4. Likewise, the area $R_2$ is formed to have the same length as the area $R_{12}$, and the area $R_3$ is formed to have the same length as the area $R_{13}$. This can synergistically bring about the effect due to the difference according to areas concerning the communicating opening parts 15c as described above, and the effect due to the difference according to areas concerning the projecting amounts of the projecting parts 6, which makes it possible to obtain higher effect.

The present invention is not limited to this. The areas $R_1$ and $R_{11}$, the areas $R_2$ and $R_{12}$, and the areas $R_3$ and $R_{13}$ may be individually set respectively without any correlation.

Since the vapor chamber to which only one of the difference in structure is applied can independently bring about effect, the vapor chamber may include only one of the structures, concerning the difference in structure according to areas concerning the communicating opening parts 15c as described above, and the difference in structure according to areas concerning the projecting amounts of the projecting parts 6.

That is, for example, the present invention may encompass a vapor chamber of such an embodiment that while the pitch for the communicating opening parts 15c is the same in all the areas, the projecting amounts are different between the areas as described above, or a vapor chamber of such an embodiment that while the pitches for the communicating opening parts 15c are different between the areas as described above, the projecting amount is the same in all the areas. This is also applied to the following other embodiments.

Each vapor flow path 4 has a width based on the vapor flow path grooves 16 and the vapor flow path grooves 26. The range of this width at the widest portion can be considered the same as described concerning $W_6$ (see FIG. 4).

Each vapor flow path 4 has a height based on the vapor flow path grooves 16 and the vapor flow path grooves 26 in total. The range of this height can be considered the same as $D_3$ (see FIG. 5) and $D_5$ (see FIGS. 19 and 20) in total.

Each of the projecting amounts $W_{R11}$ and $W_{R12}$ of the projecting parts 6 can have a magnitude within the range of 30 μm and 100 μm. The difference ($W_{R11}-W_{R12}$) in projecting amount between adjacent areas can be within the range of 20 μm and 50 μm.

Each vapor flow path 4 can have a flat cross-sectional shape as the vapor chamber 1 is thinned. This makes it possible to secure the surface areas of the flow paths even the vapor chamber 1 is thinned, which makes it possible to maintain a heat transport capability at a high level. More specifically, a transverse cross section of each vapor flow path 4 can have a ratio of at least 2.0, and may be at least 4.0: the ratio is represented by a value obtained by dividing the width at the widest portion by the height thereon.

In the present embodiment, each vapor flow path 4 has such a cross-sectional shape based on an ellipse that steps are formed of the projecting parts. The present invention is not limited to this. The cross-sectional shape may be based on a quadrangle such as a square, a rectangle, and a trapezoid, a triangle, a semicircle, a circle at the bottom portion, a semi-ellipse at the bottom portion, or any combination thereof.

As can be seen in FIG. 31, the openings of the vapor flow path communicating grooves 17 of the first sheet 10 and the openings of the vapor flow path communicating grooves 27 of the second sheet 20 are superposed so as to face each other, to form flow paths, which are the flow paths via which the vapor flow paths 4 communicate. These flow paths allow all the vapor flow paths to communicate with each other.

In contrast, the inlet 12 and the inlet 22 are superposed so that the inner face 10a and the inner face 20a thereof face each other as shown in FIG. 1, and the opening of the inlet groove 22a of the second sheet 20 which is on the opposite side of the bottom is closed by the inner face 10a of the inlet 12 of the first sheet 10, to form an inlet flow path 5 that allows the outside, and the enclosure 2 between the main body 11 and the main body 21 (condensate flow paths 3 and the vapor flow paths 4) to communicate with each other.

Since the inlet flow path 5 is closed after a working fluid is poured via the inlet flow path 5 to the enclosure 2, the outside and the enclosure 2 do not communicate with each other in the vapor chamber 1 in the final form.

A working fluid is sealed in the enclosure 2 of the vapor chamber 1. The type of the working fluid is not particularly limited. Any working fluid used for usual vapor chambers, such as pure water, ethanol, methanol and acetone can be used.

For example, the foregoing vapor chamber can be made as follows.

The fluid flow path grooves 14a, the fluid flow path grooves 15a, the vapor flow path grooves 16, the vapor flow path grooves 26, the vapor flow path communicating grooves 17, and the vapor flow path communicating grooves 27 are formed on each of metal sheets having outer circumferential shapes of the first sheet 10 and the second sheet 20 receptively by half etching. Here, half etching is to remove a material by etching in the middle in the thickness direction as not penetrating in the thickness direction, to form grooves and/or recesses.

Next, the inner face 10a of the first sheet 10 and the inner face 20a of the second sheet 20 are superposed so as to face each other, and positioned using the holes 13a and 23a as positioning means, to be tentatively fixed. The way of the tentative fixation is not particularly limited, but examples thereof include resistance welding, ultrasonic welding, and bonding with an adhesive.

After the tentative fixation, the first sheet 10 and the second sheet 20 are permanently bonded to each other by diffusion bonding. Instead of diffusion bonding, brazing may be used for the bonding.

After the bonding, the enclosure 2 is evacuated via the formed inlet flow path 5, and the pressure thereinside is reduced. Thereafter, the working fluid is poured to the enclosure 2, inside which the pressure was reduced, via the inlet flow path 5, to be put inside the enclosure 2. Then, the inlet flow path 5 is closed using laser welding or caulking on the inlets 12 and 22. This leads to secure retainment of the working fluid inside the enclosure 2.

Figure 40:
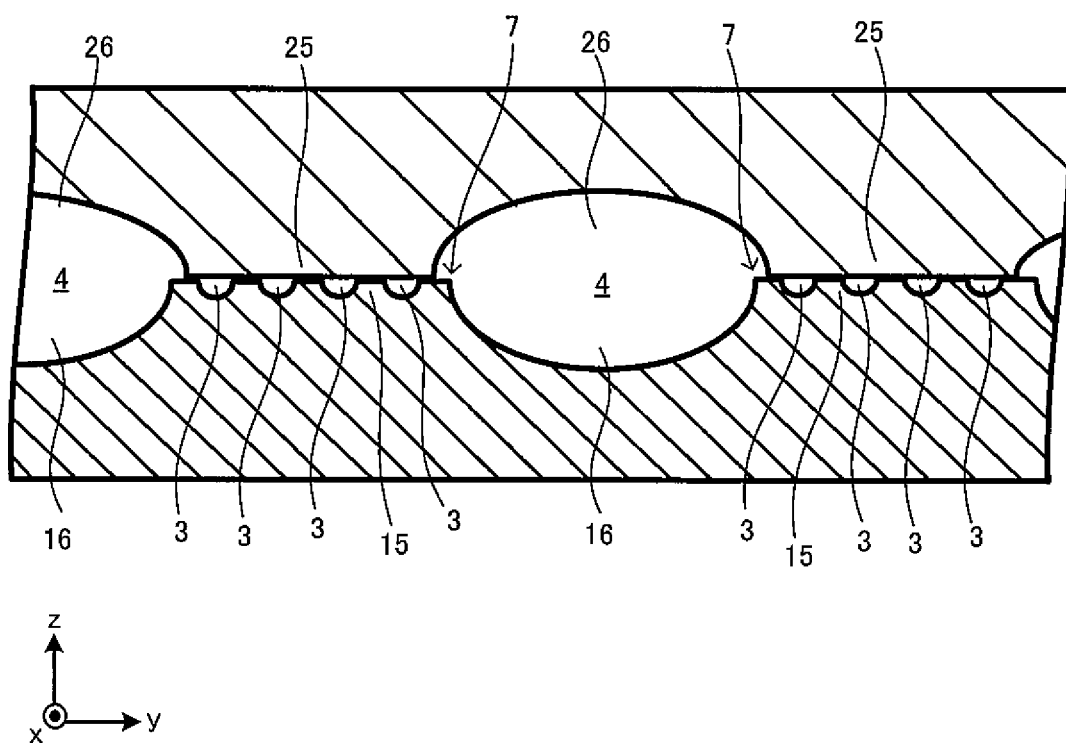
FIG. 40 shows a partially enlarged cross section of a vapor chamber according to a modification.

FIGS. 39 and 40 show partial cross sections of vapor chambers according to modifications. FIG. 39 corresponds to FIG. 27, and FIG. 40 corresponds to FIG. 28.

In the vapor chambers shown in FIGS. 39 and 40, projecting parts 7 are formed of the inner side fluid flow path parts 15 of the first sheet 10. These projecting parts 7 are also portions that are formed on the boundary surfaces with the vapor flow paths 4, and form portions sticking out on the vapor flow paths 4 side. Specifically, in the present embodiment, each projecting part 7 has an apex 7a that is the point of a portion of the narrowest width of the vapor flow path, and the projecting face 7b extending in the direction y. In this embodiment, the projecting faces 7b include the wall parts 15b.

These projecting parts 7 can lead to the same operation as the vapor chamber 1.

Figure 41:
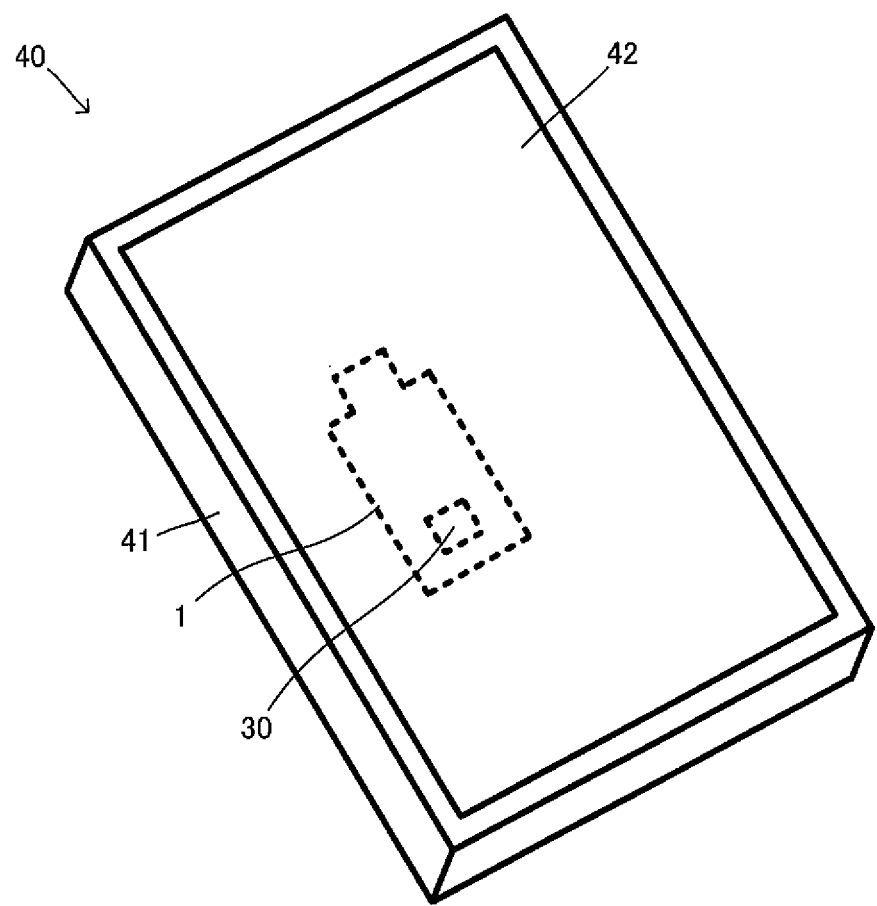
FIG. 41 is an explanatorily perspective view of an electronic device 40.

Next, the operation of the vapor chamber 1 will be described. FIG. 41 schematically shows a state where the vapor chamber 1 is arranged inside a portable terminal 40 that is one embodiment of an electronic device. Here, the vapor chamber 1 is shown by the dotted lines because arranged inside a housing 41 of the portable terminal 40. Such a portable terminal 40 is formed to include the housing 41 that contains various electronic components, and a display unit 42 that is exposed through an opening part of the housing 41 so that an image can be seen from the outside. As one of these electronic components, an electronic component 30 to be cooled by the vapor chamber 1 is arranged inside the housing 41.

The vapor chamber 1 is disposed inside a housing of a portable terminal or the like, and is attached to the electronic component 30, which is to be cooled, such as CPU. The electronic component 30 is attached to the outer face 10b or the outer face 20b of the vapor chamber 1 directly, or via a high thermal-conductive adhesive, sheet, tape, or the like. The position where the electronic component 30 is attached in the face 10b or the outer face 20b is not particularly limited, and is suitably set in relation to the arrangement of the other components in the portable terminal or the like.

FIGS. 42 to 45 show specific examples of the positional relationship between the electronic component 30 and the vapor chamber 1. In all the examples in the present embodiment, as shown by the dotted lines in FIG. 1, the electronic component 30, which is a heat source to be cooled, is arranged at the center of the main body 11 in the direction y on the outer face 10b of the first sheet 10. This can make the one and the other sides in the direction y symmetry, which is an advantage in production and reflux of the working fluid.

Since being at the position of a blind spot and thus cannot be seen, the electronic component 30 is shown by the dotted lines.

Figure 42:
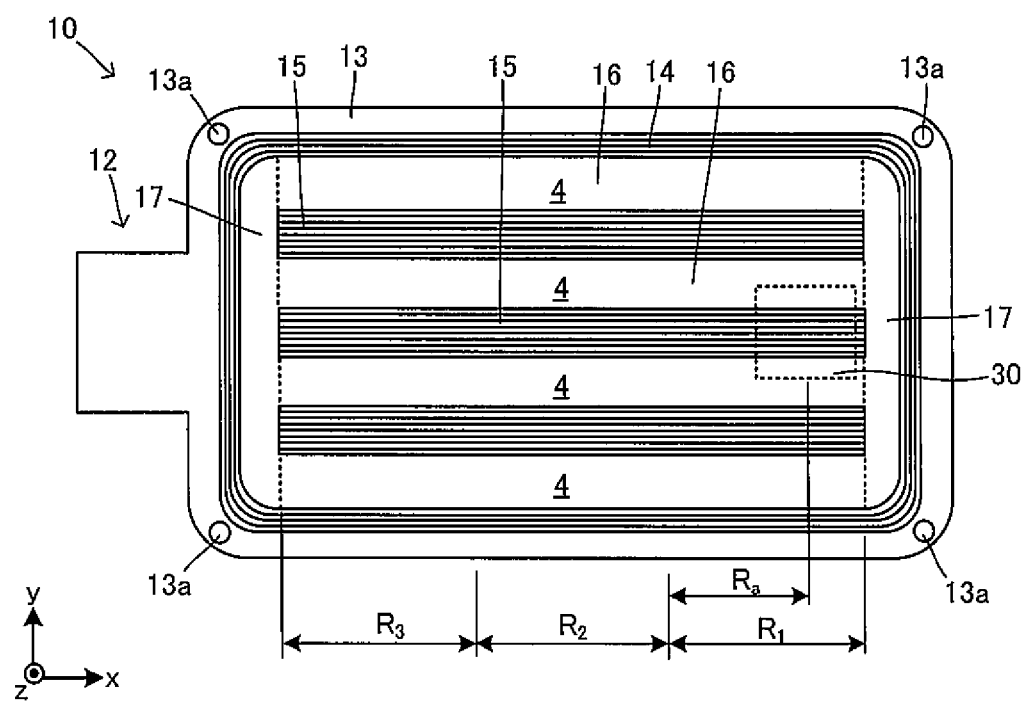
FIG. 42 shows an example of an aspect of arrangement of electronic components.
Figure 43:
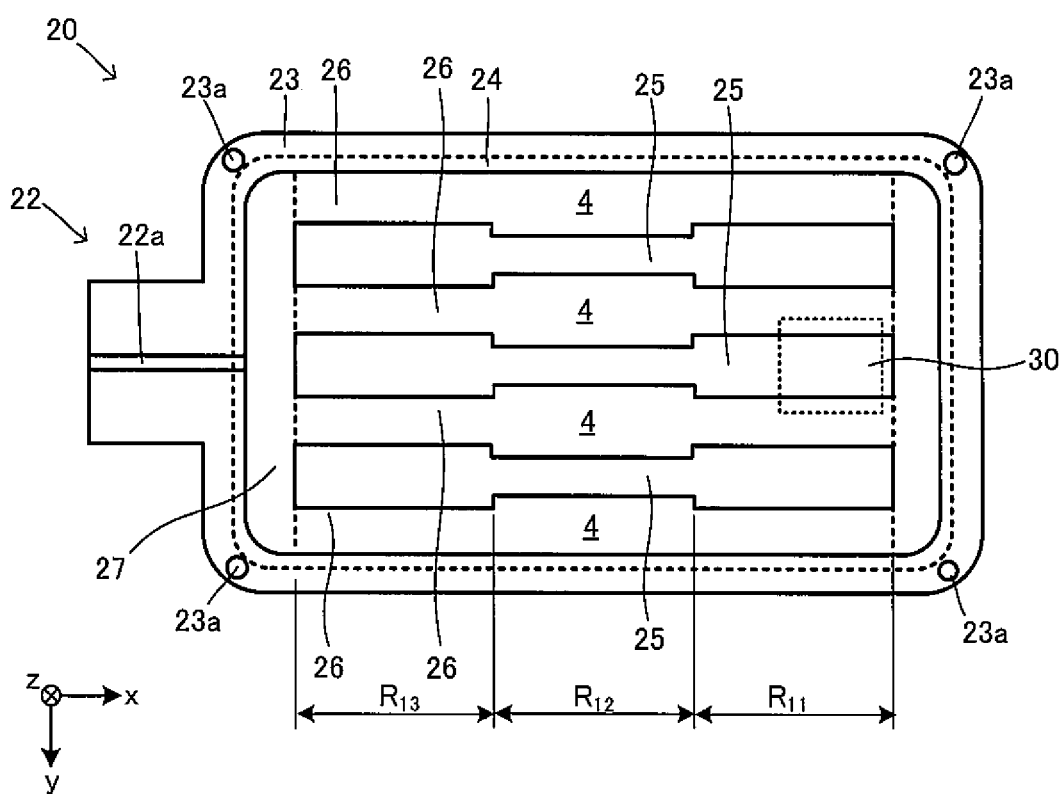
FIG. 43 shows an example of an embodiment of arrangement of an electronic component.

The examples in FIGS. 42 and 43 are such that when three areas ($R_1$ to $R_3$, $R_{11}$ to $R_{13}$) are defined, the electronic component 30 is arranged at one end portion, which is the area $R_1$ and $R_{11}$. FIG. 42 shows the relationship with the first sheet 10, and FIG. 43 shows the relationship with the second sheet 20.

In this case, the electronic component 30 can be formed to have a size such that, and to be arranged in such a way that in a plan view, the entire thereof is superposed inside the areas $R_1$ and $R_{11}$. The distance from the central position of the electronic component 30 to the boundary between the areas $R_1$ and $R_2$, which is shown by $R_a$ in FIG. 42, may be formed longer than the length of the electronic component 30 in the direction x. This makes it possible to efficiently use the areas $R_1$ and $R_{11}$ as an evaporating part.

Each of the areas $R_3$ and $R_{13}$ preferably has the same length in the direction x as the areas $R_1$ and $R_{11}$. This makes the internal structure of the vapor chamber 1 on one and the other sides in the direction x symmetry with respect to the center thereof, which leads to well-balanced pressures when the first sheet 10 and the second sheet 20 are bonded, and in installation into the electronic component. The areas $R_1$ to $R_3$, and the areas $R_{11}$ to $R_{13}$ may all have the same length in the direction x.

Figure 44:
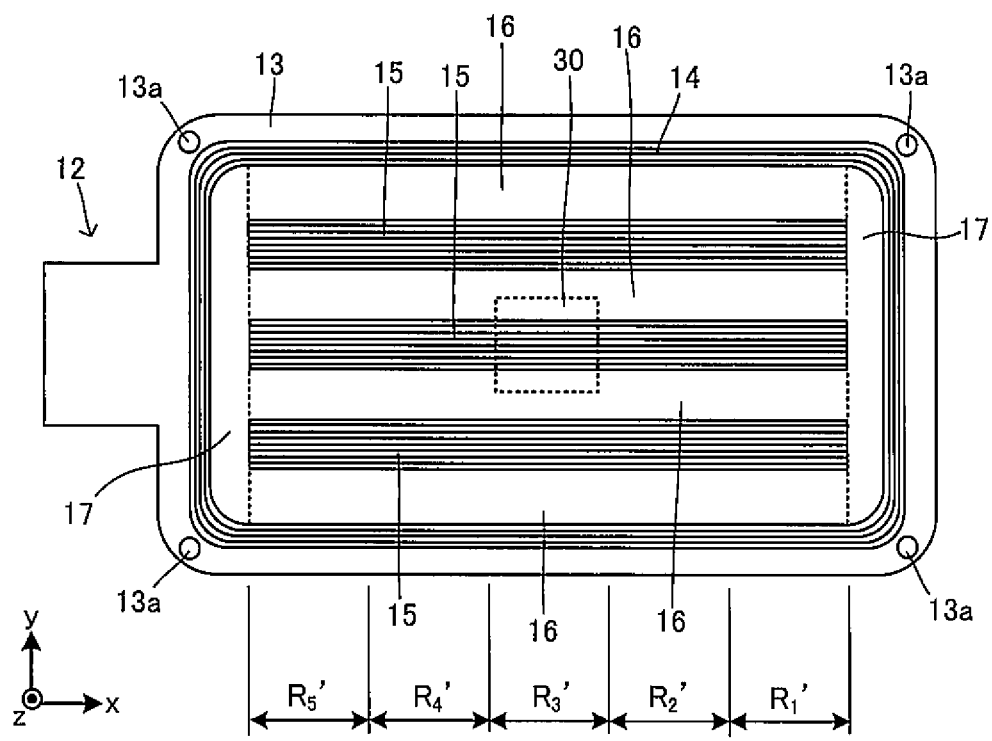
FIG. 44 shows an another example of the embodiment of arrangement of the electronic component.
Figure 45:
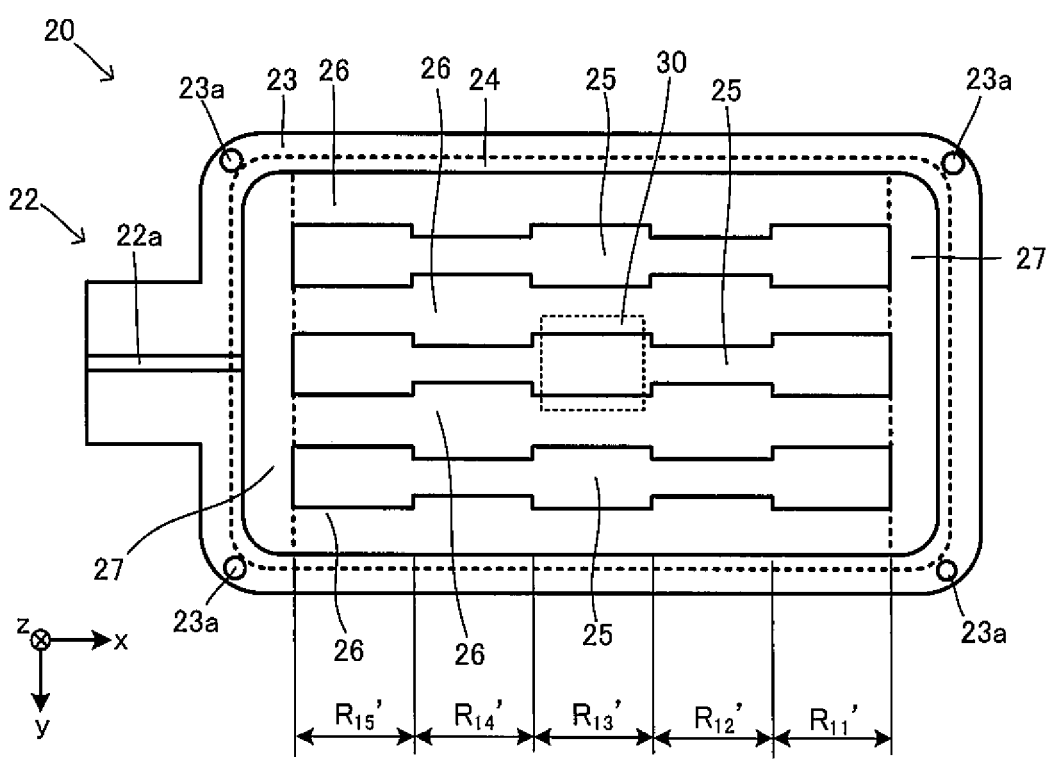
FIG. 45 shows an another example of the embodiment of arrangement of the electronic component.

The examples in FIGS. 44 and 45 are such that when five areas ($R_1'$ to $R_5'$, $R_{11}'$ to $R_{15}'$) are defined, the electronic component 30 is arranged at a position in the areas $R_3'$ and $R_{13}'$, which are the centers among them. FIG. 44 shows the relationship with the first sheet 10, and FIG. 45 shows the relationship with the second sheet 20.

In this case, the electronic component 30 can be formed to have a size such that, and to be arranged in such a way that in a plan view, the entire thereof is superposed inside the areas $R_3'$ and $R_{13}'$. Each of the areas $R_3'$ and $R_{13}'$ may have a size in the direction x at least twice as large as the electronic component 30 in the direction x. This promotes evaporation of the working fluid near the electronic component 30, which is a heat source, and at the same time makes it difficult to evaporate and condense in the areas $R_2'$, $R_{12}'$, $R_4'$ and $R_{14}'$, which are adjacent to the areas $R_3'$ and $R_{13}'$.

At this time, the central position of the areas $R_3'$ and $R_{13}'$ in the direction x may be the same as that of the electronic component 30 in the direction x. This makes the internal structure of the vapor chamber 1 on one and the other sides in the direction x symmetry with respect to the center thereof, which leads to well-balanced pressures when the first sheet 10 and the second sheet 20 are bonded, and in installation into the electronic component. Thus, the areas $R_2'$ and $R_{12}'$ can have the same magnitude as the areas $R_4'$ and $R_{14}'$ in the direction x, and the areas $R_1'$ and $R_{11}'$ can have the same magnitude as the areas $R_5'$ and $R_{15}'$ in the direction x. All the areas may have the same magnitude.

Here, the example of the embodiment shown in FIG. 23 is used as the second sheet 20 for the description. The example of the embodiment shown in FIG. 24 can be considered in the same way.

Figure 46:
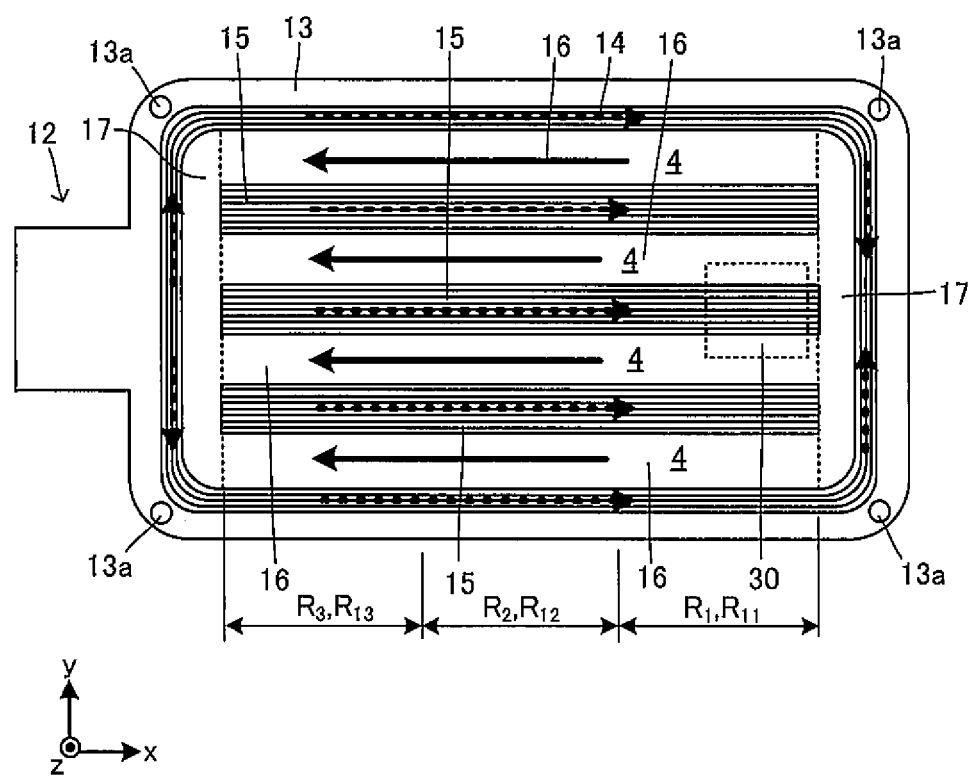
FIG. 46 explanatorily shows operation of the vapor chamber 1.

FIG. 46 explanatorily shows the flows of the working fluid. For easy description, in this drawing, the second sheet 20 is omitted, so that the inner face 10a of the first sheet 10 is seen.

When the electronic component 30 generates heat, the heat is conducted inside the first sheet 10 by thermal conduction, and part of a condensate in the enclosure 2 which is present near the electronic component 30 receives the heat. The condensate receiving this heat absorbs heat, and evaporates to vaporize. This causes the electronic component 30 to be cooled.

The vaporized working fluid is a vapor, and flows in the vapor flow paths 4 to move as shown by the solid straight arrows in FIG. 46. This flow is generated in such a direction as to be separated from the electronic component 30 as passing through the area(s) $R_2$ and/or $R_{12}$ to reach the area(s) $R_3$ and/or $R_{13}$, which allows the vapor to move in the direction such as to be separated from the electronic component 30.

The vapor inside the vapor flow paths 4 is separated from the electronic component 30, which is a heat source, to move to the outer circumferential part of the vapor chamber 1 which is at relatively low temperature, and is cooled as the heat thereof is taken by the first sheet 10 and the second sheet 20 in order when moving. The first sheet 10 and the second sheet 20 taking the heat from the vapor conduct the heat to the housing etc. of the portable terminal device in contact with the outer face 10b and the outer face 20b thereof, and finally the heat is released to the outside.

The working fluid from which the heat is taken as moving the vapor flow paths 4 condenses to liquefy. This condensate is adhered to wall faces of the vapor flow paths 4. In contrast, since the vapor continuously flows in the vapor flow paths 4, the condensate moves from the communicating opening parts etc. to the condensate flow paths 3 as if the condensate were pushed by the vapor. Since the condensate flow paths 3 in the present embodiment include the communicating opening parts 14c and the communicating opening parts 15c, the condensate passes through these communicating opening parts 14c and communicating opening parts 15c, to be distributed into a plurality of the condensate flow paths 3.

The condensate entering the condensate flow paths 3 moves so as to be close to the electronic component 30, which is a heat source, as shown by the dotted straight arrows in FIG. 46 by the capillary phenomenon by the condensate flow paths, and by pushing by the vapor. The condensate then vaporizes again by the heat of the electronic component 30, which is a heat source, and the foregoing is repeated.

As described above, the vapor chamber 1 leads to excellent reflux of the condensate in the condensate flow paths by a great capillary force, which makes it possible to increase the heat transport amount.

The vapor chamber 1 prevents the condensate from blocking the vapor flow paths, which makes it possible to move the vapor since, like this example, a heat source is arranged in the area(s) $R_1$ and/or $R_{11}$, that is, an area where the pitch for the communicating opening parts is smaller than areas adjacent thereto, and/or an area where the projecting amount of each projecting part of the vapor flow paths is larger than areas adjacent thereto, and the area(s) is/are used as an evaporating part, which causes the vapor flowing out of the evaporating part to next reach an area where it is hard for the vapor to condense (area(s) $R_2$ and/or $R_{11}$). The moved vapor reaches to the area(s) $R_3$ and/or area $R_{13}$, which is/are apart from the heat source. The area(s) make(s) it easy for the vapor to condense, and highly function(s) as a condensing part since being an area where the pitch for the communicating opening parts is smaller than areas adjacent thereto, and/or an area where the projecting amount of each projecting part of the vapor flow paths is larger than areas adjacent thereto. This makes it possible to smoothly reflux the working fluid, to bring about a high heat transport capability.

The vapor chamber including two sheets of the first sheet and the second sheet has been described so far. The present invention is not limited to this. A vapor chamber including three or more sheets can be considered in the same way. Hereinafter an example of a vapor chamber that is formed of three sheets will be described as one embodiment.

Figure 47:
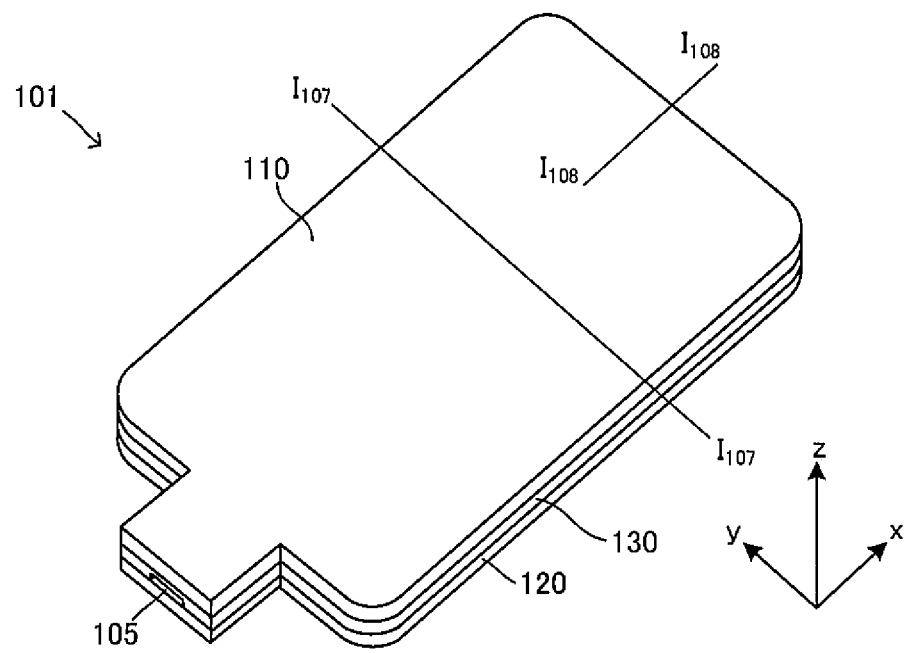
FIG. 47 is a perspective view of a vapor chamber 101.
Figure 48:
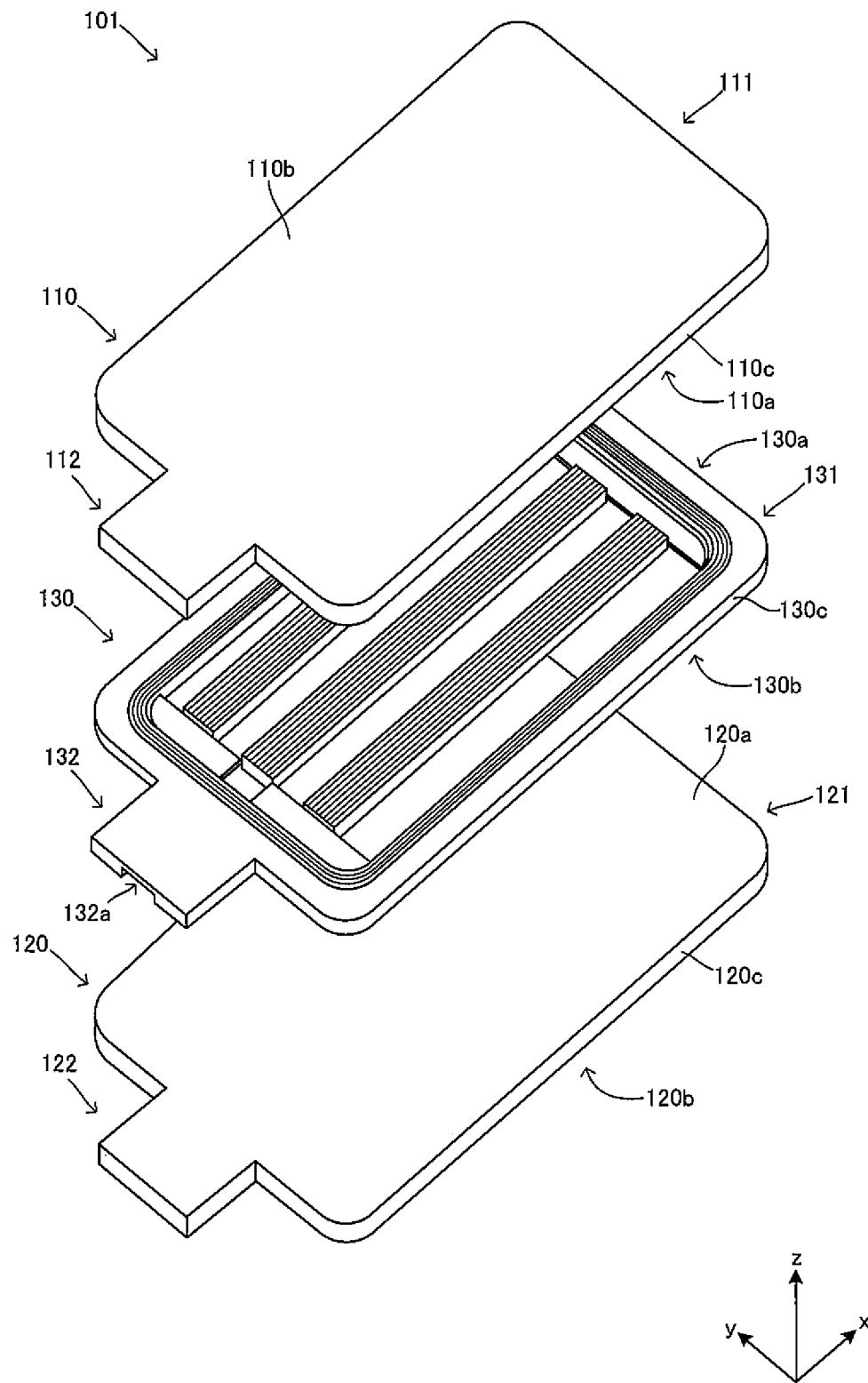
FIG. 48 is an exploded perspective view of the vapor chamber 101.

FIG. 47 is an external perspective view of a vapor chamber 101 that is formed of three sheets. FIG. 48 is an exploded perspective view of the vapor chamber 101.

The vapor chamber 101 of the present embodiment has, as can be seen in FIGS. 47 and 48, a first sheet 110, a second sheet 120 and a third sheet 130. In the same manner as the foregoing, these sheets are superposed, and bonded (diffusion bonding, brazing, etc.) to each other, to be a sheet for a vapor chamber where a hollow part based on the shape of the third sheet 130 is formed between the first sheet 110 and the second sheet 120. A working fluid is sealed in the hollow part, which makes the hollow part an enclosure 102, and then the vapor chamber 101 is made.

The material constituting each of the first sheet 110, the second sheet 120 and the third sheet 130 can be considered the same as the first sheet 10.

In the present embodiment, the first sheet 110 is as a whole a sheet-like member both faces of which (one and the other faces in the thickness direction, an inner face 110a and an outer face 110b) are flat. The first sheet 110 is formed of flat faces on both sides, and includes the flat inner face 110a, the flat outer face 110b on the opposite side of the inner face 110a, and an end face 110c across the inner face 110a and the outer face 110b which forms thickness.

The first sheet 110 also includes a main body 111 and an inlet 112.

The main body 111 is a sheet-like portion that forms the hollow part and the enclosure, and in the present embodiment, is a rectangle having the corners of circular arcs (what is called R) in a plan view.

The main body 111 of the first sheet 110 can have a shape necessary for a vapor chamber according to situations, other than a quadrangle like the present embodiment. For example, the shape may be a circle, an ellipse, a triangle or any other polygon, or a shape having any bend such as an L-shape, a T-shape, a crank-shape, and a U-shape, or a shape of any combination of at least two of them.

The inlet 112 is a portion via which a working fluid is poured into the formed hollow part, and in the present embodiment, is like a sheet of a quadrangle in a plan view which sticks out of one side of the main body 111, which is a rectangle in a plan view.

Such a first sheet 110 has a thickness not particularly limited. The thickness is preferably at most 1.0 mm, and may be at most 0.75 mm, and may be at most 0.5 mm. In contrast, this thickness is preferably at least 0.02 mm, and may be at least 0.05 mm, and may be at least 0.1 mm. The range of this thickness may be defined by the combination of any one of the foregoing plural candidate values for the upper limit, and any one of the foregoing plural candidate values for the lower limit. The range of the thickness may be also defined by the combination of any two of the plural candidate values for the upper limit, or the combination of any two of the plural candidate values for the lower limit.

This can make the case where the vapor chamber is applicable as a thin vapor chamber, often.

The first sheet 110 may be a single layer, or may be formed by laminating a plurality of sheets. For example, a sheet formed by laminating a plurality of layers each having different strength (clad material) may be used.

In the present embodiment, the second sheet 120 is also, as a whole, a sheet-like member both sides of which are flat. The first sheet 120 is formed of flat faces on both sides, and includes a flat inner face 120a, a flat outer face 120b on the opposite side of the inner face 120a, and an end face 120c across the inner face 120a and the outer face 120b which forms thickness.

The second sheet 120 includes a main body 121 and an inlet 122 as well as the first sheet 110.

Other than the foregoing, the second sheet 120 can be considered the same as the first sheet 110. The second sheet 120 does not necessarily have the same thickness, or is not necessarily constituted of the same material as the first sheet 110, and may be formed so as to have a different thickness and/or be from a different material from the first sheet 110.

The first sheet 120 may be a single layer, or may be formed by laminating a plurality of sheets as well. For example, a sheet formed by laminating a plurality of layers each having different strength (clad material) may be used.

In the present embodiment, the third sheet 130 is a sheet held between, and superposed on the inner face 110a of the first sheet 110 and the inner face 120a of the second sheet 120, and has the structure for the enclosure 102 where a working fluid moves.

Figure 49:
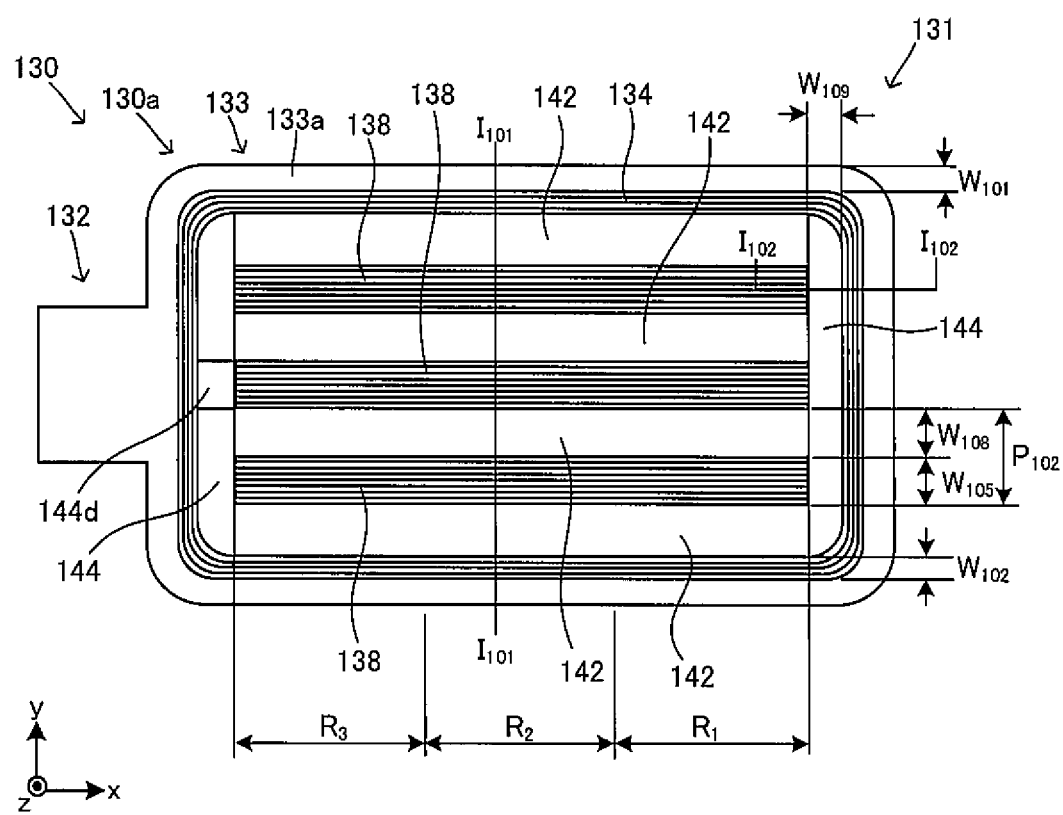
FIG. 49 shows a third sheet 130 in the direction z.
Figure 50:
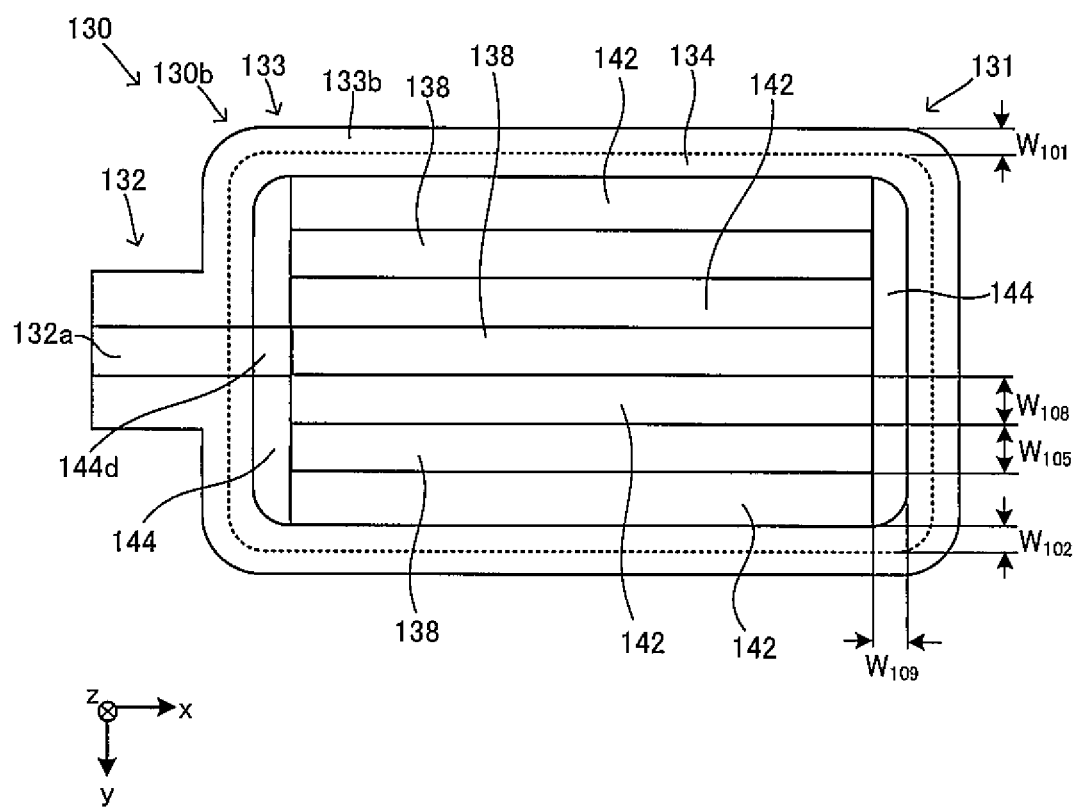
FIG. 50 shows FIG. 49 on an opposite side.

FIGS. 49 and 50 are plan views of the third sheet 130 (viewed in the direction z). FIG. 49 shows a face to be superposed on the first sheet 110, and FIG. 50 shows a face to be superposed on the second sheet 120.

Figure 51:
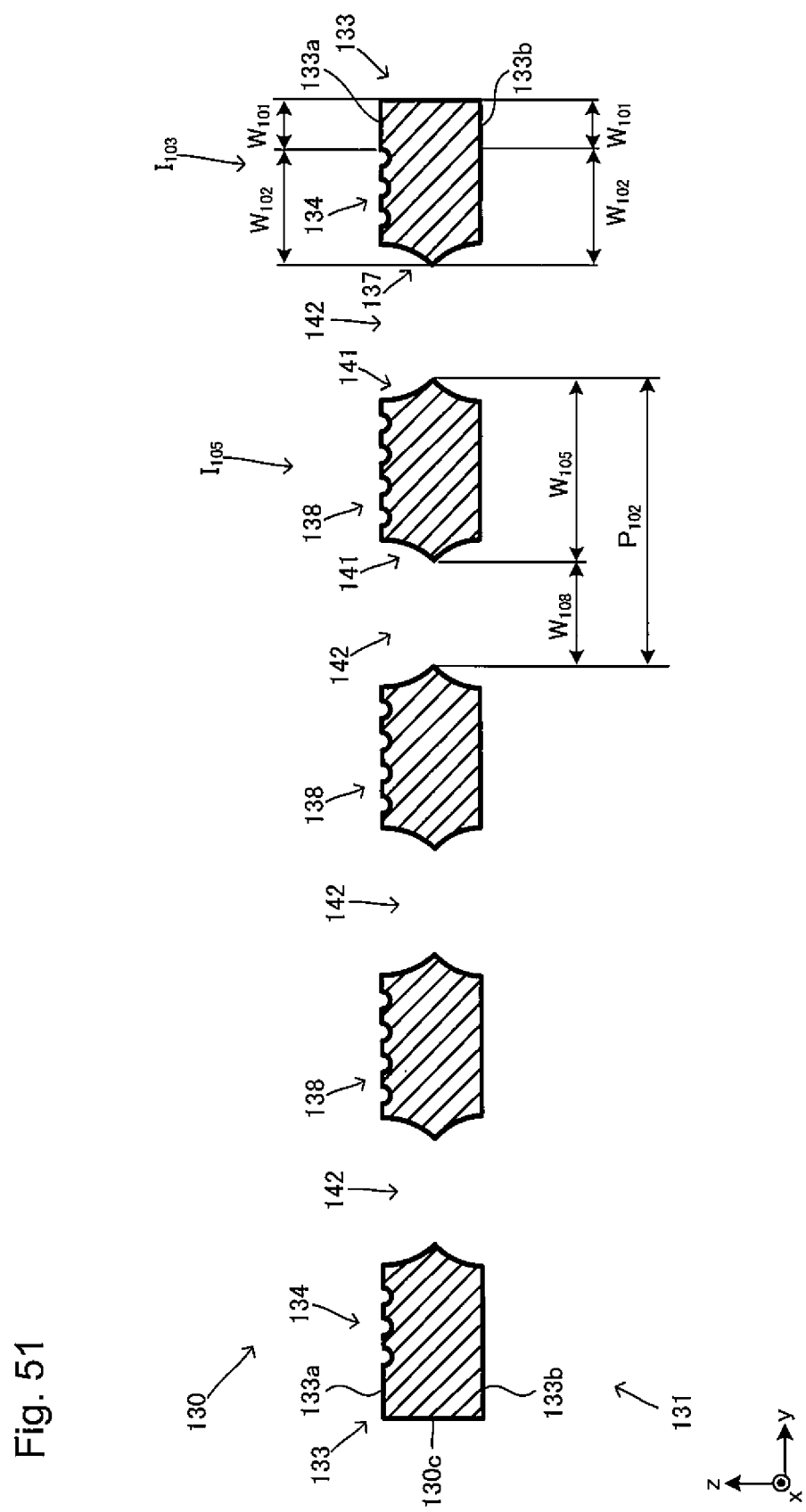
FIG. 51 shows a cross section of the third sheet 130.
Figure 52:
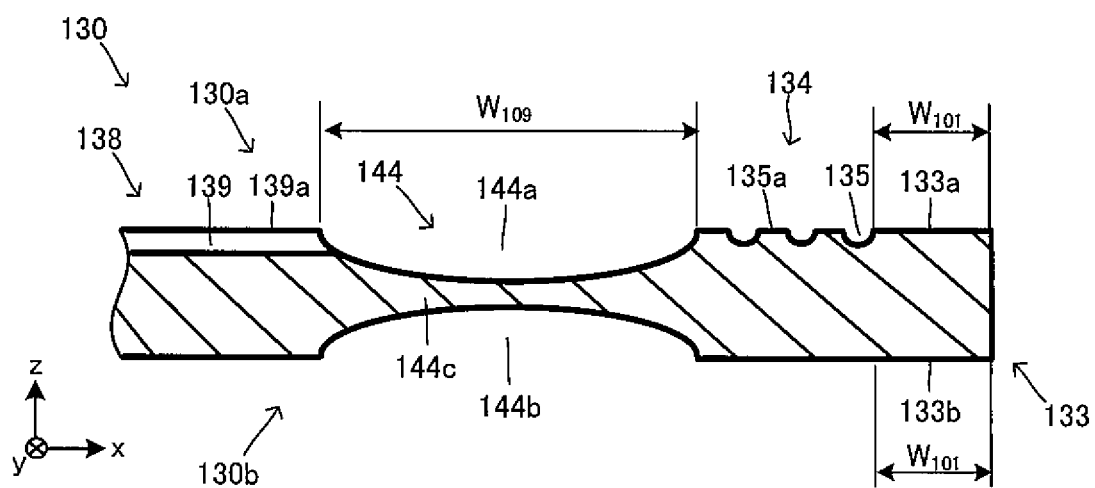
FIG. 52 shows another cross section of the third sheet 130.

FIG. 51 shows a cross section taken along the line $I_{101}$-$I_{101}$ in FIG. 49, and FIG. 52 shows a cross section taken along the line $I_{102}$-$I_{102}$ in FIG. 49.

The third sheet 130 may be a single layer, or may be formed by laminating a plurality of sheets as well. When a plurality of sheets are superposed to form the third sheet 130, the following structure may be formed after a plurality of the sheets are laminated, or may be formed by individually processing a plurality of the sheets and thereafter laminating the processed sheets.

In the present embodiment, the third sheet 130 includes a first face 130a that is to be superposed on the inner face 110a of the first sheet 110, a second face 130b that is to be superposed on the inner face 120a of the second sheet 120, and an end face 130c across the first face 130a and the second face 120b which forms thickness. Thus, the first face 130a appears in FIG. 49, and the second face 130b appears in FIG. 50.

The third sheet 130 includes a main body 131 and an inlet 132.

The main body 131 is a sheet-like portion that forms the hollow part in the sheet for a vapor chamber, and the enclosure in the vapor chamber 101, and in the present embodiment, is a rectangle having the corners of circular arcs (what is called R) in a plan view.

The main body 131 can have a shape necessary for a vapor chamber according to situations, other than a quadrangle like the present embodiment. For example, the shape may be a circle, an ellipse, a triangle or any other polygon, or a shape having any bend such as an L-shape, a T-shape, a crank-shape, and a U-shape, or a shape of any combination of at least two of them.

In the present embodiment, the first sheet 110, the second sheet 120 and the third sheet 130 have the same external shape.

The inlet 132 is a portion via which a working fluid is poured into the formed hollow part, and in the present embodiment, is like a sheet of a quadrangle in a plan view which sticks out of one side of the main body 131, which is a rectangle in a plan view. The inlet 132 is provided with a groove 132a that communicates from the end face 130c to the main body 32 on the second face 130b side.

The thickness and the material of the third sheet 130 can be considered the same as the first sheet 110. The third sheet 130 does not necessarily have the same thickness, or is not necessarily constituted of the same material as the first sheet 110, and may be formed so as to have a different thickness and/or be from a different material from the first sheet 110.

The structure for refluxing a working fluid is formed in the main body 131. Specifically, the main body 131 includes a peripheral bonding part 133, a peripheral fluid flow path part 134, an inner side fluid flow path parts 138, vapor flow path grooves 142, and vapor flow path communicating grooves 144.

The vapor chamber 101 in the present embodiment includes vapor flow paths 104 that are first flow paths and thorough which a vapor of a working fluid passes, and condensate flow paths 103 that are second flow paths and thorough which a condensate that is a working fluid condensing to liquefy passes. The vapor flow path grooves 142 of the third sheet 130 form the vapor flow paths 104, and fluid flow path grooves 135 included in the peripheral fluid flow path part 134, and fluid flow path grooves 139 included in the inner side fluid flow path parts 138 form the condensate flow paths 103.

The peripheral bonding part 133 is a portion that is disposed along the periphery of the main body 131, and includes a peripheral bonding face 133a that is disposed on the first face 130a of the main body 131, and a peripheral bonding face 133b that is disposed on the second face 30b. The peripheral bonding face 133a is superposed on the periphery of the inner face 110a of the first sheet 110 to be bonded (diffusion bonding, brazing, etc.) to each other, and the peripheral bonding face 133b is superposed on the periphery of the inner face 20a of the second sheet 120 to be bonded (diffusion bonding, brazing, etc.) to each other. This leads to formation of the hollow part based on the shape of the third sheet 130 between the first sheet 110 and the second sheet 120, and the sheet for a vapor chamber is made. A working fluid is sealed in this hollow part, which leads to formation of the enclosure 102, and then the vapor chamber 101 is made.

The width of the peripheral bonding part 133 (the peripheral bonding face 133a and the peripheral bonding face 133b) shown by $W_{101}$ in FIGS. 49 to 52 (size in a direction orthogonal to the extending direction of the peripheral bonding part 133) can be considered the same as the width $W_1$ of the peripheral bonding part 13 of the first sheet 10.

Figure 53:
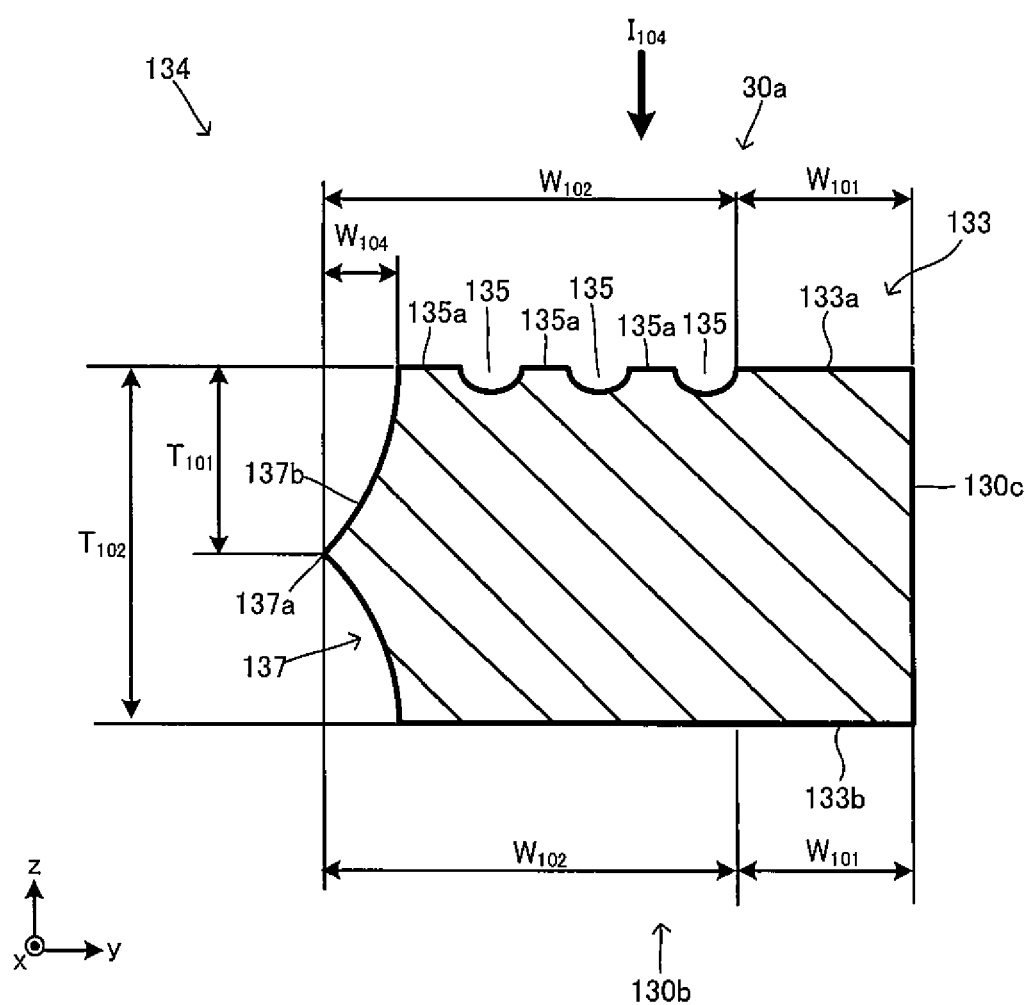
FIG. 53 shows a cross section focused on a peripheral fluid flow path part 134.

The peripheral fluid flow path part 134 functions as a fluid flow path part, and is a portion that forms part of the condensate flow paths 103, which are the second flow paths where a working fluid passes when the working fluid condenses to liquefy. FIG. 53 is an enlarged view of a portion indicated by the arrow $I_{103}$ in FIG. 51. FIG. 54 is an enlarged plan view of the peripheral fluid flow path part 134 viewed in a direction indicated by the arrow $I_{104}$ in FIG. 53 (viewed in the direction z). That is, FIG. 54 shows part of the peripheral fluid flow path part 134 viewed from the first face 130a.

Here, the peripheral fluid flow path part 134 includes the fluid flow path grooves 135, wall parts 135a, and communicating opening parts 135b on the first face 130a side. The aspects thereof can be considered the same as the fluid flow path grooves 14a, the wall parts 14b, and the communicating opening parts 14c of the peripheral fluid flow path part 14. The description about the fluid flow path grooves 14a, the wall parts 14b, and the communicating opening parts 14c is also applied to the fluid flow path grooves 135, the wall parts 135a, and the communicating opening parts 135b.

In contrast, in the present embodiment, the peripheral fluid flow path part 134 is formed to have a flat face on the second face 130b side.

Here, since being a groove, each fluid flow path groove 135 has a bottom portion on the cross-sectional shape thereof, and the opposite side, which faces this bottom portion, is opening. The first sheet 110 is superposed on the third sheet 130 to close this opening, to form the condensate flow path 103.

In the present embodiment, the peripheral fluid flow path part 134 is provided with a projecting parts 137 as shown in FIG. 51. The projecting parts 137 are portions that are formed on the boundary surfaces with the vapor flow path grooves 142, and are portions sticking out on the vapor flow path grooves 142 side.

In the present embodiment, each projecting part 137 includes an apex 137a that sticks out most in the width direction (direction y) of the vapor flow path grooves (vapor flow paths) at a position from the first face 130a by $T_{101}$ (see FIG. 53) in the thickness direction (direction z), and a recessed projecting face 137b of a circular arc on the peripheral fluid flow path part 134 side in a cross-sectional view which extends from this apex 137a to the condensate flow path (wall part 135a). The projecting face 137b is linked to the wall part 135a. The projecting face does not have to have the shape of a circular arc, and may be curved other than a circular arc recessed on the peripheral fluid flow path part 134 side in the cross-sectional view.

Further other examples of the embodiments of the projecting part will be described later. The projecting part is, as well as the projecting parts 6 and 7 in the vapor chamber 1, a portion sticking out on the vapor flow path grooves (vapor flow paths) side in the width direction, and includes a face extending from the apex, which is the point by which the vapor flow path is narrowed most, to the condensate flow path (wall part). The projecting face is formed so as to be coupled with or include the wall part.

Such a projecting part 137 makes it easy for a condensate to collect on the projecting face 137b due to the shape thereof, which makes it possible to smoothly move a working fluid between the condensate flow paths 3 and the vapor flow paths 4 via the projecting part 137, to improve a heat transport capability.

The surface of the projecting face 137b is not particularly limited, but may be a rough face, or a micro steplike face. This can improve power for holding a condensate.

The surface roughness (ISO 25178) of the projecting face can be measured with, for example, a laser microscope (model number: VK-X250) manufactured by Keyence Corporation. The arithmetic mean height Sa of this surface roughness is preferably at least 0.005 μm, and is more preferably at least 0.03 µm. The maximum height Sz is preferably at least 0.05 µm, and is more preferably at least 0.3 µm.

The width of the peripheral fluid flow path part 134 (size in the aligning direction of the fluid flow path grooves 135) shown by $W_{102}$ in FIGS. 49 to 51 and 53 can be considered the same as $W_2$ of the peripheral fluid flow path part 14 of the first sheet 10.

The projecting amount of each projecting part 137 (distance between an end portion of the wall part 135a and the apex 137a in the direction y) shown by $W_{104}$ in FIG. 53 can be considered the same as the projecting amounts $W_{R11}$ and $W_{R12}$ of the vapor chamber 1. That is, in the present embodiment, each projecting part 137 can have different projecting amounts $W_{104}$ in the direction y as well. Upon division into areas (such as areas $R_1$, $R_2$ and $R_3$), each projecting part 137 can also have projecting amounts $W_{104}$ different between each area.

The distance in the thickness direction between the apex of the wall part 135a and the apex 137a of each projecting part 137, which is shown by $T_{101}$ in FIG. 53, is such that: a value obtained by dividing $T_{101}$ by $T_{102}$ is preferably at least 0.05, and may be at least 0.15, and may be at least 0.3 when the thickness of the peripheral fluid flow path part 134 is defined as $T_{102}$. In contrast, the value obtained by dividing $T_{101}$ by $T_{102}$ has only to be at most 1.0, and may be at most 0.8, and may be at most 0.6. The range of the value obtained by dividing $T_{101}$ by $T_{102}$ may be defined by the combination of any one of the foregoing plural candidate values for the upper limit, and any one of the foregoing plural candidate values for the lower limit. The range of the value obtained by dividing $T_{101}$ by $T_{102}$ may be also defined by the combination of any two of the plural candidate values for the upper limit, or the combination of any two of the plural candidate values for the lower limit.

In the present embodiment, this value is 0.5, and the apex 137a is arranged at the central position in the thickness direction of the peripheral fluid flow path part 134.

Figure 55:
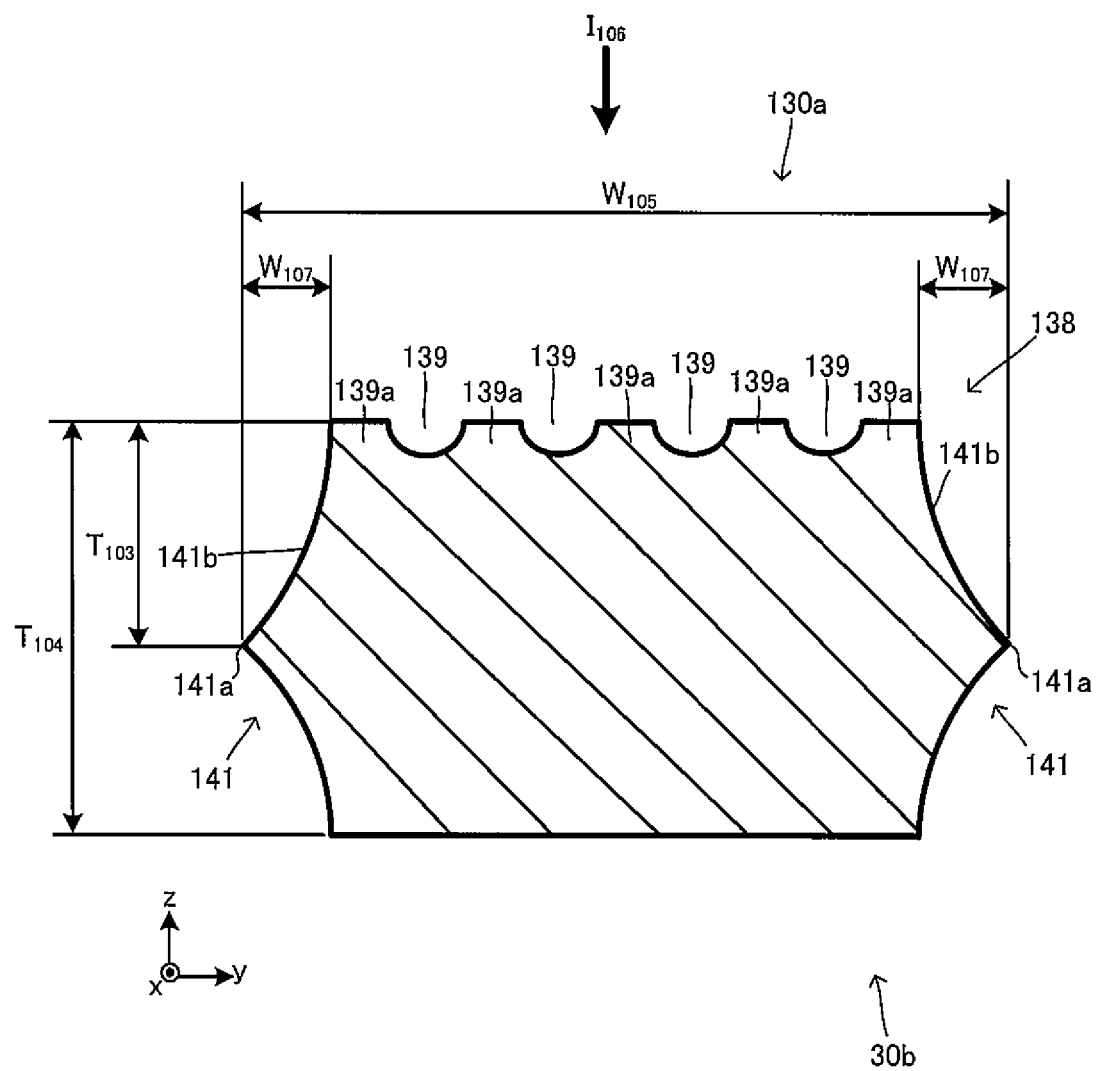
FIG. 55 shows a cross section focused on an inner side fluid flow path part 138.

Returning to FIGS. 47 to 51, the inner side fluid flow path parts 138 will be described. The inner side fluid flow path parts 138 also function as fluid flow paths, and are part of the condensate flow paths 3, which are the second flow paths where a working fluid passes when the working fluid condenses to liquefy, and portions including projecting parts 141. FIG. 55 shows an enlarged portion indicated by the arrow $I_{105}$ in FIG. 51. A cross-sectional shape of the inner side fluid flow path part 138 is also shown in FIG. 55. FIG. 56 shows an enlarged plan view of the inner side fluid flow path part 138 viewed in the direction indicated by the arrow 1106 in FIG. 55 (viewed in direction z).

As can be seen in these drawings, the inner side fluid flow path parts 138 are portions that are formed inside the annular ring of the peripheral fluid flow path part 134 in the main body 131. The inner side fluid flow path parts 138 in the present embodiment extend in a direction parallel to a long side of the rectangle of the main body 31 (direction x) in a plan view (when viewed in the direction z). The plural (three in the present embodiment) inner side fluid flow path parts 138 are aligned at given intervals in a direction parallel to a short side of the rectangle of the main body 31 in a plan view (direction y).

Here, each inner side fluid flow path part 138 includes fluid flow path grooves 139, wall parts 139a, and communicating opening part 139b on the first face 130a side. The aspects thereof can be considered the same as the fluid flow path grooves 15a, the wall parts 15b, and the communicating opening parts 15c of the inner side fluid flow path parts 15.

The description about the fluid flow path grooves 15a, the wall parts 15b, and the communicating opening parts 15c is also applied to the fluid flow path grooves 139, the wall parts 139a, and the communicating opening part 139b. Since being a groove, each fluid flow path groove 139 has a bottom portion in the cross-sectional shape thereof, and is opening on the opposite side, which faces this bottom portion. The first sheet 110 is superposed on the third sheet 130 to close this opening, to form the condensate flow path 103.

In contrast, in the present embodiment, the inner side fluid flow path parts 138 are formed to be flat faces on the second face 130b side.

In the present embodiment, each inner side fluid flow path part 138 is provided with the projecting parts 141. The projecting parts 141 are portion that are formed on the boundary surfaces with the vapor flow path grooves 142, and are portions sticking out on the vapor flow path groove 142 side.

In the present embodiment, each projecting part 141 includes an apex 141a that sticks out most in the width direction (direction y) of the vapor flow path grooves (vapor flow paths) at a position from the first face 130a by $T_{103}$ in the thickness direction (direction z), and recessed projecting faces 141b of circular arcs on the inner side fluid flow path parts 138 side in a cross-sectional view which extend from the apex 141a to the condensate flow paths (wall parts 139a). The projecting faces 141b are linked to the wall parts 139a. The projecting faces do not have to have the shape of a circular arc, and may be curved other than a circular arc recessed on the inner side fluid flow path parts 138 side in the cross-sectional view.

Further other examples of the embodiments of the projecting parts will be described later. The projecting parts are, as well as the projecting parts 6 and 7 in the vapor chamber 1, portions that stick out on the vapor flow path grooves (vapor flow paths) side in the width direction, and each include projecting faces including faces from the apexes, which are the points by which the vapor flow paths are narrowed most, towards the condensate flow paths (wall parts). The projecting faces are formed so as to be coupled with or include the wall parts.

Such projecting parts 141 make it easy for a condensate to collect on the projecting faces 141b due to the shape thereof as described above, which makes it possible to smoothly move a working fluid between the condensate flow paths 3 and the vapor flow paths 4 via the projecting parts 141, to improve a heat transport capability.

The surfaces of the projecting faces 141b are not particularly limited, but may be a rough face, or a micro steplike face. This can improve power for holding a condensate.

The surface roughness (ISO 25178) of each projecting face can be measured with, for example, a laser microscope (model number: VK-X250) manufactured by Keyence Corporation. The arithmetic mean height Sa of this surface roughness is preferably at least 0.005 µm, and is more preferably at least 0.03 µm. The maximum height Sz is preferably at least 0.05 µm, and is more preferably at least 0.3 µm.

The width of each inner side fluid flow path part 138 (the largest value in the size in the aligning direction of the inner side fluid flow path parts 138 and the vapor flow path grooves 142) shown by $W_{105}$ in FIGS. 49 to 51 and 55 can be considered the same as $W_4$ of each inner side fluid flow path part 15 of the first sheet 10.

The pitch for a plurality of the inner side fluid flow path parts 38 shown by $P_{102}$ in FIG. 51 can be considered the same as $P_2$ for the inner side fluid flow path parts 15 of the first sheet 10.

The projecting amount of each projecting part 141 (distance between an end portion of the wall part 139a and the apex 141a in the direction y) shown by $W_{107}$ in FIG. 55 can be considered the same as the projecting amounts $W_{R11}$ and $W_{R12}$ of the vapor chamber 1. That is, in the present embodiment, each projecting part 141 can have projecting amounts $W_{107}$ different in the direction y as well. Upon division into areas (such as areas $R_1$, $R_2$ and $R_3$), each projecting part 141 can also have projecting amounts $W_{107}$ different between each area.

The distance in the thickness direction between the apex 141a of the wall part 139a and the apex 141a of each projecting part 141, which is shown by $T_{103}$ in FIG. 55, is such that: a value obtained by dividing $T_{103}$ by $T_{104}$ is preferably at least 0.05, and may be at least 0.15, and may be at least 0.3 when the thickness of the inner side fluid flow path parts 138 is defined as $T_{104}$. In contrast, the value obtained by dividing $T_{103}$ by $T_{104}$ has only to be at most 1.0, and may be at most 0.8, and may be at most 0.6. The range of the value obtained by dividing $T_{103}$ by $T_{104}$ may be defined by the combination of any one of the foregoing plural candidate values for the upper limit, and any one of the foregoing plural candidate values for the lower limit. The range of the value obtained by dividing $T_{103}$ by $T_{104}$ may be also defined by the combination of any two of the plural candidate values for the upper limit, or the combination of any two of the plural candidate values for the lower limit.

In the present embodiment, this value is 0.5, and the apexes 141a are arranged at the central positions in the thickness direction of each inner side fluid flow path part 138.

Next, the vapor flow path grooves 142 will be described. The vapor flow path grooves 42 are portions where a vapor that is a working fluid evaporating to vaporize passes, and form part of the vapor flow paths 104, which are the first flow paths. FIGS. 49 and 50 each show shapes of the vapor flow path grooves 142 in a plan view, and FIG. 51 shows a cross-sectional shape of the vapor, flow path grooves 142.

As can be seen in these drawings, in the present embodiment, each of the vapor flow path grooves 142 is formed of a groove (slit) that is formed inside the annular ring of the peripheral fluid flow path part 134 of the main body 131. Specifically, the vapor flow path grooves 142 in the present embodiment are formed between adjacent inner side fluid flow path parts 138, and between the peripheral fluid flow path part 134 and the inner side fluid flow path parts 138, and are grooves extending in a direction parallel to a long side of the rectangle of the main body 131 in a plan view (direction x). The plural (four in the present embodiment) vapor flow path grooves 142 are aligned in a direction parallel to a short side of the rectangle of the main body 131 in a plan view (direction y). The vapor flow path grooves 142 in the present embodiment are formed so as to allow the first face 130a to communicate with the second face 130b side of the third sheet 130, that is, are slitlike grooves, and are opening on the first face 130a and second face 130b sides.

Thus, as can be seen in FIG. 51, the third sheet 130 has a shape such that the peripheral fluid flow path part 134 and the inner side fluid flow path parts 138, and the vapor flow path grooves 142 are alternately repeated in the direction y.

The width of each vapor flow path groove 142 shown by $W_{108}$ in FIGS. 49 to 51 (size in the aligning direction of the inner side fluid flow path parts 138 and the vapor flow path grooves 142, width at the narrowest portion of each vapor flow path groove) can be considered the same as $W_6$ of each vapor flow path groove 16 of the first sheet 10.

The vapor flow path communicating grooves 144 are grooves that allow a plurality of the vapor flow path grooves 142 to communicate with each other. This leads to achievement of equality of a vapor in a plurality of the vapor flow paths 142, and makes it possible to transport a vapor into a wider area, to efficiently use a lot of the condensate flow paths 3, which make it possible to smoothly reflux a working fluid.

As can be seen in FIGS. 49, 50 and 52, the vapor flow path communicating grooves 144 in the present embodiment are formed between the peripheral fluid flow path part 134, and both end portions of the inner side fluid flow path parts 138 and the vapor flow path grooves 142 in the extending direction thereof.

The vapor flow path communicating grooves 144 are formed so that adjacent vapor flow path grooves 142 communicate with each other. In the present embodiment, each vapor flow path communicating groove 144 includes, as can be seen in FIG. 52, a groove 144a on the first face 130a side, a groove 144b on the second face 130b side, and a linking part 144c between the groove 144a and the groove 144b. This linking part 144c links the inner side fluid flow path part 138 and the peripheral fluid flow path part 134, to retain the inner side fluid flow path part 38.

As shown in FIGS. 49 and 50, in the present embodiment, the linking part 144c is provided with a hole 144d to allow the groove 144a to communicate with the groove 144b at a portion where an end portion of the groove 132a, which is disposed on the inlet 132 of the third sheet 130, is arranged in the vapor flow path communicating grooves 144. This makes it possible to more smoothly pour a working fluid as the working fluid is not prevented from being poured via the groove 132a.

The width of each vapor flow path communicating groove 144 shown by $W_{109}$ in FIGS. 49, 50 and 52 (size in a direction orthogonal to the communicating direction, width on an opening face of each groove) can be considered the same as the width $W_7$ of each vapor flow path communicating groove 17 of the first sheet 10.

In the present embodiment, the cross-sectional shape of each of the grooves 144a and 144b of the vapor flow path communicating grooves 144 is a semi-ellipse. The present invention is not limited to this. The cross-sectional shape may be a quadrangle such as a rectangle, a square and a trapezoid, a triangle, a semicircle, a circle at the bottom portion, a semi-ellipse at the bottom portion, or any combination of a plurality of them.

The vapor flow path communicating grooves can lead to low flow resistance of a vapor, which allows a working fluid to smoothly reflux. Thus, the cross-sectional shapes of the flow paths can be also determined in such a view.

Next, the structure when the first sheet 110, the second sheet 120, and the third sheet 130 are combined to be the vapor chamber 101 will be described. This description will make the shape of the vapor chamber 101, and the arrangement, size, shape, etc. of each component that the first sheet 110, the second sheet 120, and the third sheet 130 should have further understood.

Figure 57:
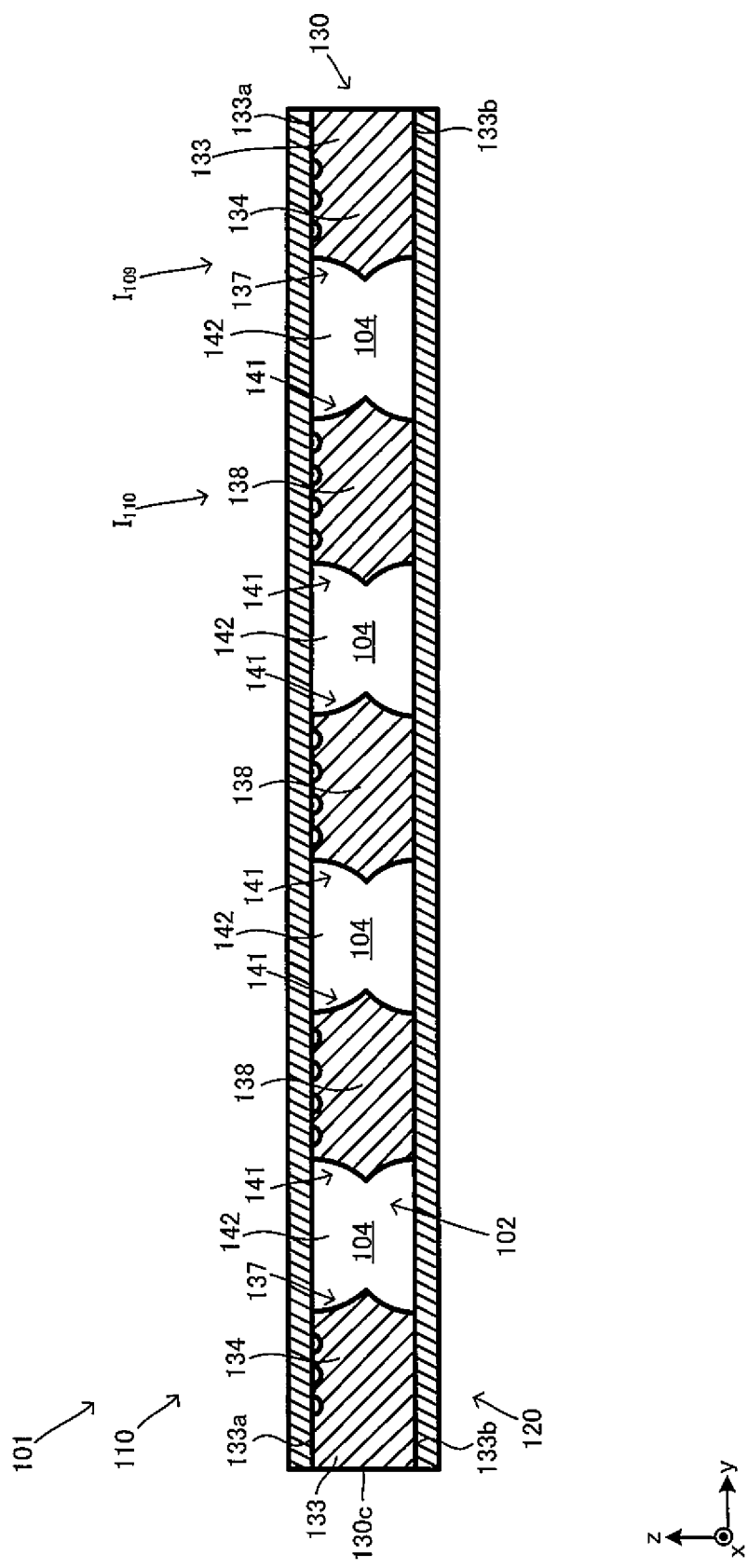
FIG. 57 shows a cross section of the vapor chamber 101.

FIG. 57 shows a cross section of the vapor chamber 101 taken along the direction y shown by $I_{107}$-$I_{107}$ in FIG. 47 in the thickness direction. FIG. 58 shows a cross section of the vapor chamber 101 taken along the direction x shown by $I_{108}$-$I_{108}$ in FIG. 47 in the thickness direction.

Figure 59:
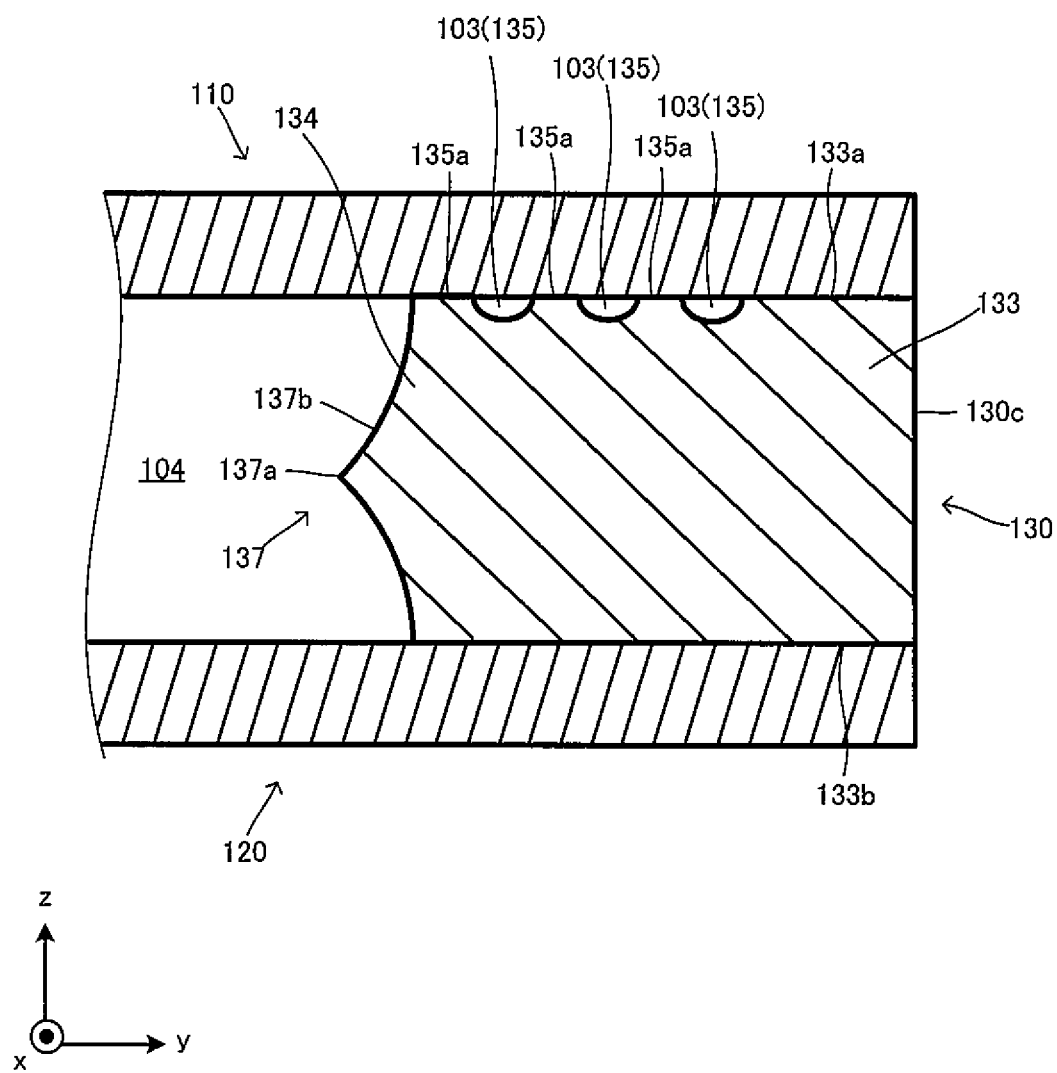
FIG. 59 is a partially enlarged view of FIG. 57.
Figure 60:
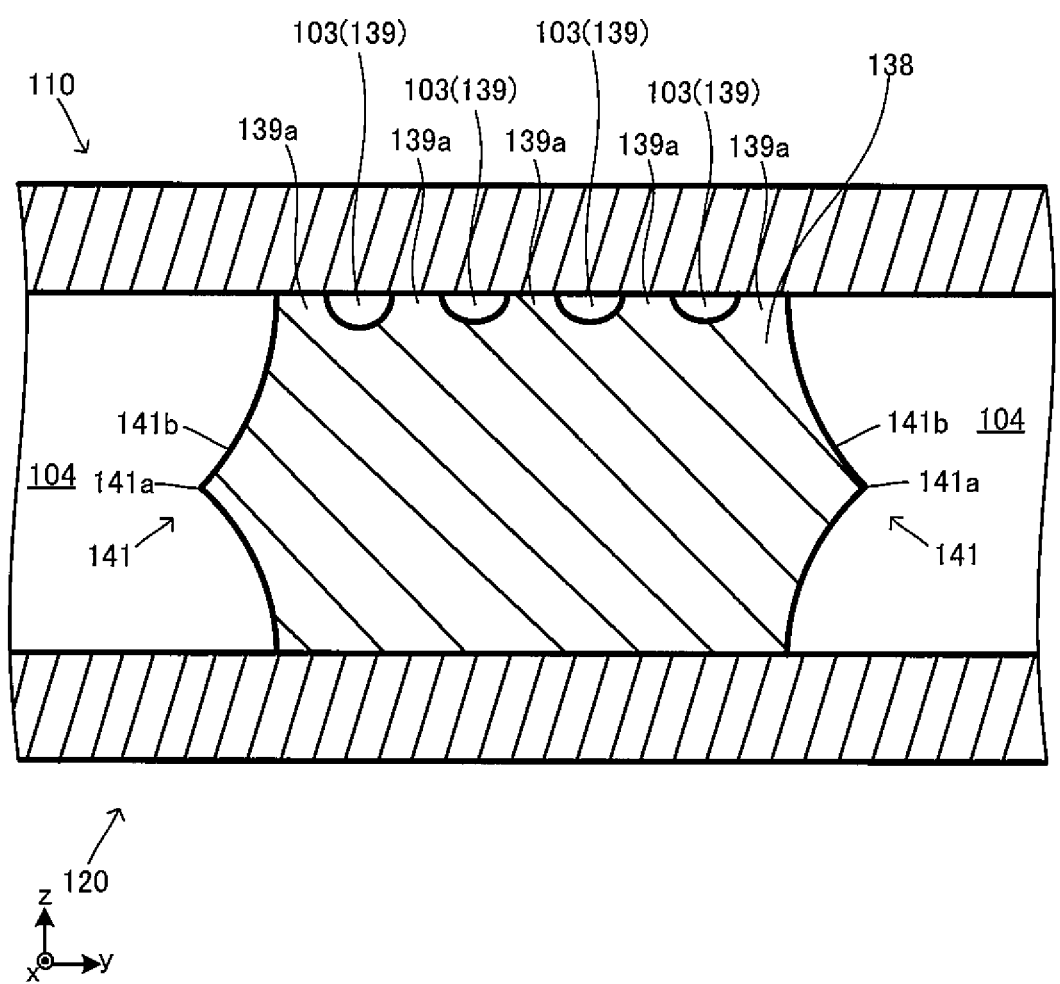
FIG. 60 is another partially enlarged view of FIG. 57.

FIG. 59 shows an enlarged portion shown by I$_{109}$ in FIG. 57, and FIG. 60 shows an enlarged portion shown by I$_{110}$ in FIG. 57.

While the vapor flow paths 104 and the vapor flow paths 103 are separated by the wall parts 135a and the wall parts 139a on the cross sections shown in FIGS. 57 to 60, the wall parts 135a and the wall parts 139a each include the communicating opening parts 135b and the communicating opening parts 139b respectively. Thus, the vapor flow paths 104 and the vapor flow paths 103 communicate with each other via the communicating opening parts 135b and the communicating opening parts 139b.

As can be seen in FIGS. 47, 48, and 57 to 60, the inner face 110a of the first sheet 110 is arranged so as to be superposed on the third sheet 130 on the first face 130a side, to be bonded to each other, and the inner face 120a of the second sheet 120 is arranged so as to be superposed on the third sheet 130 on the second face 130b side, to be bonded to each other, to be the vapor chamber 101. At this time, the main body 131 of the third sheet 130 and the main body 111 of the first sheet 110 are superposed on each other, the main body 131 of the third sheet 130 and the main body 121 of the second sheet 120 are superposed on each other, and the inlet 132 of the third sheet 130, the inlet 112 of the first sheet 110, and the inlet 122 of the second sheet 120 are superposed on each other.

A laminate of the first sheet 110, the second sheet 120, and the third sheet 130 as described above is accompanied with arrangement of each component included in the main bodies 111, 121 and 131 as shown in FIGS. 57 to 60. This is specifically as follows.

The peripheral bonding face 133a, which is disposed on the third sheet 130 on the first face 130a side, and a face of the periphery of the inner face 110a of the first sheet 110 are arranged so as to be superposed, and bonded to each other, and the peripheral bonding face 133b, which is disposed on the third sheet 130 on the second face 130b side, and a face of the periphery of the inner face 120a of the second sheet 120 are arranged so as to be superposed, and bonded to each other. This leads to formation of the hollow part based on the shape of the third sheet 130 between the first sheet 110 and the second sheet 120, and the sheet for a vapor chamber is formed. A working fluid is sealed in the hollow part, which leads to formation of the vapor chamber including the enclosure 102.

The inner face 110a of the first sheet 110 is arranged on the peripheral fluid flow path part 134 of the third sheet 130 on the first face 130a side so as to be superposed. This makes the openings of the fluid flow path grooves 135 closed by the first sheet 110, which makes part of the hollow part. This becomes the condensate flow paths 103, which are the second flow paths where a condensate that is a working fluid sealed in the hollow part in a condensing and liquifying state flows.

Similarly, the inner face 110a of the first sheet 110 is arranged on the inner side fluid flow path parts 138 of the third sheet 130 on the first face 130a side so as to be superposed. This makes the openings of the fluid flow path grooves 139 closed by the first sheet 110, which makes part of the hollow part. This becomes the condensate flow paths 103, which are the second flow paths where a condensate that is a working fluid sealed in the hollow part in a condensing and liquifying state flows.

As described above, thin flow paths that are surrounded on all sides by walls on the cross section are formed, which can lead to movement of a condensate by a greater capillary force, and smooth circulation. That is, when a flow path where a condensate is assumed to flow is considered, a greater capillary force can be obtained with the condensate flow path 3 than a so-called flow path of a groove such that one face thereof is continuously open.

The condensate flow paths 3 are formed separately from the vapor flow paths 4, which are the first flow path, which makes it possible for a working fluid to smoothly circulate.

Disposing a plurality of the condensate flow paths 103 makes it possible to secure a large cross-sectional area of the condensate flow paths 103 in total while the cross-sectional area of one condensate flow path 103 is small (one condensate flow path 103 is thin), which makes it possible to smooth the flow of a condensate as a great capillary force is maintained.

The shape of each condensate flow path 3 can be considered the same as the above described shape and measures concerning the third sheet 30.

Figure 61:
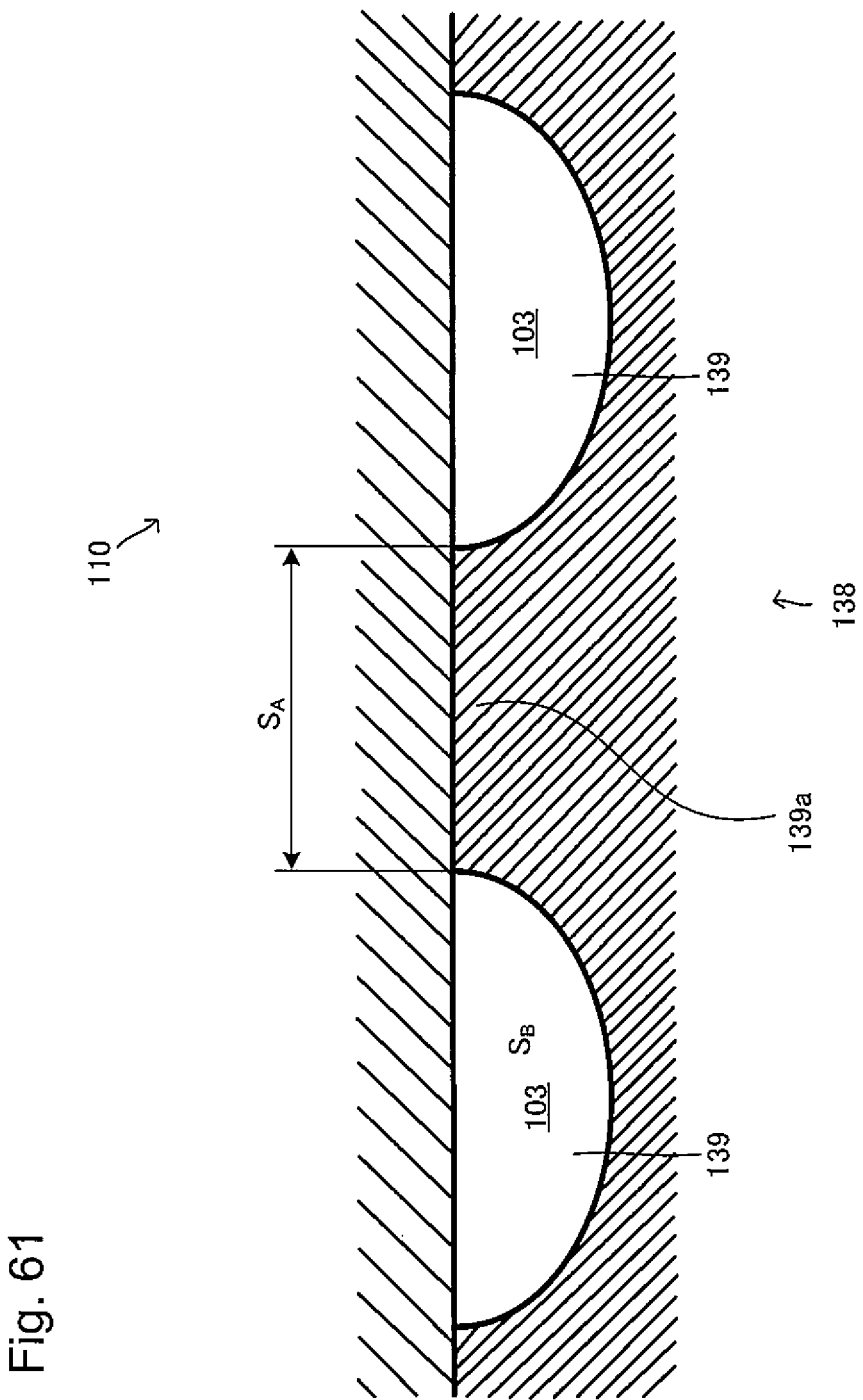
FIG. 61 shows a cross section of a wall part 139a and two condensate flow paths 103.

The width ($S_A$) of each wall part between adjacent condensate flow paths, and the relationship ($S_A/S_B$) with the transverse cross sectional area $S_B$ of each condensate flow path 3, which have been described concerning the vapor chamber 1, can be considered the same in the present embodiment. That is, as shown in an enlarged view focused on two condensate flow paths 103 of FIG. 60 in FIG. 61, each wall part 139a (wall part 135a can be considered the same) preferably has a width $S_A$ of at least 20 μm, which may be at least 30 μm, and may be at least 50 μm. The width $S_A$ (μm) of each wall part is preferably at most 300 μm, and can be at most 200 and may be at most 100 μm. This makes it possible to effectively use a limited internal space, to increase the numbers of the vapor flow paths and the condensate flow paths. The range of this width $S_A$ may be defined by the combination of any one of the foregoing plural candidate values for the upper limit, and any one of the foregoing plural candidate values for the lower limit. The range of the width $S_A$ may be also defined by the combination of any two of the plural candidate values for the upper limit, or the combination of any two of the plural candidate values for the lower limit.

In the relationship between the width $S_A$ (μm) of each wall part 135a and 139a, and the transverse cross sectional area $S_B$ (μm$^2$) (cross section in a direction orthogonal to the flowing direction (longitudinal direction of the flow paths)) of each condensate flow path 103 adjacent to the wall part 135a or 139a, the value ($S_A/S_B$) obtained by dividing $S_A$ by $S_B$ may be within the range of 0.005 (μm$^{-1}$) and 0.04 (μm$^{-1}$).

Other portions will be described. As can be seen in FIG. 57, the openings of the vapor flow path grooves 142 are closed by the first sheet 110 and the second sheet 120, to from part of the hollow part. This forms flow paths for a working fluid, to be the vapor flow paths 104, which are the first flow paths where a vapor flows.

The shape of each vapor flow path 104 can be considered the same as the above described shape and measures concerning the third sheet 130, and the vapor flow paths 4 of the vapor chamber 1.

The peripheral fluid flow path part 134 and the inner side fluid flow path parts 138 are provided with the projecting parts 137 and the projecting parts 141. According to this, the projecting parts 137 and the projecting parts 141, which are arranged among the condensate flow paths 103 and the vapor flow paths 104, and stick out on the vapor flow paths 104 side are included.

In the present embodiment, the projecting parts 137 and the projecting parts 141 respectively include the apexes 137a, and the apexes 141a that stick out most in the width direction of the vapor flow paths 104 (aligning direction of the vapor flow paths 4 and the condensate flow paths 3, direction y), and the projecting faces 137b and the projecting faces 141b that have cross sections of a circular arc, respectively extend from the apexes 137a and the apexes 141a towards the sides including the condensate flow paths (wall parts), and are linked to the wall parts.

That is, the projecting parts are arranged among the condensate flow paths 103 and the vapor flow paths 104, stick out so as to narrow the vapor flow paths 104 in the width direction, and include projecting faces including faces approaching the condensate flow paths 103 (wall 0.15 parts) from the most sticking portions (apexes).

The projecting amounts ($W_{104}$ and $W_{107}$) thereof can be considered the same as the above described projecting amounts $W_{R11}$ and $W_{R12}$ of the vapor chamber 1. That is, in the present embodiment, the projecting amounts can be formed so as to have the foregoing relationship between areas after division into the areas (such as areas $R_1$, $R_2$ and $R_3$).

As can be seen in FIG. 58, the openings of the grooves 144a of the vapor flow path communicating grooves 144 of the third sheet 130 are closed by the first sheet 110, and the openings of the grooves 144b thereof are closed by the second sheet 120, to form a hollow part via which a plurality of the vapor flow paths 104 communicate. This becomes part of the enclosure, to be flow paths where a working fluid flows.

Concerning the inlets 112, 122 and 132, as shown in FIGS. 47 and 48, the inlet 112 is superposed on the inlet 132 on the first face 130a side, the inlet 122 is superposed on the inlet 132 on the second face 130 side, and the opening of the inlet groove 132a of the third sheet 130 on the second face 130b side is closed by the inlet 122 of the second sheet 120, to form an inlet flow path 105 that allows the outside and the hollow part (the condensate flow paths 103 and the vapor flow paths 104) communicate.

Since the inlet flow path 5 is closed to be the enclosure 102 after a working fluid is poured via the inlet flow path 105 to the hollow part, the outside and the hollow part do not communicate with each other in the vapor chamber 101 in the final form.

In the present embodiment, the example such that the inlet 112, the inlet 122 and the inlet 132 are disposed at one of a pair of the end portions in the longitudinal direction of the vapor chamber 101 is shown. The present invention is not limited to this. The inlet 112, the inlet 122 and the inlet 132 may be arranged at any other end portion, or a plurality thereof may be arranged. When a plurality thereof is arranged, for example, the inlet 112, the inlet 122 and the inlet 132 may be arranged at each of a pair of the end portions in the longitudinal direction of the vapor chamber 101. Or, the inlet 112, the inlet 122 and the inlet 132 may be arranged at one of the other pair of the end portions.

A working fluid is sealed in the enclosure 102 of the vapor chamber 101. The type of the working fluid is not particularly limited. Any working fluid used for usual vapor chambers, such as pure water, ethanol, methanol, acetone, and any mixture thereof can be used.

The foregoing vapor chamber 101 can lead to the same operation as the vapor chamber 1, and the effect of the vapor chamber 1.

FIGS. 62 to 67 show examples of the other embodiments focused on shapes of the projecting parts. All the drawings correspond to FIG. 60. These embodiments of the projecting parts can be applied to the peripheral fluid flow path part. The projecting amounts of the projecting parts can be considered the same as the projecting parts 6 of the vapor chamber 1.

Figure 62:
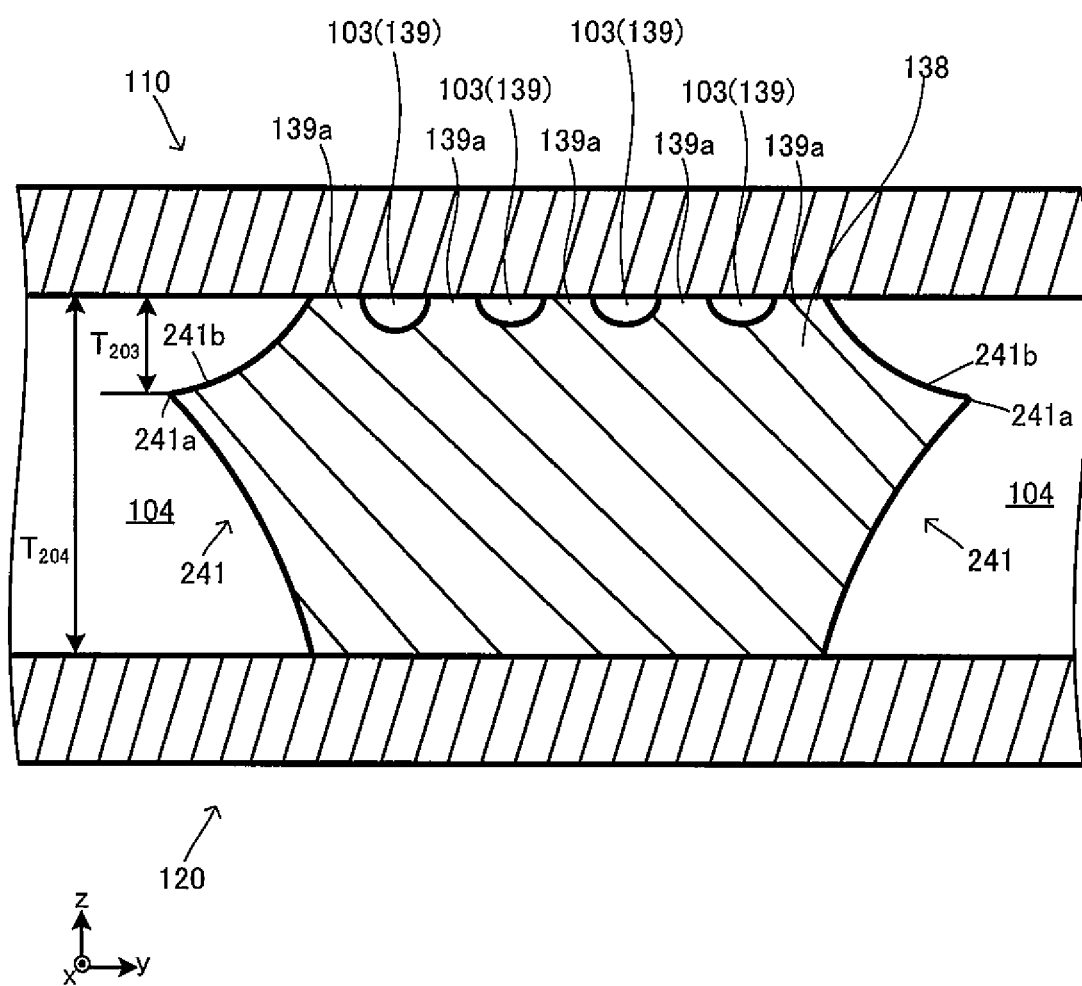
FIG. 62 explanatorily shows projecting parts 241.

In the example of the embodiment in FIG. 62, an apex 241a of each projecting part 241 is arranged at a closer position to the condensate flow path 103 in the thickness direction than the apexes 141a in FIG. 60. Specifically, the value obtained by dividing $T_{203}$ by $T_{204}$ shown in FIG. 62 is within the range between 0.2 and 0.4.

This embodiment leads to a small space held between each projecting face 241b and the first sheet 110, which causes a capillary force to greatly operate, to bring about the foregoing effect.

Figure 63:
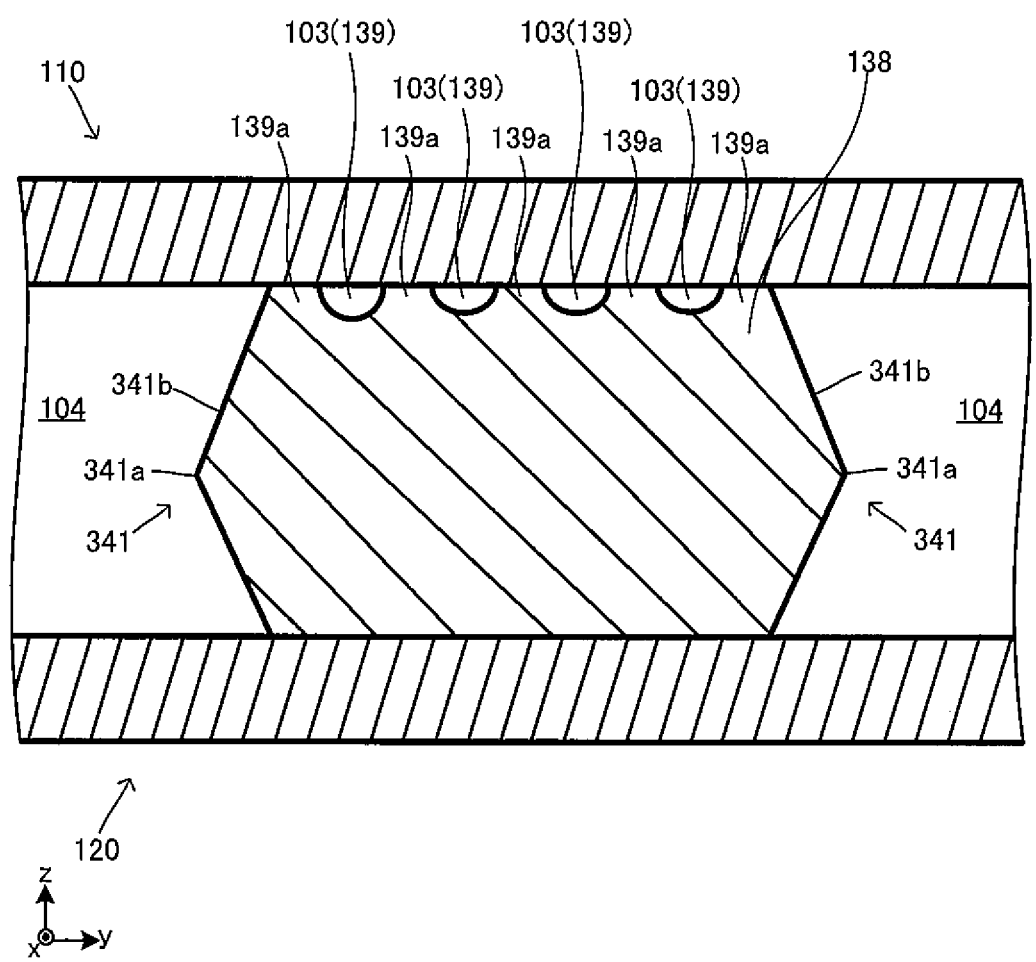
FIG. 63 explanatorily shows projecting parts 341.

In the example of the embodiment in FIG. 63, a projecting face 341b extending from an apex 341a of each projecting part 341 is like a straight line in a cross-sectional view. While all the above described projecting faces 141b and the projecting faces 241b have shapes of a circular arc recessed on the inner side fluid flow path parts 138 side, the projecting face 341b is like a straight line on a cross section in the present embodiment.

Such an embodiment also brings about the foregoing effect.

Figure 64:
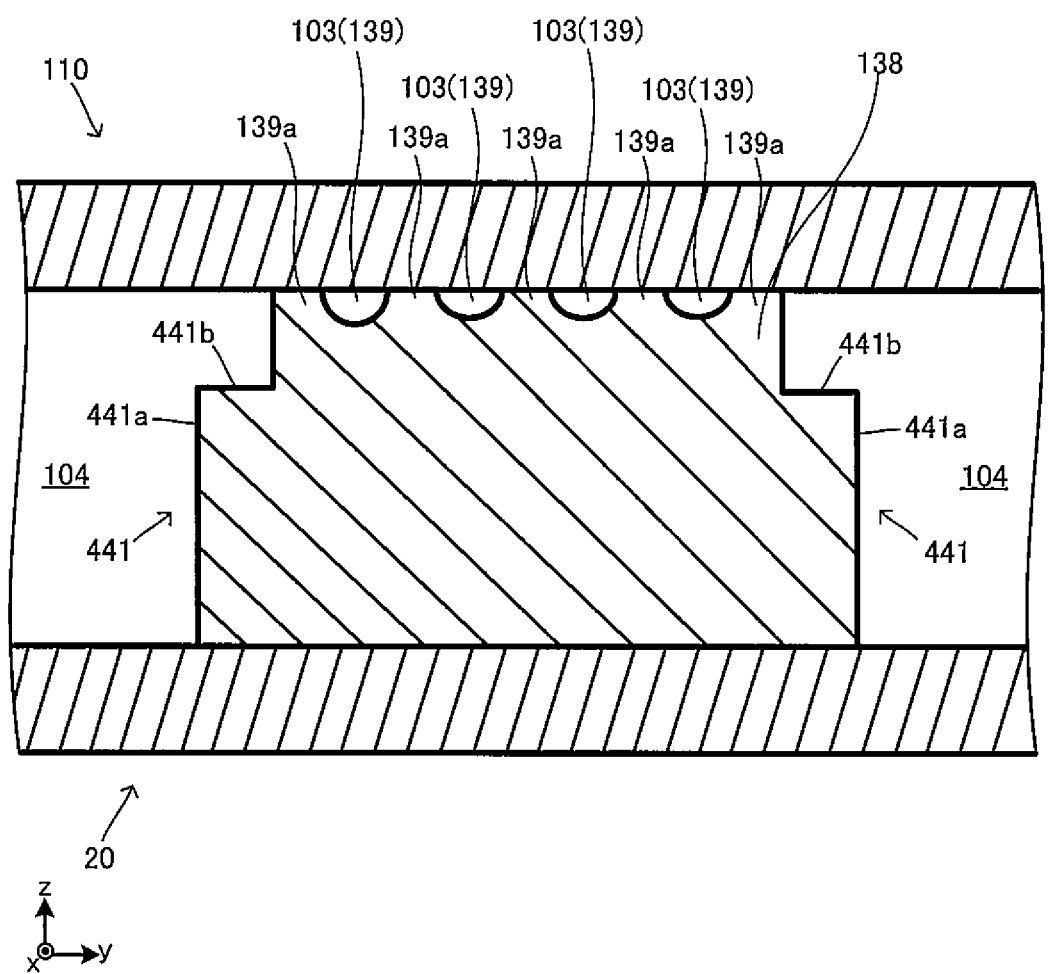
FIG. 64 explanatorily shows projecting parts 441.

In the example of the embodiment in FIG. 64, an apex 441a of each projecting part 441 is in the form of a face, and each projecting face 441b includes a face extending parallel to the aligning direction of a plurality of the condensate flow paths 103 and the vapor flow paths 104 (direction y).

Such an embodiment also brings about the foregoing effect.

Figure 65:
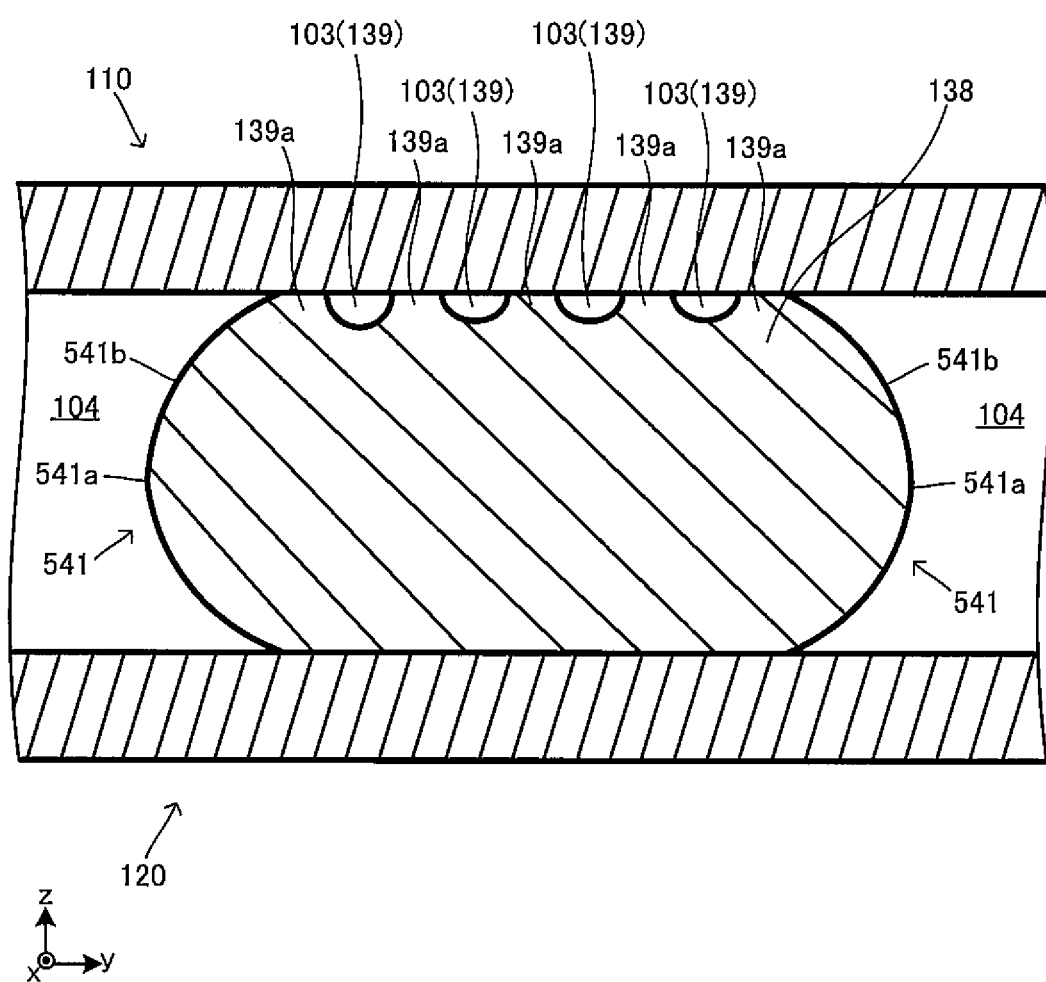
FIG. 65 explanatorily shows projecting parts 541.

In the example of the embodiment in FIG. 65, a projecting face 541b extending from an apex 541a of each projecting part 541 is in the form of a circular arc protruding on the vapor flow paths 104 side in a cross-sectional view. The projecting face 541b does not have to be in the form of a circular arc, but may be curved protruding on the vapor flow paths 104 side in the cross-sectional view, other than the form of a circular arc.

Such an embodiment also brings about the foregoing effect. In this embodiment, as the projecting face 541b is approaching the condensate flow path 103, a portion of a short distance from the first sheet 110 can be formed relatively a lot, which can bring about expectation of efficient use of capillary force.

Figure 66:
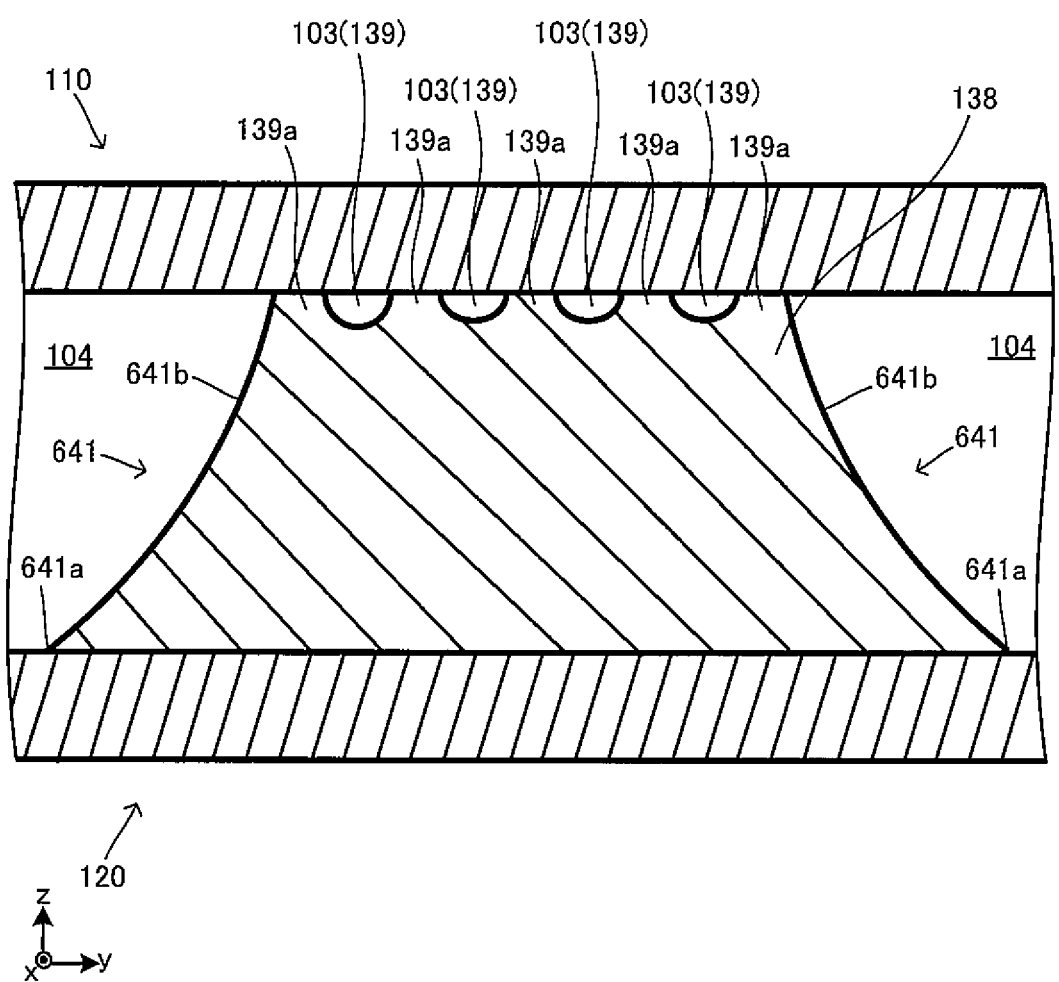
FIG. 66 explanatorily shows projecting parts 641.

In the example of the embodiment in FIG. 66, an apex 641a of each projecting part 641 is disposed separately on a face of the vapor flow paths 104 which is on the opposite side of the condensate flow path 103. According to such an embodiment, projecting faces 641b can be also formed, and the foregoing effect is brought about.

In view of narrowing a space between the projecting faces and the first face 110a to use a greater capillary force, the apexes are preferably arranged on any side faces of the vapor flow paths which are not inner faces of the vapor flow paths facing the thickness direction, in the thickness direction, as the foregoing examples of the embodiments.

Figure 67:
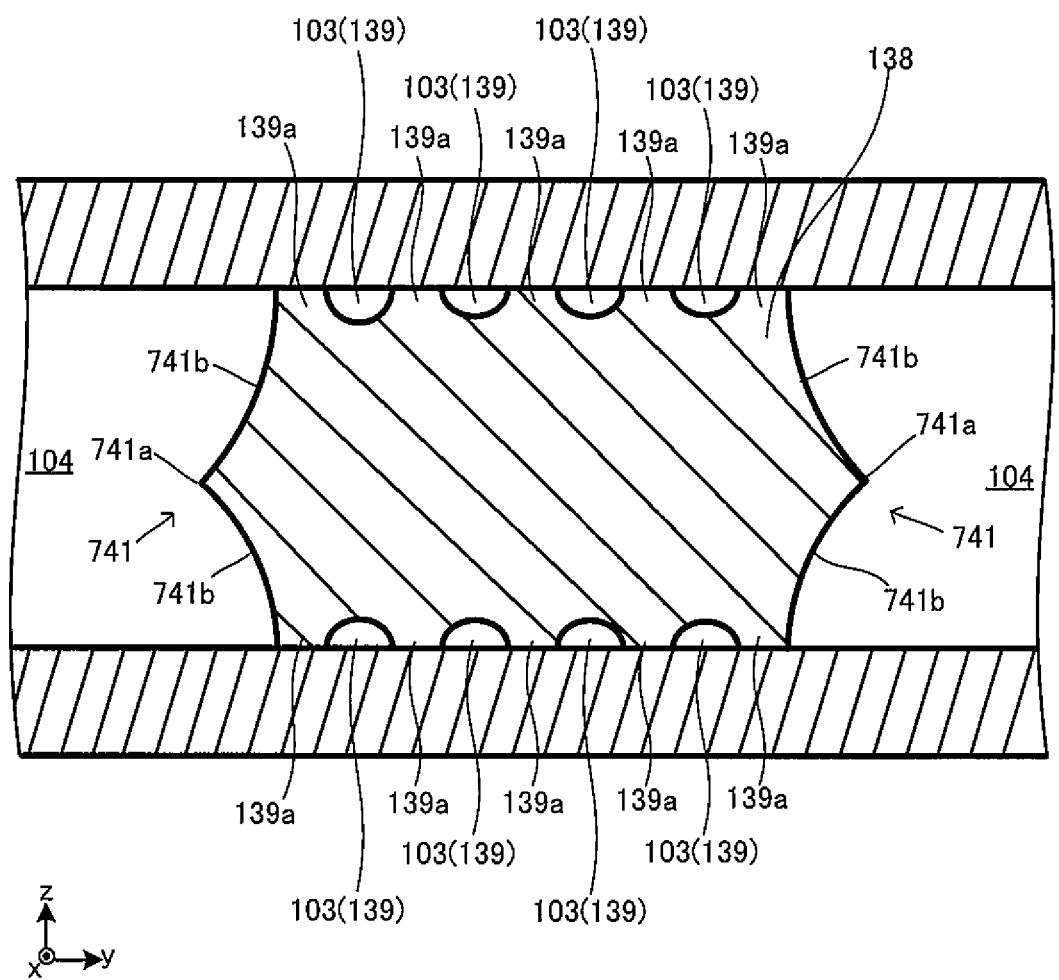
FIG. 67 explanatorily shows projecting parts 741.

In the example of the embodiment in FIG. 67, the condensate flow paths 103 are formed on both sides in the thickness direction of the inner side fluid flow path parts 138. In this example, projecting parts 741 can form projecting faces 741b from apexes 741a thereof toward the condensate flow paths 103 on both sides, which brings about the foregoing effect for the condensate flow paths 3 present on both sides in the thickness direction.

The foregoing embodiments of the present disclosure are not limited as they are, but components therein can be modified to be specified as long as the disclosure do not deviate from the gist thereof. Suitable combination of a plurality of the components disclosed in each embodiment can lead to various embodiments. On the contrary, one or a plurality of components only may be extracted from all the components shown in each embodiment to be applied according to the obtained effect, or some components may be deleted from all the components shown in each embodiment.

REFERENCE SIGNS LIST 1, 101 vapor chamber
2, 102 enclosure
3, 103 condensate flow path
3a inner face groove
4, 104 vapor flow path
6, 7 projecting part
10, 110 first sheet
10a, 110a inner face
10b, 110b outer face
10c, 110c side face
11, 111 main body
12, 112 inlet
13 peripheral bonding part
14 peripheral fluid flow path part
14 fluid flow path groove
14c communicating opening part
15 inner side fluid flow path part
15a fluid flow path groove
15c communicating opening part
16 vapor flow path groove
17 vapor flow path communicating groove
20, 120 second sheet
20a, 120a inner face
20b, 120b outer face
20c, 120c side face
21, 121 main body
22, 122 inlet
23 peripheral bonding part
24 peripheral fluid flow path part
25 inner side fluid flow path part
26 vapor flow path groove
27 vapor flow path communicating groove
130 third sheet
131 main body
132 inlet
133 peripheral bonding part
134 peripheral fluid flow path part
137 projecting part
138 inner side fluid flow path part
141 projecting part
142 vapor flow path groove
144 vapor flow path communicating groove

The invention claimed is:

1. A vapor chamber in which an enclosed space is formed, and a working fluid is sealed in the enclosed space, the enclosed space comprising:
  a plurality of condensate flow paths through which the working fluid in a condensing state flows, the condensate flow paths extending in parallel to each other; and
  a plurality of vapor flow paths through which the working fluid in a vaporizing state flows, the vapor flow paths extending in parallel to each other, wherein
  at least one of the condensate flow paths is between adjacent ones of the vapor flow paths in a plan view,
  wall parts that separate the vapor flow paths and the condensate flow paths each comprise a plurality of communicating opening parts that are openings via which the vapor flow paths and the condensate flow paths communicate, wherein the wall parts adjoin one of upper and lower inner faces of the vapor chamber, and the condensate flow paths are also on the one inner face, and
  pitches for the communicating opening parts vary in an extending direction of the vapor flow paths and the condensate flow paths.

2. The vapor chamber according to claim 1, comprising three superposed metal plates,
  wherein the enclosed space is formed between two of three metal plates, the two of the three metal plates being outsides of the three metal plates respectively.

3. The vapor chamber according to claim 1, wherein
  when the vapor chamber is divided into a plurality of areas in the extending direction of the vapor flow paths so that one area includes some of the communicating opening parts aligning in a direction along the vapor flow paths, a pitch for the communicating opening parts in the one area is larger than a pitch for the communicating opening parts in both areas adjacent to the one area.

4. The vapor chamber according to claim 1, wherein
  when one of the vapor flow paths is divided into three areas in the extending direction of the vapor flow paths, an average value of pitches for the communicating opening parts included in areas on both ends is smaller than an average value of pitches for the communicating opening parts included in an area between the areas on both ends.

5. The vapor chamber according to claim 1, wherein
  when one of the vapor flow paths is divided into a first area, as second area, a third area, a fourth area, and a fifth area in order in the extending direction of the vapor flow paths, an average value of pitches for the communicating opening parts included in the third area, and an average value of pitches for the communicating opening parts included in the first area and the fifth area are each smaller than an average value of pitches for the communicating opening parts in the second area and the fourth area.

6. An electronic device comprising:
  a housing;
  an electronic component that is arranged inside the housing; and
  the vapor chamber according to claim 1, the vapor chamber being arranged in contact with the electronic component directly, or via another member.

7. The vapor chamber according to claim 1, wherein
  wall parts that bound the condensate flow paths and the vapor flow paths are straight in the extending direction of the vapor flow paths and the condensate flow paths.

* * * * *